(12) United States Patent
Sano et al.

(10) Patent No.: US 10,290,803 B2
(45) Date of Patent: May 14, 2019

(54) THREE-DIMENSIONAL DEVICES WITH WEDGE-SHAPED CONTACT REGION AND METHOD OF MAKING THEREOF

(71) Applicant: SANDISK TECHNOLOGIES LLC, Plano, TX (US)

(72) Inventors: Michiaki Sano, Yokkaichi (JP); Zhen Chen, Yokkaichi (JP); Tetsuya Yamada, Yokkaichi (JP); Akira Nakada, Yokkaichi (JP); Yasuke Oda, Yokkaichi (JP); Manabu Hayashi, Yokkaichi (JP); Shigenori Sato, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 95 days.

(21) Appl. No.: 15/367,791

(22) Filed: Dec. 2, 2016

(65) Prior Publication Data

US 2018/0158873 A1 Jun. 7, 2018

(51) Int. Cl.
*H01L 27/115* (2017.01)
*H01L 27/24* (2006.01)
(Continued)

(52) U.S. Cl.
CPC ........ *H01L 45/16* (2013.01); *H01L 27/11565* (2013.01); *H01L 27/11575* (2013.01); *H01L 27/11582* (2013.01); *H01L 27/2409* (2013.01); *H01L 27/249* (2013.01); *H01L 27/2454* (2013.01); *H01L 45/04* (2013.01); *H01L 45/1226* (2013.01); *H01L 45/146* (2013.01)

(58) Field of Classification Search
CPC .................................................. H01L 27/2481
See application file for complete search history.

(56) References Cited

U.S. PATENT DOCUMENTS 5,915,167 A 6/1999 Leedy
9,230,905 B2 1/2016 Takaki et al.
(Continued)

OTHER PUBLICATIONS

U.S. Appl. No. 15/251,374, filed Aug. 30, 2016, SanDisk Technologies LLC.

*Primary Examiner* — Moazzam Hossain
*Assistant Examiner* — Omar F Mojaddedi
(74) *Attorney, Agent, or Firm* — The Marbury Law Group, PLLC

(57) ABSTRACT

A wedge-shaped contact region can be employed to provide electrical contacts to multiple electrically conductive layers in a three-dimensional device structure. A cavity including a generally wedge-shaped region and a primary region is formed in a dielectric matrix layer over a support structure. An alternating stack of insulating layers and electrically conductive layers is formed by a series of conformal deposition processes in the cavity and over the dielectric matrix layer. The alternating stack can be planarized employing the top surface of the dielectric matrix layer as a stopping layer. A tip portion of each electrically conductive layer within remaining portions of the alternating stack is laterally offset from the tip of the generally wedge-shaped region by a respective lateral offset distance along a lateral protrusion direction. Contact via structures can be formed on the tip portions of the electrically conductive layers to provide electrical contact.

15 Claims, 48 Drawing Sheets

(51) Int. Cl.
   *H01L 45/00* (2006.01)
   *H01L 27/11582* (2017.01)
   *H01L 27/11565* (2017.01)
   *H01L 27/11575* (2017.01)

(56) References Cited

U.S. PATENT DOCUMENTS

| | | |
|---|---|---|
| 9,343,507 B2 | 5/2016 | Takaki et al. |
| 9,356,034 B1 | 5/2016 | Yada et al. |
| 9,449,924 B2 | 9/2016 | Takaki |
| 9,502,429 B2 | 11/2016 | Hironaga |
| 9,515,023 B2 | 12/2016 | Tobitsuka et al. |
| 2015/0016178 A1* | 1/2015 | Nardi ............... H01L 45/08 365/148 |
| 2015/0179577 A1* | 6/2015 | Tobitsuka ......... H01L 21/76895 257/314 |
| 2016/0148835 A1 | 5/2016 | Shimabukuro et al. |
| 2017/0263556 A1* | 9/2017 | Tessariol ............ H01L 23/5283 |

* cited by examiner

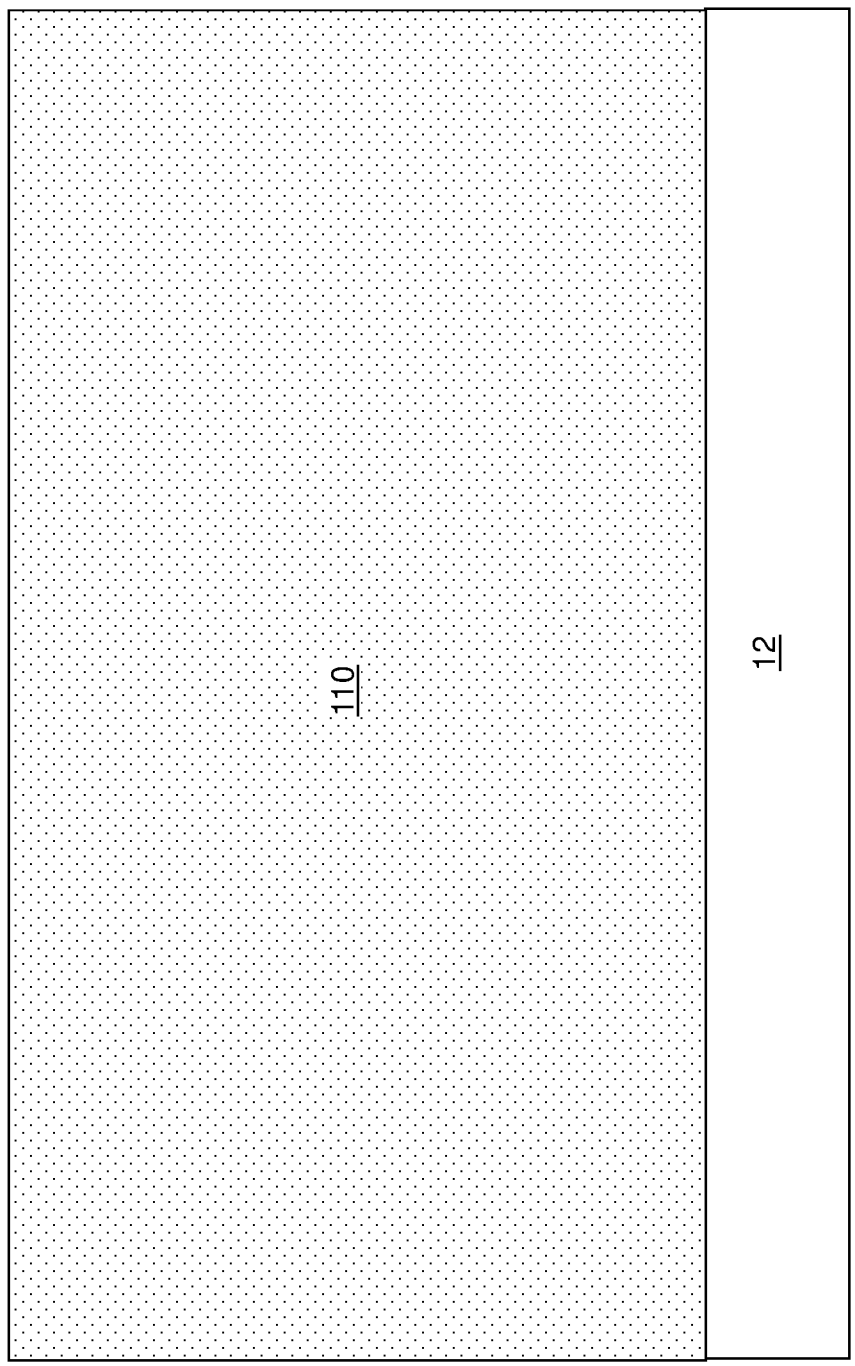

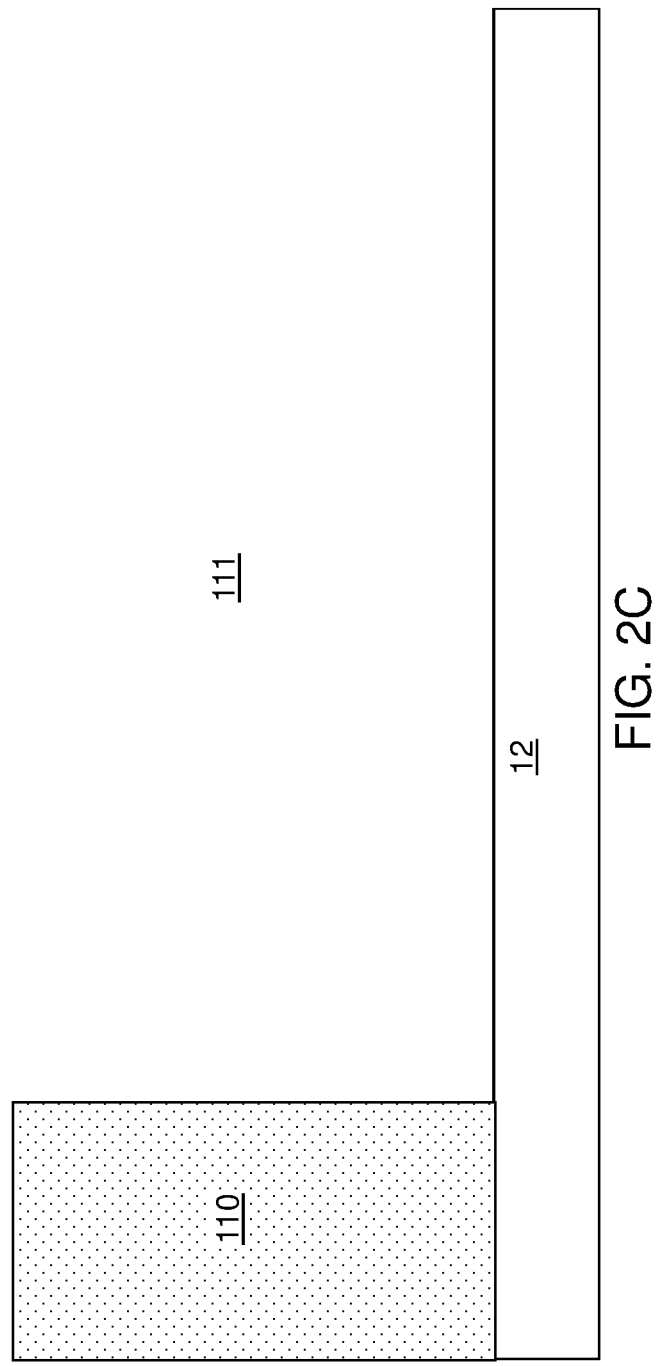

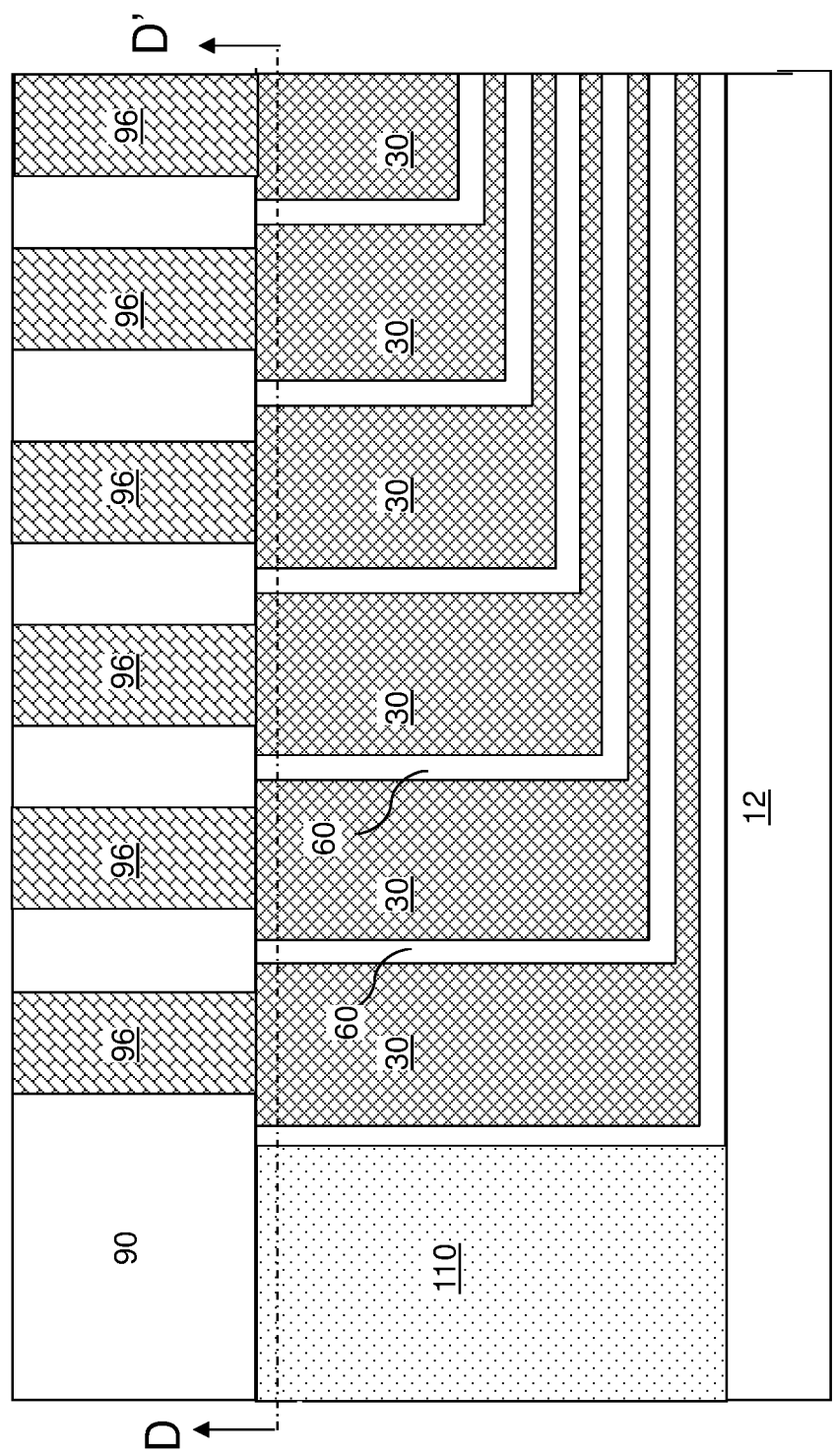

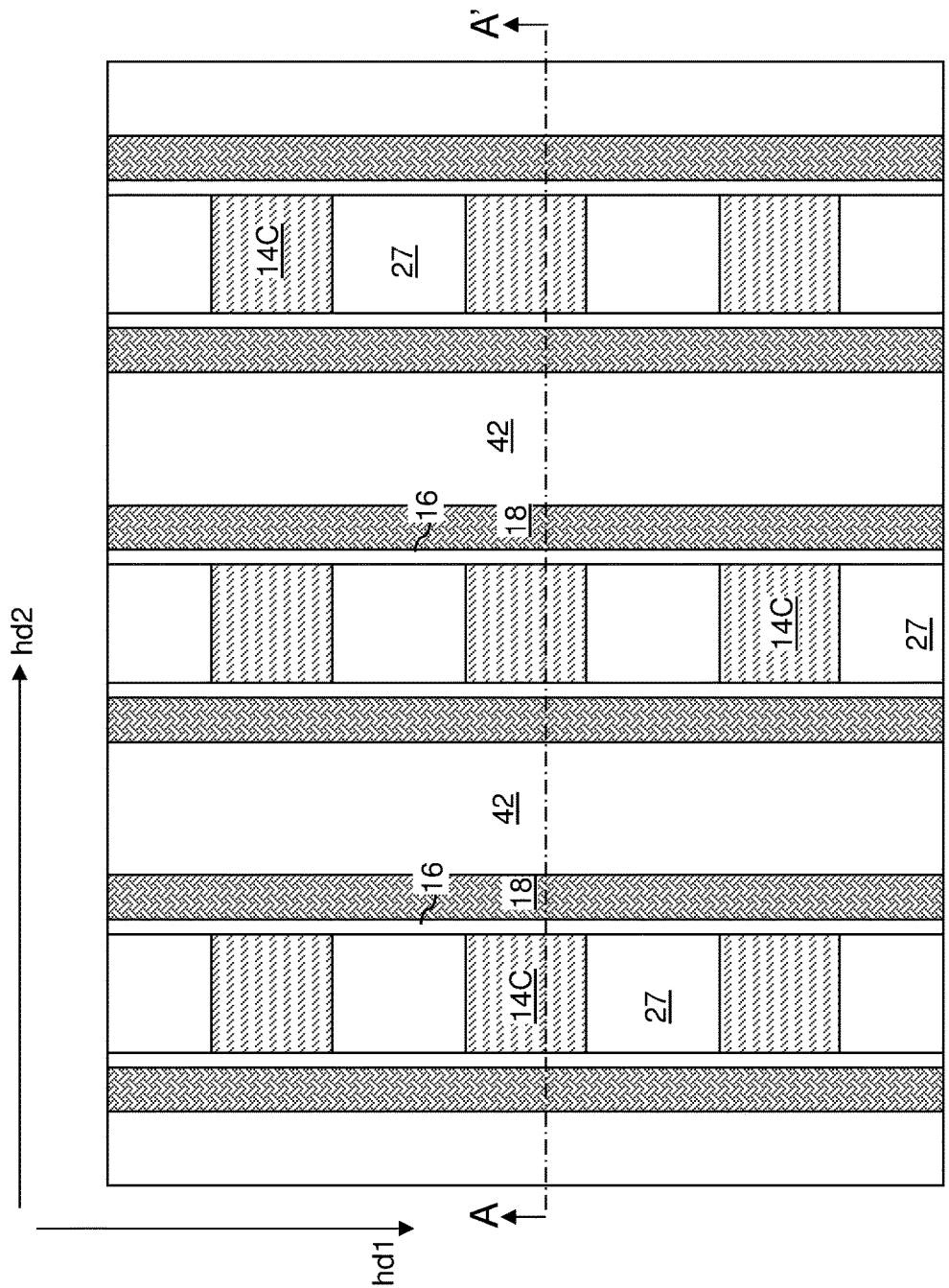

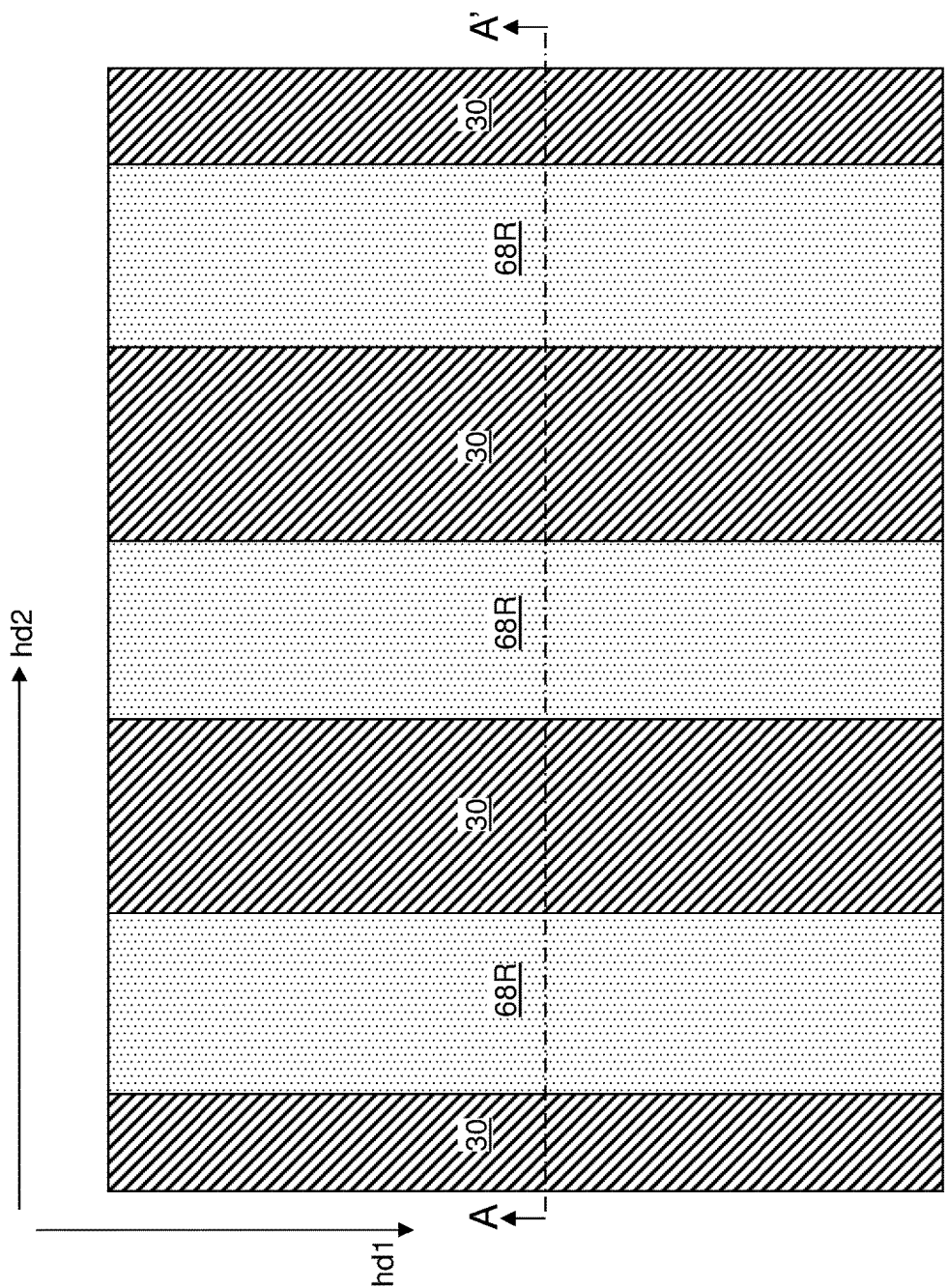

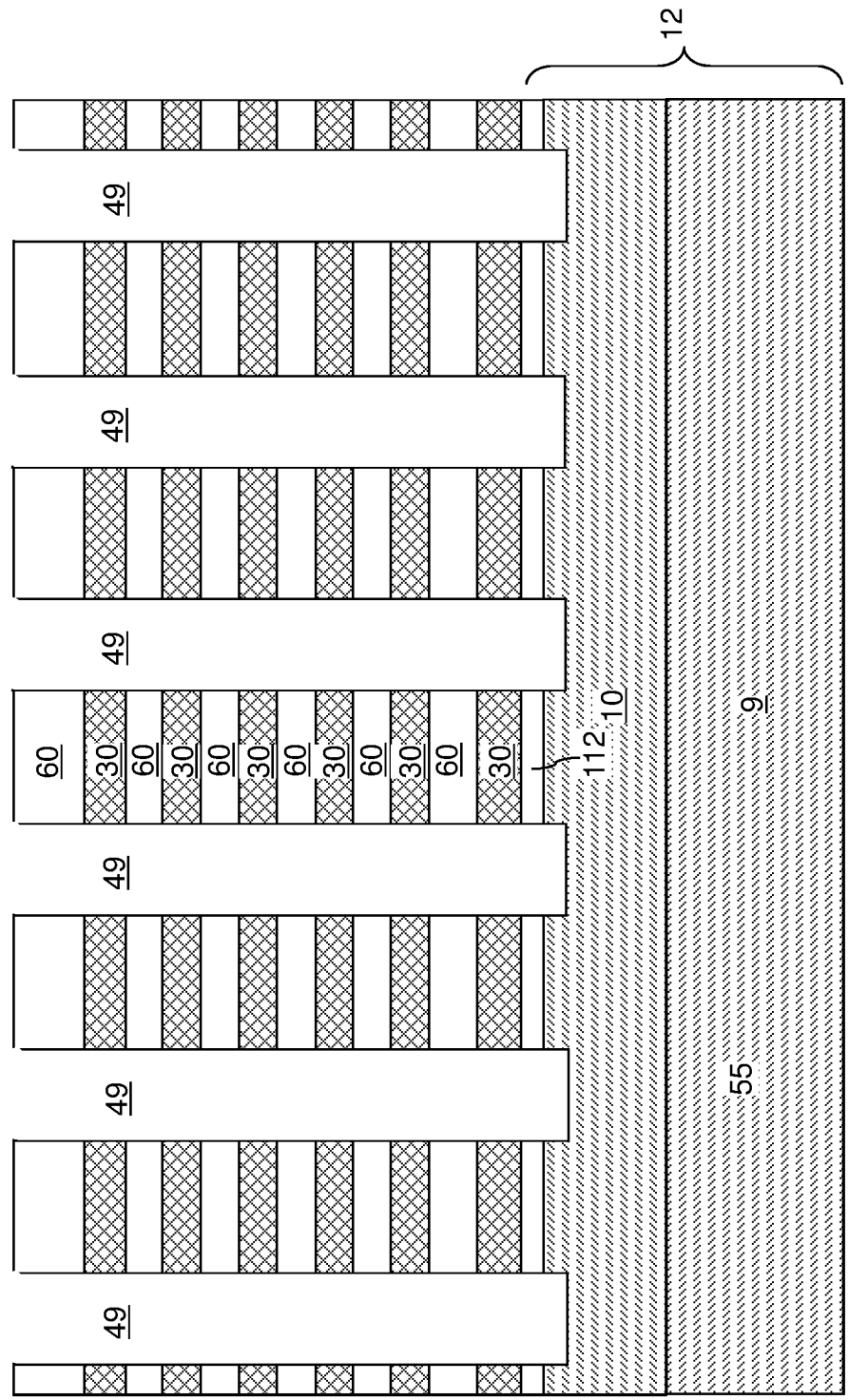

US 10,290,803 B2

THREE-DIMENSIONAL DEVICES WITH WEDGE-SHAPED CONTACT REGION AND METHOD OF MAKING THEREOF

FIELD

The present disclosure relates generally to the field of semiconductor devices and specifically to three-dimensional devices having a wedge-shaped contact region for word lines and methods of making the same.

BACKGROUND

Three-dimensional semiconductor device can include various device elements arranged in a three-dimensional array. Such three-dimensional semiconductor devices include, for example, resistance random access memory (ReRAM) devices and three dimensional NAND memory devices. The ReRAM devices store information as resistive states of resistive memory elements. The three dimensional NAND memory devices store information as charge states (such as presence or absence of electrons) within charge storage elements.

An alternating stack of insulating layers and electrically conductive layers can be employed in the three-dimensional semiconductor devices. In case the three-dimensional semiconductor devices are memory devices, the electrically conductive layers can be patterned into word lines that are stacked vertically and separated from one another by the insulating layers. Providing electrical contact to each of the electrically conductive lines (e.g., the word lines) of a three-dimensional semiconductor device requires a complex sequence of processing steps, and adds significant processing cost during fabrication. Thus, a simple and inexpensive scheme for properly providing electrical contacts to each of the electrically conductive layers within a three-dimensional semiconductor device is desired.

SUMMARY

According to an aspect of the present disclosure, a device structure is provided, which comprises: a dielectric matrix layer located over a support structure and laterally enclosing a cavity therein, wherein the cavity has a primary region including a geometrical center of the cavity and a generally wedge-shaped region that laterally protrudes from the primary region along a lateral protrusion direction, wherein stepped sidewalls of the generally wedge-shaped region provides a greater width near the primary region than at a tip of the generally wedge-shaped region; an alternating stack of insulating layers and electrically conductive layers located within the dielectric matrix layer, wherein outer sidewalls of each material layer within the alternating stack is adjoined to a periphery of a bottom surface of the material layer, and wherein a tip portion of each electrically conductive layer within the alternating stack is laterally offset from the tip of the generally wedge-shaped region by a different lateral offset distance along the lateral protrusion direction; and contact via structures contacting a top surface of a tip portion of a respective one of the electrically conductive layers.

According to another aspect of the present disclosure, a method of forming a device structure is provided. A dielectric matrix layer is formed over a support structure. A cavity is formed through the dielectric matrix layer. The cavity has a primary region including a geometrical center of the cavity and a generally wedge-shaped region that laterally protrudes from the primary region along a lateral protrusion direction. Stepped sidewalls of the generally wedge-shaped region provide a greater width near the primary region than at a tip of the generally wedge-shaped region. An alternating stack of insulating layers and electrically conductive layers is formed within, and over, the dielectric matrix layer. The alternating stack is planarized by removing portions of the alternating stack located over a horizontal plane including a top surface of the dielectric matrix layer. A tip portion of each electrically conductive layer within remaining portions of the alternating stack is laterally offset from the tip of the generally wedge-shaped region by a different lateral offset distance along the lateral protrusion direction. Contact via structures are subsequently formed. A subset of the contact via structures is formed directly on a top surface of a tip portion of a respective one of the electrically conductive layers.

BRIEF DESCRIPTION OF THE DRAWINGS

FIG. 1 is a vertical cross-sectional view of an exemplary structure after forming a dielectric matrix layer over a support structure according to an embodiment of the present disclosure.

FIG. 2C is a vertical cross-sectional view of region B of the exemplary structure shown in FIG. 2A along the vertical plane C-C'.

FIG. 9C is a vertical cross-sectional view of the first alternate embodiment of the exemplary structure of FIG. 9A along the vertical plane C-C'.

FIG. 11C is a horizontal cross-sectional view of the primary region of the exemplary structure of FIG. 11A along the horizontal plane C-C' of FIG. 11A.

FIG. 12B is a horizontal cross-sectional view of the primary region of the exemplary structure of FIG. 12A along the horizontal plane B-B' of FIG. 12A.

FIG. 17 is a vertical cross-sectional view of the primary region of the exemplary structure in the second configuration after formation of memory openings.

DETAILED DESCRIPTION

Figure 2A:
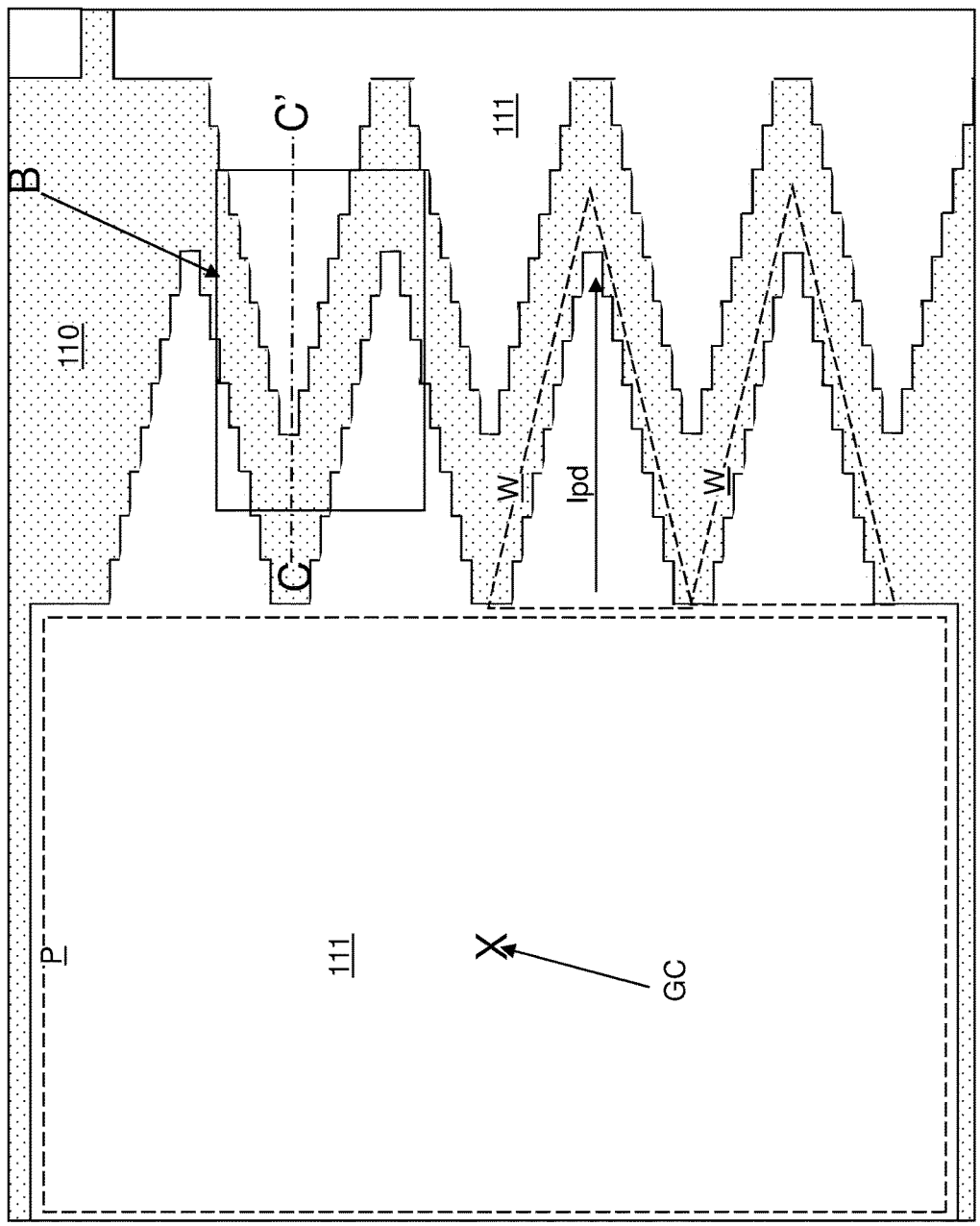
FIG. 2A is a top-down view of the exemplary structure after formation of cavities through the dielectric matrix layer according to an embodiment of the present disclosure.

As discussed above, the present disclosure is directed to three-dimensional devices having a wedge-shaped contact region for word lines and methods of making the same, the various aspects of which are described below. The embodiments of the disclosure can be employed to form various semiconductor devices such as three-dimensional monolithic memory array devices which can be resistive random access memory (ReRAM) devices or three dimensional NAND memory devices.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. Elements with the same reference numeral refer to a same element or a similar element, and are presumed to have the same composition unless explicitly noted otherwise.

As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to an electrically conductive material including at least one metal element therein. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

Referring to FIG. 1, a vertical cross-sectional view of an exemplary structure is illustrated after forming a dielectric matrix layer 110 over a support structure 12 according to an embodiment of the present disclosure. The support structure 12 can include a single substrate, a stack of multiple substrates, or a combination of at least one substrate and device structures thereupon or therebelow. In one embodiment, the support structure 12 can include a semiconductor substrate, at least one semiconductor structure thereupon, and an optional metal interconnect structure including at least one metal line structures and at least metal via structures.

The dielectric matrix layer 110 includes a dielectric material that can be employed as a dielectric matrix for forming layered structures therein. For example, the dielectric matrix layer 110 can include doped or undoped silicon oxide, silicon nitride, organosilicate glass, and/or at least one dielectric metal oxide. In one embodiment, the dielectric matrix layer 110 can consist of a single dielectric material layer having a homogeneous composition throughout. In another embodiment, the dielectric matrix layer 110 can include a plurality of dielectric material layers having different compositions. The dielectric matrix layer 110 can be deposited by a conformal or non-conformal deposition method or spin-coating. The thickness of the dielectric matrix layer 110 can be at least the total layer thickness of an alternating stack of material layers to be subsequently formed. In one embodiment, the thickness of the dielectric matrix layer 110 as deposited can be the sum of the total layer thickness of the alternating stack of material layers to be subsequently formed and the thickness of the portion of the dielectric matrix layer 110 to be eroded during a subsequent planarization process. In one embodiment, the thickness of the dielectric matrix layer 110 can be in a range from 200 nm to 5,000 nm, although lesser and greater thicknesses can also be employed.

Figure 2B:
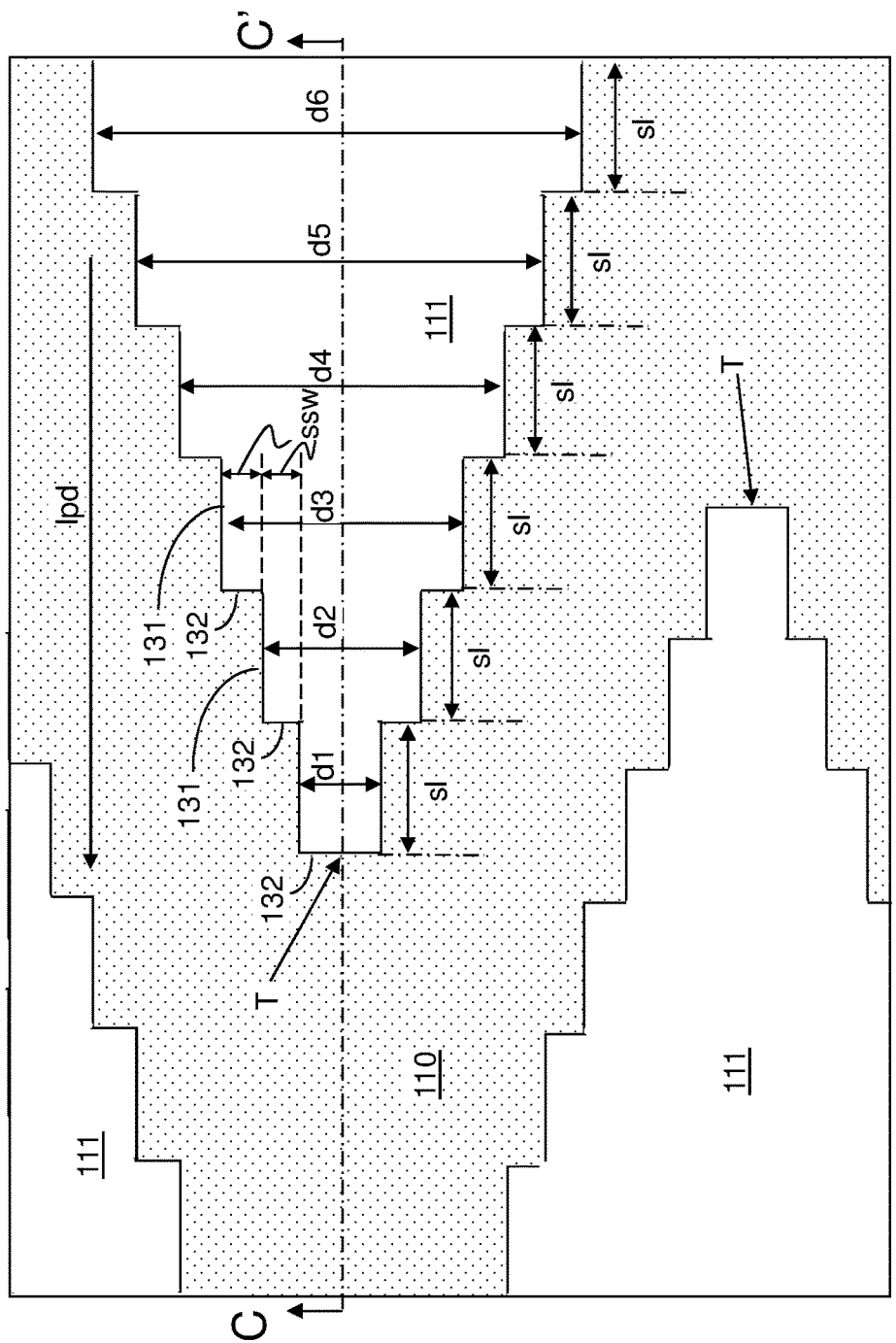
FIG. 2B is a top-down view of region B of the exemplary structure shown in FIG. 2A.

Referring to FIGS. 2A-2C, one or more cavities 111 can be formed through the dielectric matrix layer 110. The cavities 111 can be formed, for example, by applying a masking layer (such as a photoresist layer or a hard mask layer), patterning the masking layer (for example, by patterning the photoresist layer or transferring the pattern in a patterned photoresist layer into the hard mask layer), and transferring the pattern of the masking layer through the dielectric matrix layer 110 by an anisotropic etch (such as a reactive ion etch). A top surface of the supporting structure 12 can be physically exposed at the bottom of each cavity 111. In one embodiment, the bottom surface of each cavity 111 can be within the same horizontal plane as the interface between the supporting structure 12 and the dielectric matrix layer 110. The patterned masking layer can be subsequently removed selective to the materials of the dielectric matrix layer 110 and the supporting structure 12, for example, by ashing or by a wet etch process.

As shown in FIG. 2B, each cavity 111 is defined by a set of vertical sidewalls that extend from a first horizontal plane including the bottom surface of the dielectric matrix layer 110 to a second horizontal plane including the top surface of the dielectric matrix layer 110. Each cavity 111 can have a primary region P including a geometrical center GC of the cavity 111 and at least one generally wedge-shaped region W that laterally protrudes from the primary region P along a lateral protrusion direction lpd. As used herein, a "generally wedge-shaped region" refers to a region in which a first side is narrower than the second side with a changing width, preferably monotonically changing width, between the first side and the second side. The peripheries that connect the first side and the second side may have steps provided that the width is a monotonically changing function of the distance measured from a tip or the narrowest portion of the first side toward the second side. The geometrical center of an element is the location of the center of mass of a hypothetical object that replaces the entire volume of the element with a homogeneous material. It should be noted that the cavity 111 can be either completely surrounded by the dielectric matrix layer 110 or the cavity 111 can be open on one or more sides and face the dielectric matrix layer 110 on one or more additional sides. In general, the least one generally wedge-shaped region W of the cavity is a recess in the dielectric matrix layer 110. Stepped sidewalls (131, 132) of each generally wedge-shaped region W of the cavity 111 are formed by one or more sidewalls of the dielectric matrix layer 110. Sidewalls of the dielectric matrix layer 110 can surround either all or just some of the sides of the cavity 111.

Within each cavity 111, stepped sidewalls (131, 132) of each generally wedge-shaped region W provides a greater width near the primary region P than at a tip T of the generally wedge-shaped region W. In one embodiment, the stepped sidewalls (131, 132) of the generally wedge-shaped region W comprise first sidewalls 131 laterally extending along a first horizontal direction (which can be parallel to the lateral protrusion direction lpd), and second sidewalls 132 laterally extending along a second horizontal direction (which can be perpendicular to the lateral protrusion direction lpd). Each of the second sidewalls 132 can be adjoined to a vertical edge of at least one of the first sidewalls 131. In one embodiment, each of the second sidewalls can be adjoined to vertical edges of a pair of first sidewalls 131. In one embodiment, each of the first sidewalls 131 and the second sidewalls 132 can vertically extend from the top surface of the dielectric matrix layer 110 to the bottom surface of the dielectric matrix layer 110. In one embodiment, the first sidewalls 131 can be parallel to the lateral protrusion direction lpd, and the second sidewalls 132 can be perpendicular to the lateral protrusion direction.

In one embodiment, counting from the tip T of a respective generally wedge-shaped region W, each i-th pair of first sidewalls 131 can be laterally spaced from each other by an i-th lateral separation distance di. The index i can run from 1 to a positive integer that represents the total number of pairs of first sidewalls within the generally wedge-shaped region W. The lateral separation distances di is a strictly increasing function of the running index i.

In one embodiment, a pair of second sidewalls 132 is adjoined to distal vertical edges of each corresponding pair of first sidewalls 131. As used herein, a distal vertical edge of a first sidewall 131 refers to a vertical edge of the first sidewall 131 that is distal from the tip T of the generally wedge-shaped region W, and a proximal vertical edge of a first sidewall 131 refers to a vertical edge of the first sidewall 131 that is proximal to the tip T of the generally wedge-shaped region W. Thus, counting from the tip T of a respective generally wedge-shaped region W and excluding the second sidewall 132 that includes the tip T, an i-th pair of second sidewalls 132 is adjoined to distal vertical edges of the i-th pair of first sidewalls 131.

In one embodiment, the first sidewalls 131 and the second sidewalls 132 can be configured to provide a periodic zig-zag configuration including repetitions of a unit that includes a first sidewalls 131 and a second sidewall 132. Two sets of periodic zig-zag configurations can be provided for each generally wedge-shaped region W. In one embodiment, each of the first sidewalls 131 can have a same length, which is herein referred to as a step length sl, and each of the second sidewalls 132 other than the second sidewall 132 including the tip T can have a same length, which is herein referred to as a second sidewall width ssw. In this case, the difference between the (i+1)-th lateral separation distance d(i+1) and the i-th lateral separation distance di can be twice the second sidewall width ssw for each positive integer i.

According to an aspect of the present disclosure, the second sidewall width ssw can be selected to facilitate formation of an elongated contact area for each electrically conductive layer to be subsequently formed. Further, the step length sl can be selected to be greater than the second sidewall width ssw. For example, the step length sl can be in a range from 1.3 times the second sidewall width ssw to 10 times the second sidewall width ssw, such as from 1.5 times the second sidewall width ssw to 5 times the second sidewall width ssw. Further, the width of the second sidewall 132 containing the tip T can be selected to facilitate formation of an elongated contact area for each electrically conductive layer to be subsequently formed.

In an illustrative example, if an alternating stack of insulating layers having a first thickness t1 and electrically conductive layers having a second thickness t2 is to be subsequently deposited in each cavity 111, the width of the second sidewall 132 containing a tip T (which is the same as the first lateral separation distance d1) can be $2 \times t1 + \alpha \times t2$ in which $\alpha$ is in a range from 0.1 to $2.0 \times (1 + t1/t2)$. In an illustrative embodiment, $\alpha$ may be in a range from 1.0 to $1.9 \times (1 + t1/t2)$. The second sidewall width ssw can be $t1+t2$, or can be substantially the same as $t1+t2$.

In one embodiment, the width of the electrically conductive layer to be deposited between the pair of first sidewalls 131 separated by the first lateral separation distance can be $\alpha \times t2$, and the width of the innermost electrically conductive layer to be deposited between the pair of first sidewalls 131 separated by the N-th lateral separation distance can be $\beta \times t2$.

Referring to FIGS. 3A-3D, alternating stack of insulating layers 60 and electrically conductive layers 30 is deposited within the cavities 111, and over the dielectric matrix layer 110. The insulating layers 60 include a dielectric material, which can be, for example, undoped or doped silicate glass (i.e., silicon dioxide or a doped silicon dioxide material), silicon nitride, a dielectric metal oxide (such as aluminum oxide, or organosilicate glass). For example, the insulating layers 60 include undoped silicate glass. The electrically conductive layers 30 include a conductive material, which can be a metallic material or a heavily doped semiconductor material having electrical conductivity greater than $10^5$ S/cm. For example, the electrically conductive layers 30 can include a conductive metallic nitride such as TiN, TaN, or WN, or can include a metal such as W, Co, Cu, Ru, or Al. In one embodiment, the electrically conductive layers 30 can include TiN.

Figure 3A:
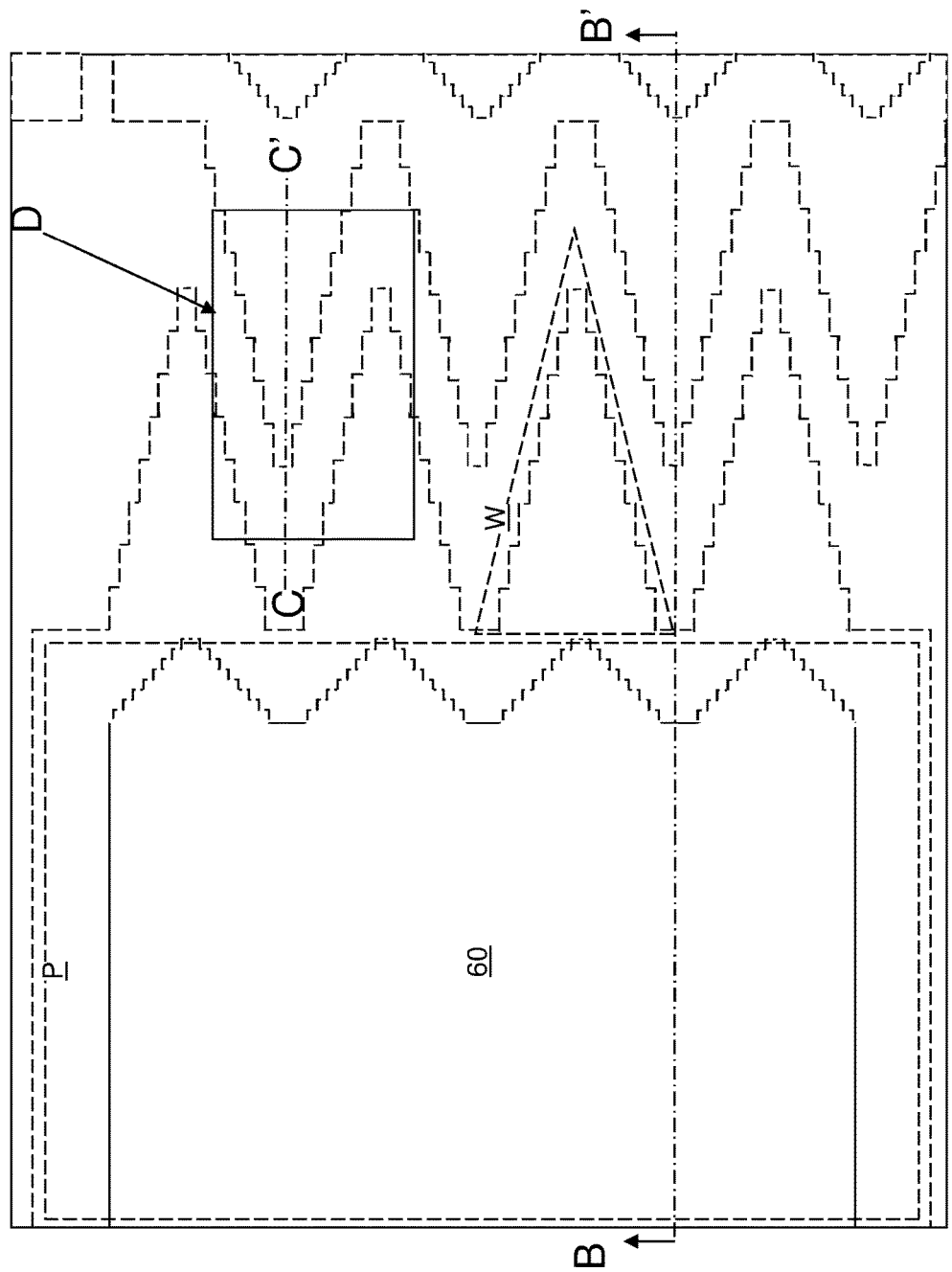
FIG. 3A is a top-down view of the exemplary structure after formation of an alternating stack of insulating layers and electrically conductive layers in the cavities and over the dielectric matrix layer according to an embodiment of the present disclosure.
Figure 3B:
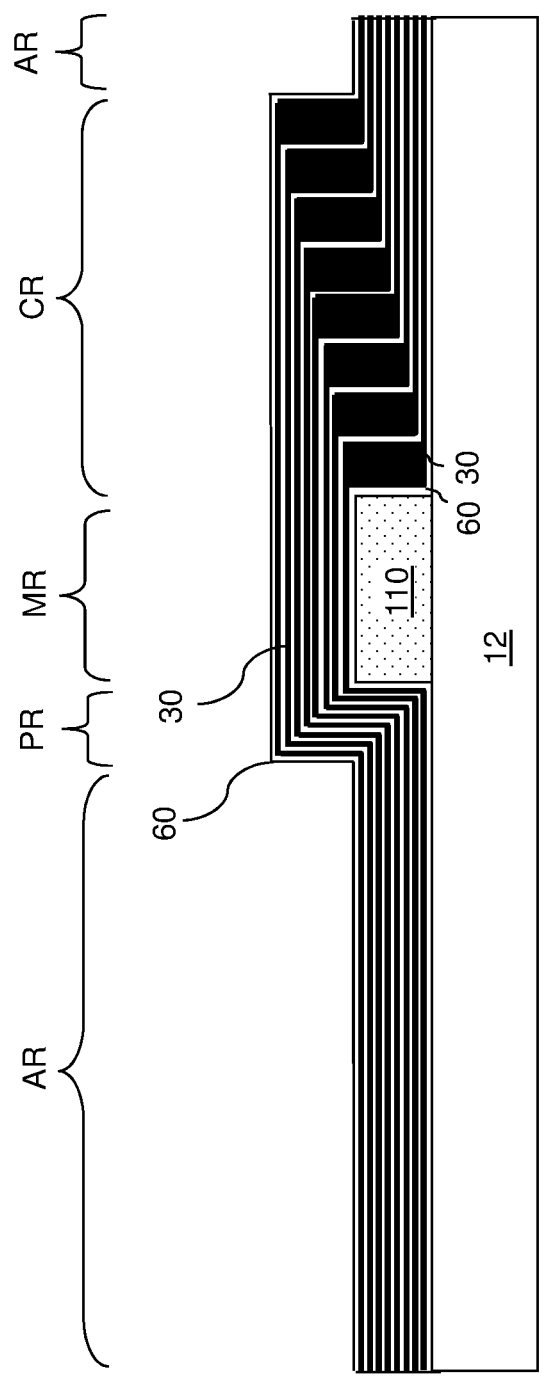
FIG. 3B is a vertical cross-sectional view of the exemplary structure of FIG. 3A along the vertical plane B-B'.
Figure 3C:
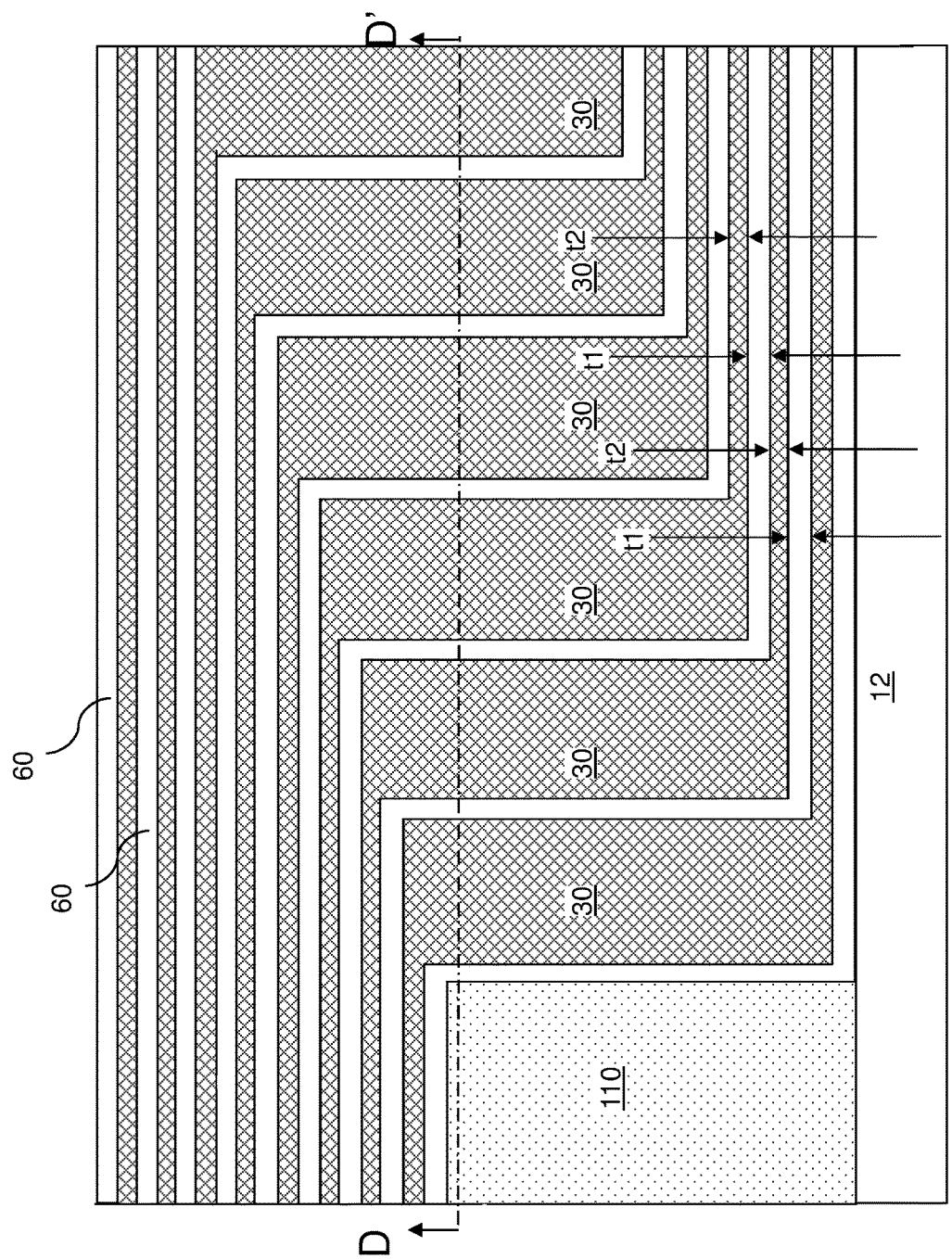
FIG. 3C is a vertical cross-sectional view of the exemplary structure of FIG. 3A along the vertical plane C-C'.

Referring to FIG. 3B, the exemplary structure includes array regions AR, which are portions of the primary regions P that include only horizontally extending portions of the layers in the alternating stack (60, 30). The exemplary structure further includes peripheral regions PR, which are portions of the primary regions P that include vertically extending portions of the layers in the alternating stack (60, 30). The exemplary structure includes contact regions CR, which are regions in which contact via structures that provide electrical contact to portions of the electrically conductive layers 60 that remain in a final device structure. Each contact region CR corresponds the area of a respective generally wedge-shaped region W. The exemplary structure includes a matrix region MR, which is a region including the entire area of the dielectric matrix layer 110.

Each insulating layer 60 can be deposited by a respective instance of a first conformal deposition process, which can be an atomic layer deposition process or a low pressure chemical vapor deposition process. Likewise, each electrically conductive layer 30 can be deposited by a respective instance of a second conformal deposition process, which can be an atomic layer deposition process or a low pressure chemical vapor deposition process. The duration of each instance of the first conformal deposition process can be controlled such that each insulating layer 60 has a first thickness t1, which is the same as the first thickness t1 described above in the calculations for the N-th lateral separation distances dN. The duration of each instance of the second conformal deposition process can be controlled such that each electrically conductive layer 30 has a second thickness t2, which is the same as the second thickness t2 described above in the calculations for the N-th lateral separation distances dN.

In one embodiment, the first thickness t1 can be in a range from 10 nm to 30 nm, such as from 12 nm to 25 nm, although lesser and greater thicknesses can also be employed. The second thickness t2 can be in a range from 12 nm to 40 nm, such as from 15 nm to 35 nm, although lesser and greater thicknesses can also be employed. The alternating stack (60, 30) can begin with an instance of the insulating layer 60, and can terminate with another instance of an insulating layer 60 or with an instance of the electrically conductive layer 30. Optionally, an insulating cap layer (not shown), which may, or may not, have the same composition as the insulating layers 60 and may, or may not, have the same thickness as the insulating layers 60 can be deposited if the alternating stack (60, 30) terminates with an instance of an electrically conductive layer 30. The total thickness of the alternating stack (60, 30) and any insulating cap layer (if present) can be substantially the same as the thickness of the dielectric matrix layer 110, or can be the same as the thickness of the dielectric matrix layer 110 adjusted by the thickness of a portion of the dielectric matrix layer 110 or the topmost insulating material layer (such as the insulating cap layer) to be subsequently removed during a planarization process. The number of repetitions in the alternating stack (60, 30), i.e., the total number of the electrically conductive layers 30 within the alternating stack (60, 30), can the same as the total number of pairs of first sidewalls 131, i.e., the number N.

The alternating stack (60, 30) includes conformal material layers, and as such, the general contour of the alternating stack (60, 30) replicates the shapes of the sidewalls of the cavities 111. The lateral offset between the sidewalls of the cavities and the sidewalls of the topmost layer of the alternating stack (60, 30) can be the same as the thickness of the alternating stack (60, 30) within the primary region P, and can be greater than the thickness of the alternating stack (60, 30) within each generally wedge-shaped region W.

Figure 3D:
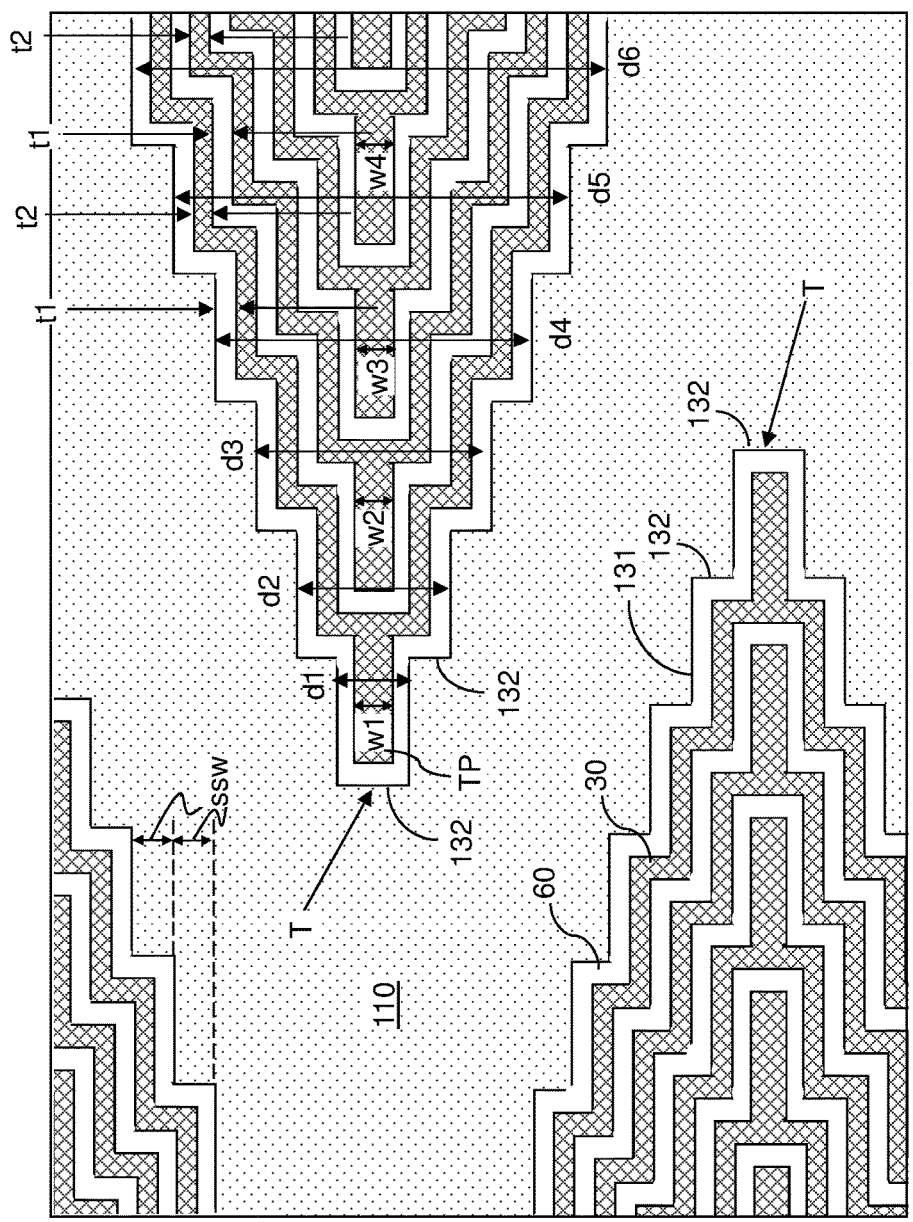
FIG. 3D is a top-down view of region D of the exemplary structure shown in FIG. 3A.

As shown in FIG. 3D, the tip portion TP of each electrically conductive layer 30 within the alternating stack (60, 30) can have a width wi that is greater than the thickness of the horizontal portions of the electrically conductive layers 30 within the primary region P as measured along the vertical direction, i.e., the second thickness t2. In some embodiments, each tip portion TP can consist of a respective electrically conductive layer 30. In this case, each of the widths wi can be less than twice the thickness of the horizontal portion of the electrically conductive layer within the primary region P as measured along the vertical direction, i.e., less than twice the second thickness t2.

Figure 3E:
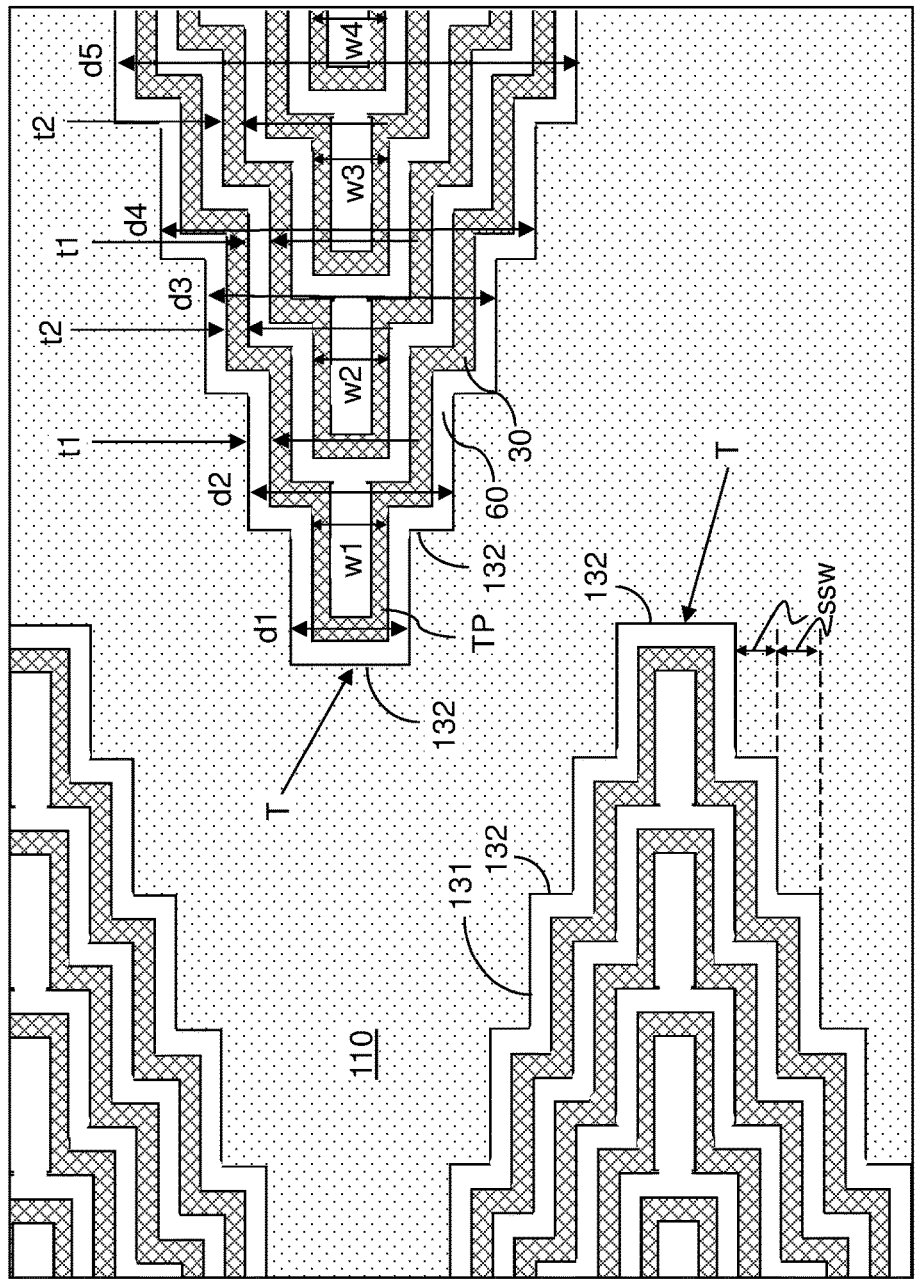
FIG. 3E is a top-down view of an alternative configuration for region D of the exemplary structure shown in FIG. 3A.

In an alternative configuration, a portion of a neighboring insulating layer 60 may be nested inside a tip portion TP as illustrated in FIG. 3E. In this case, each of the widths wi can be less than the sum of twice the thickness of the horizontal portion of the electrically conductive layer 30 within the primary region P as measured along the vertical direction and twice the thickness of the horizontal portion of an insulating layer 60 within the primary region P as measured along the vertical direction, i.e., less than the sum of twice the second thickness t2 and twice the first thickness t1, which is $2 \times t1 + 2 \times t2 = 2 \times t1 \times (1 + t2/t1)$.

In some embodiments, hybrid configurations between the configuration of FIG. 3D and the configuration of FIG. 3E may be formed. In this case, the second sidewall width ssw can be different from the sum of the first thickness t1 and the second thickness t2. For example, the tip of the outermost electrically conductive layer 30 may have a tip of an insulating layer 60 nested therein (as illustrated in FIG. 3E), and the tip of the innermost electrically conductive layer 30 may not have any insulating layer 60 nested therein (as illustrated in FIG. 3D). Alternatively, the tip of the outermost electrically conductive layer 30 may not have any tip of an insulating layer 60 nested therein (as illustrated in FIG. 3D), and the top of the innermost electrically conductive layer 30 may have a tip of an insulating layer 60 nested therein (as illustrated in FIG. 3E).

As illustrated in FIGS. 3D and 3E, the first width w1 is given by $\alpha \times t2$. Thus, w1 is the same as $d1 - 2 \times t1$. The nominal value for the i-th width wi, i.e., the width of the i-th tip portion TP as counted from the side of the tip T, is related to the i-th lateral separation distance dN by: $wi = di - 2it1 - 2(i-1)t2 = di - 2(i-1)(t1+t2) - 2t1$.

The nominal value of di (with processing errors introduced by variations of thicknesses that causes $\beta$ to be different from $\alpha$) is given by:

$$di = d1 + 2(i-1)\left[(t1+t2) + \left\{\frac{(\beta-\alpha)t2}{2(N-1)}\right\}\right],$$

In case $\alpha$ is the same as $\beta$, di is given by:

$di = d1 + 2(i-1)(t1+t2)$.

As a corollary, the average value of the length of each second sidewall 132 other than the second sidewall 132 containing the tip is given by:

$$ssw = (t1+t2) + \left\{\frac{(\beta-\alpha)t2}{2(N-1)}\right\}.$$

Thus, the length ssw of each second sidewall 132 other than the second sidewall 132 including the tip T can be substantially the same as the sum of the first thickness t1 and the second thickness t2.

As discussed above, $\alpha$ can be in a range from 0.1 to $2.0 \times (1+t1/t2)$, although a lesser value can also be employed. $\beta$ can be in a range from 0.1 to $2.0 \times (1+t1/t2)$, although lesser values can also be employed provided. In one embodiment, $\alpha$ can be in a range from 0.5 to 4 (such as from 1 to 3), and $\beta$ can be in a range from 0.5 to 4 (such as from 1 to 3).

In one embodiment, the ratio of ssw to sl can be less than 1, and can be in a range from 0.05 to 0.5, such as from 0.025 to 0.25, although lesser and greater ranges can also be employed.

Figure 4A:
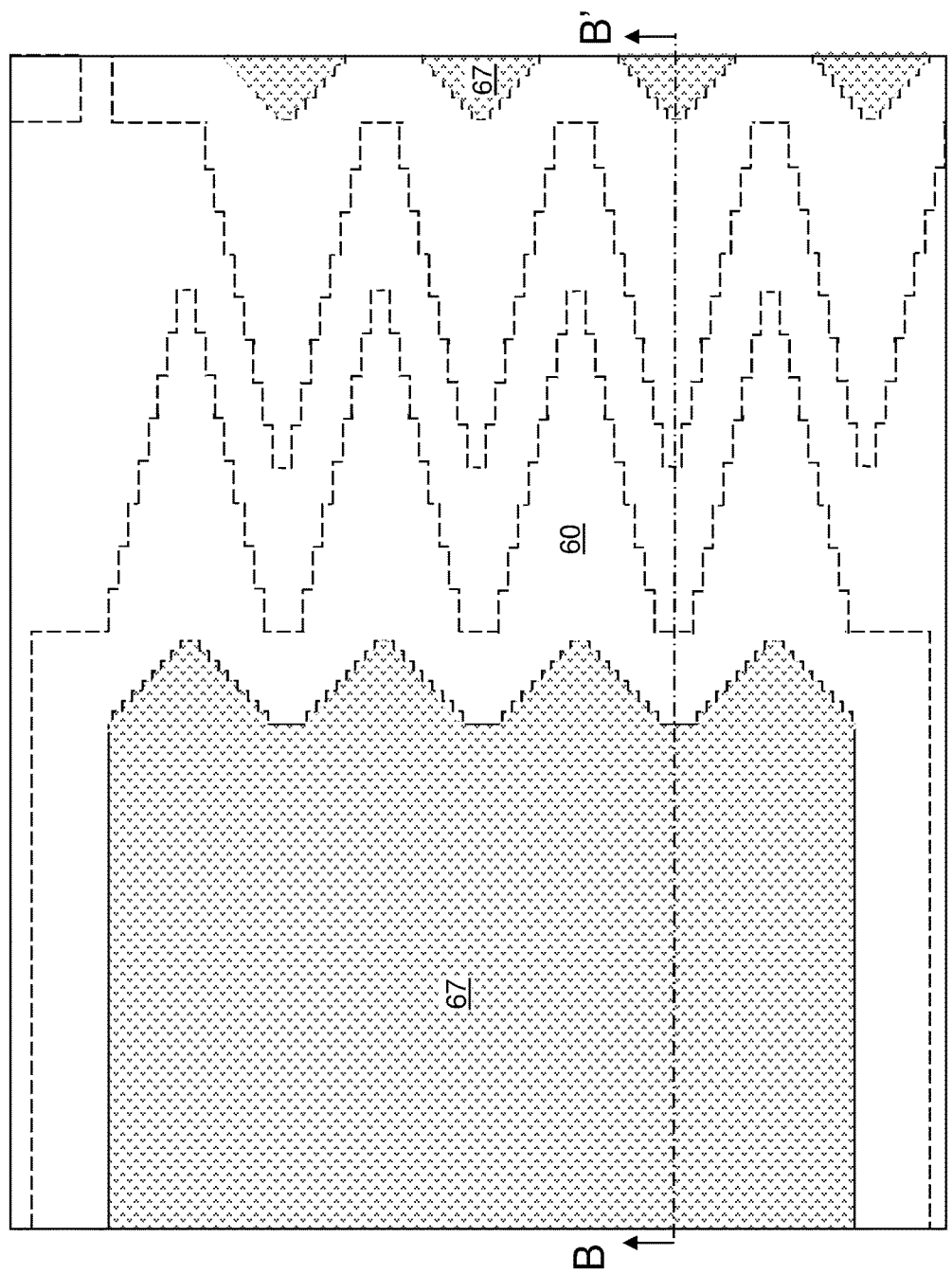
FIG. 4A is a top-down view of the exemplary structure after formation of a self-planarizing masking layer according to an embodiment of the present disclosure.
Figure 4B:
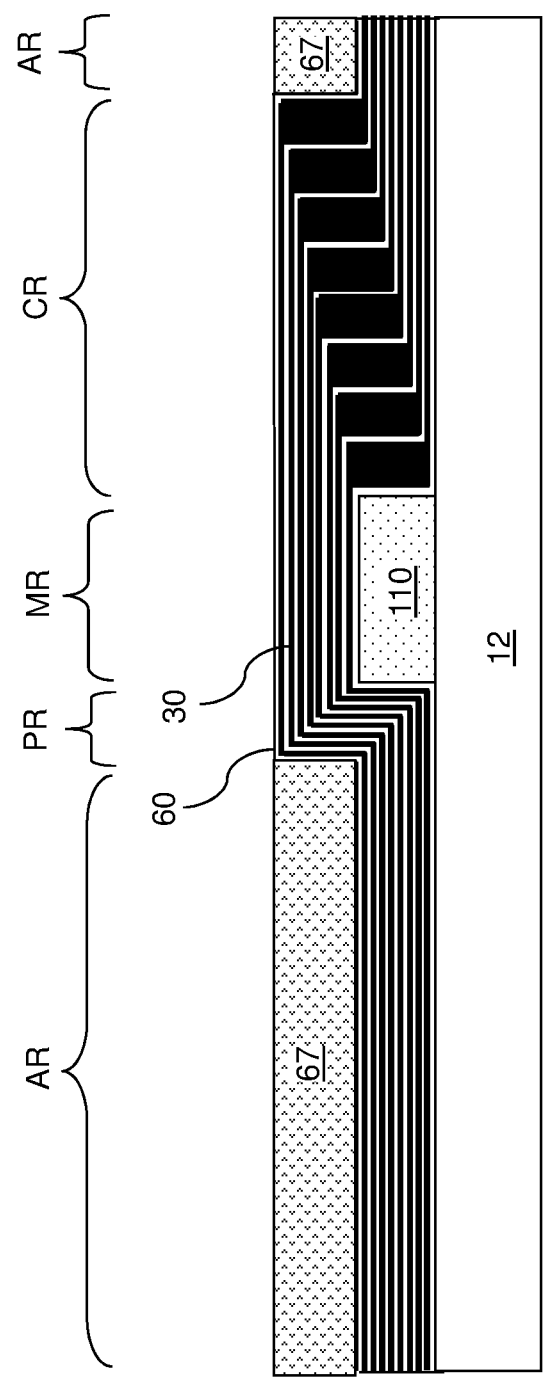
FIG. 4B is a vertical cross-sectional view of the exemplary structure of FIG. 4A along the vertical plane B-B'.

Referring to FIGS. 4A and 4B, a self-planarizing mask layer 67 is formed within a recessed region that overlies a center portion of the primary region P. The self-planarizing mask layer 67 includes a self-planarizing material that can be employed as a mask material during subsequent etch processes. For example, the self-planarizing mask layer 67 can include a photoresist layer formed by spin-coating.

The amount of the self-planarizing material dispensed for forming the self-planarizing mask layer 67 can be controlled such that the self-planarizing mask layer 67 is laterally bounded by sidewalls of a topmost layer of the alternating stack (60, 30). In other words, the top surface of the self-planarizing mask layer 67 can be located at, or below, the topmost horizontal surface of the alternating stack (60, 30) that overlies the dielectric matrix layer 110.

Referring to FIGS. 5A-5D, the alternating stack (60, 30) can be planarized by removing portions of the alternating stack (60, 30) that are located over a horizontal plane including the top surface of the dielectric matrix layer 110. Specifically, portions of the alternating stack (60, 30) that is not masked by the self-planarizing masking layer 67 can be etched by a set of etch processes that remove the materials of the insulating layers 60 and the electrically conductive layers 30. The portions of the alternating stack (60, 30) located over the horizontal plane including the top surface of the dielectric matrix layer 110 are removed by the set of etch processes.

The set of etch processes patterns the alternating stack (60, 30) by removal of the portions that are not masked by the self-planarizing masking layer 67. In one embodiment, the portions of the alternating stack (60, 30) that are not masked by the self-planarizing mask layer 67 can be performed by repetition of a combination of a first etch process that etches the material of the electrically conductive layers 30 and a second etch process that etches the material of the insulating layers 60. In one embodiment, the electrically conductive layers 30 can include a conductive metal nitride material, and the insulating layers 60 can include a silicon oxide material.

In one embodiment, the first etch process can be a dry etch process that etches the conductive metal nitride material, and the second etch process can be a wet etch process that etches the silicon oxide material. For example, the electrically conductive layers 30 can include TiN, and the dry etch process can employ at least one fluorocarbon gas (such as $C_4F_8$ and/or $CHF_3$) and optionally chlorine gas or oxygen gas. The insulating layers 60 can include a silicon oxide material, and the wet etch process can employ dilute hydrofluoric acid.

In another embodiment, the first etch process can be a first dry etch process that etches the conductive metal nitride material, and the second etch process can be a second dry etch process that etches the silicon oxide material. For example, the electrically conductive layers 30 can include TiN, and the first dry etch process can employ at least one fluorocarbon gas (such as $C_4F_8$ and/or $CHF_3$) and optionally chlorine gas or oxygen gas. The insulating layers 60 can include a silicon oxide material, and the second dry etch process can employ hydrofluoric acid vapor.

In yet another embodiment, the portions of the alternating stack (60, 30) that are not masked by the self-planarizing mask layer 67 can be removed by at least one dry etch process that etches the materials of the electrically conductive layers 30 and the insulating layers 60 simultaneously. For example, the electrically conductive layers 30 can include TiN and the insulating layers 60 can include a silicon oxide material. The at least one dry etch process can employ at least one fluorocarbon gas (such as $C_4F_8$ and/or $CHF_3$) and optionally chlorine gas or oxygen gas to simultaneously etch the materials of the electrically conductive layers 60 and the insulating layers. In yet another embodiment the portions of the alternating stack (60, 30) that extend above the dielectric matrix layer 110 are removed by chemical mechanical planarization (CMP) of the layers of the alternating stack are formed of materials that can be planarized by CMP.

A tip portion TP of each electrically conductive layer 30 within remaining portions of the alternating stack (60, 30) is laterally offset from the tip T of the generally wedge-shaped region W by a respective lateral offset distance lod that is different from lateral offset distances lod of other tip portions TP along the lateral protrusion direction lpd.

Figure 5A:
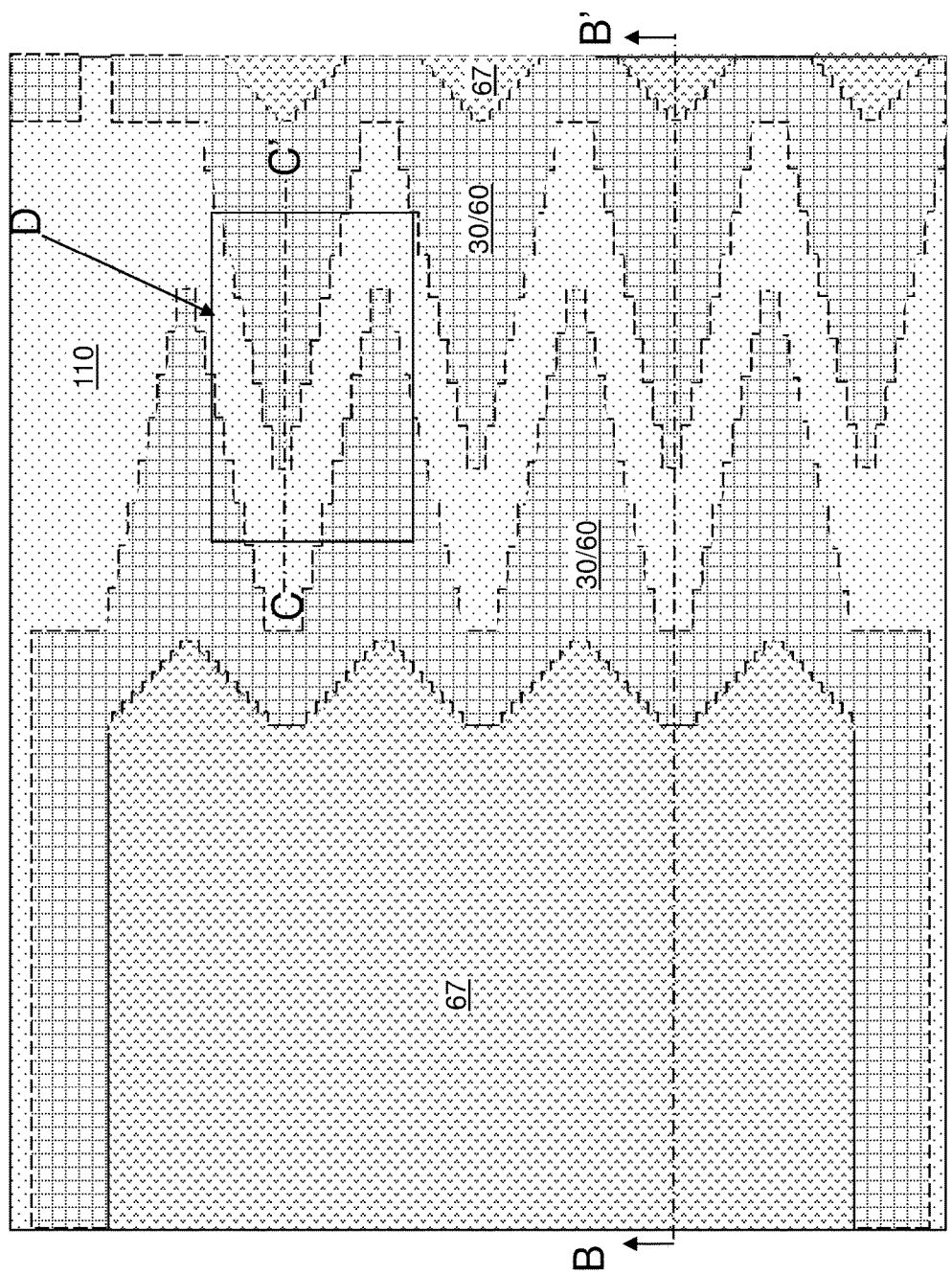
FIG. 5A is a top-down view of the exemplary structure after removing portions of the alternating stack that is not masked by the self-planarizing masking layer according to an embodiment of the present disclosure.
Figure 5B:
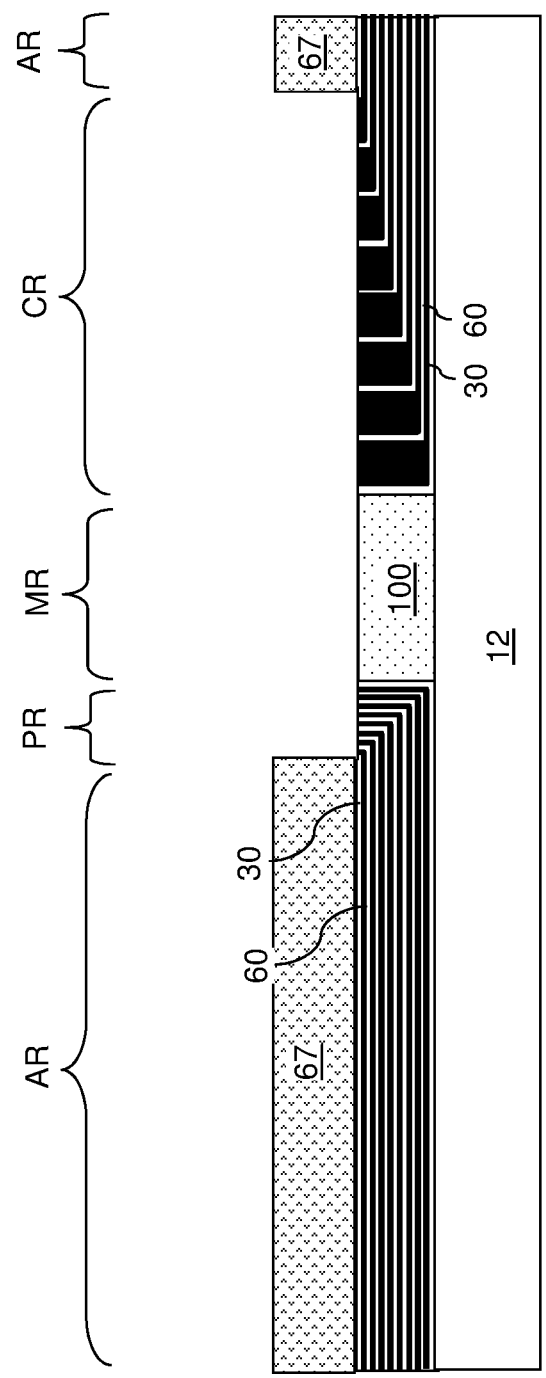
FIG. 5B is a vertical cross-sectional view of the exemplary structure of FIG. 5A along the vertical plane B-B'.
Figure 5C:
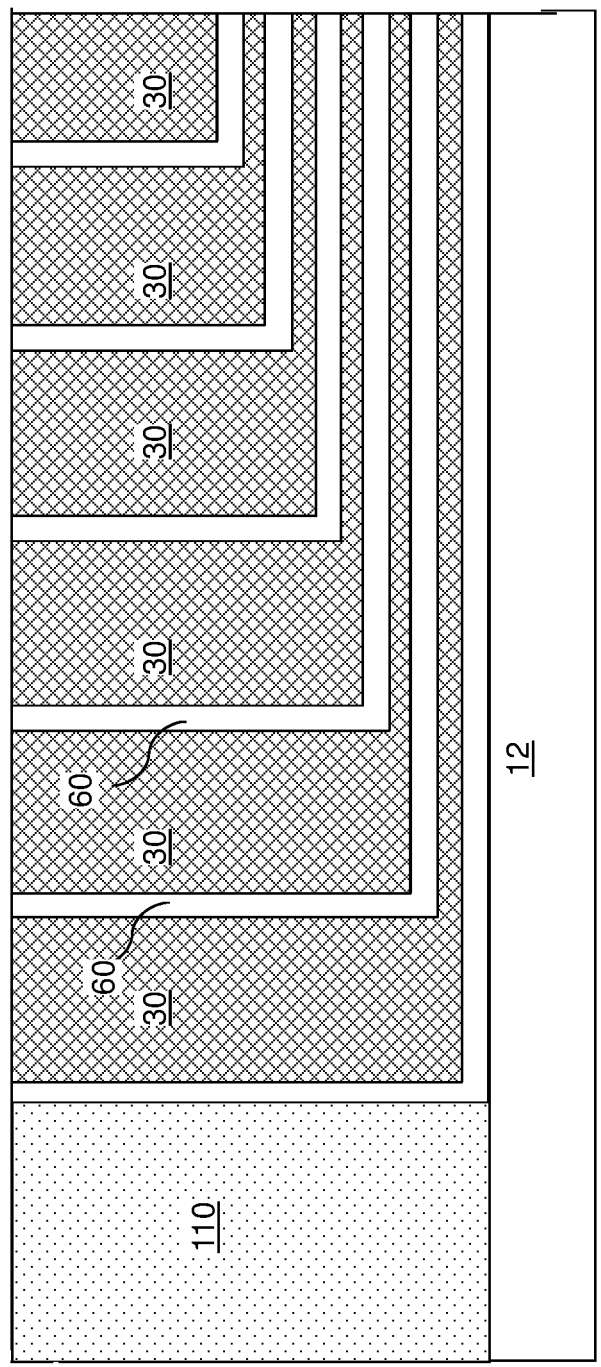
FIG. 5C is a vertical cross-sectional view of the exemplary structure of FIG. 5A along the vertical plane C-C'.
Figure 5D:
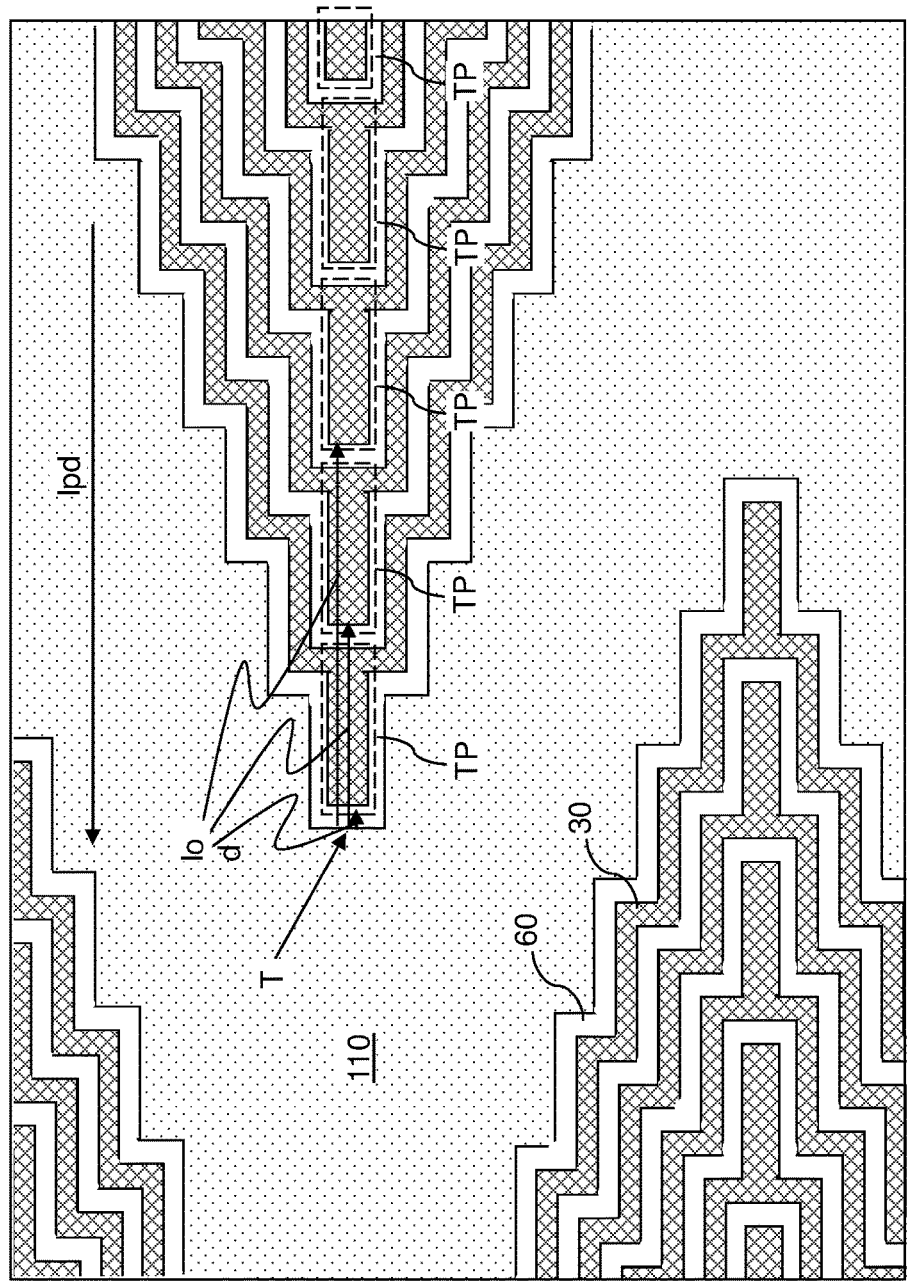
FIG. 5D is a top-down view of region D of the exemplary structure shown in FIG. 5A.
Figure 6A:
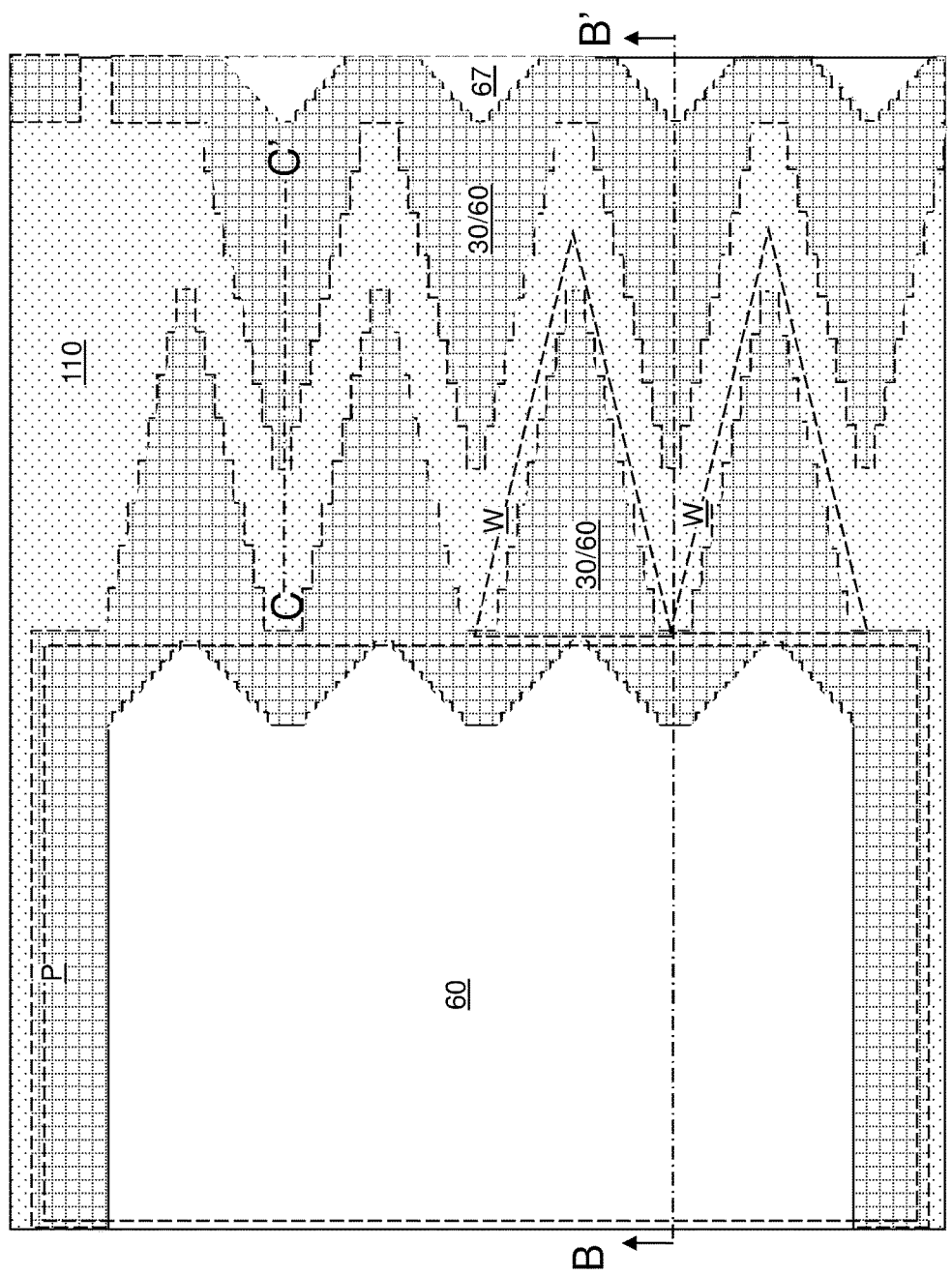
FIG. 6A is a top-down view of the exemplary structure after removal of the self-planarizing masking layer according to an embodiment of the present disclosure.
Figure 6B:
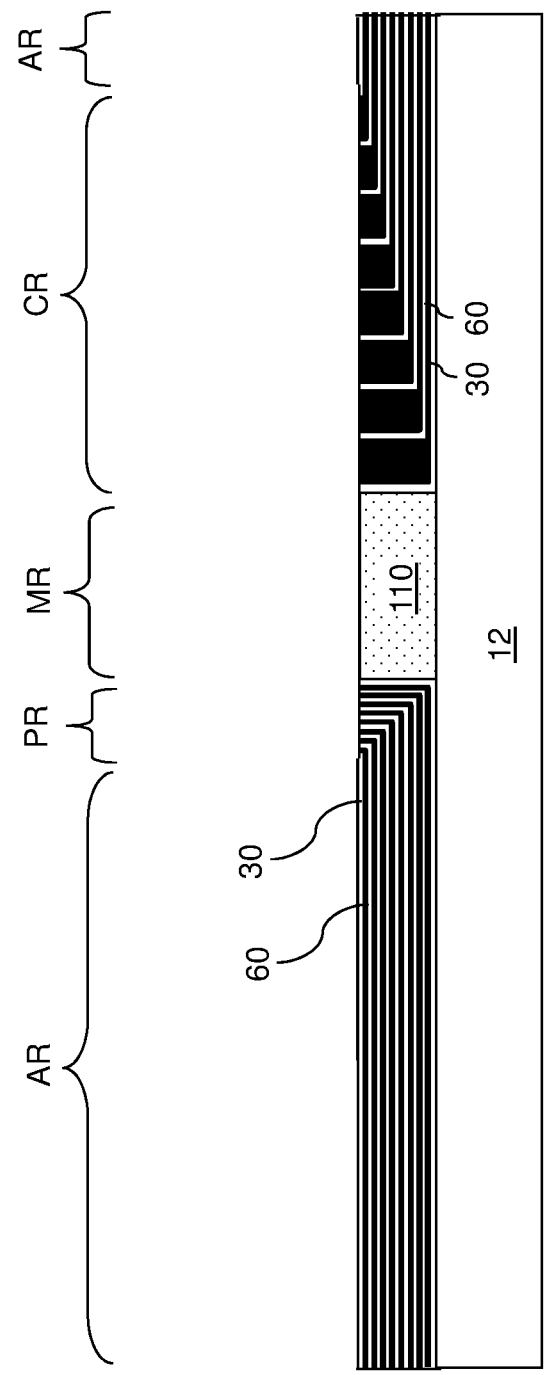
FIG. 6B is a vertical cross-sectional view of the exemplary structure of FIG. 6A along the vertical plane B-B'.
Figure 6C:
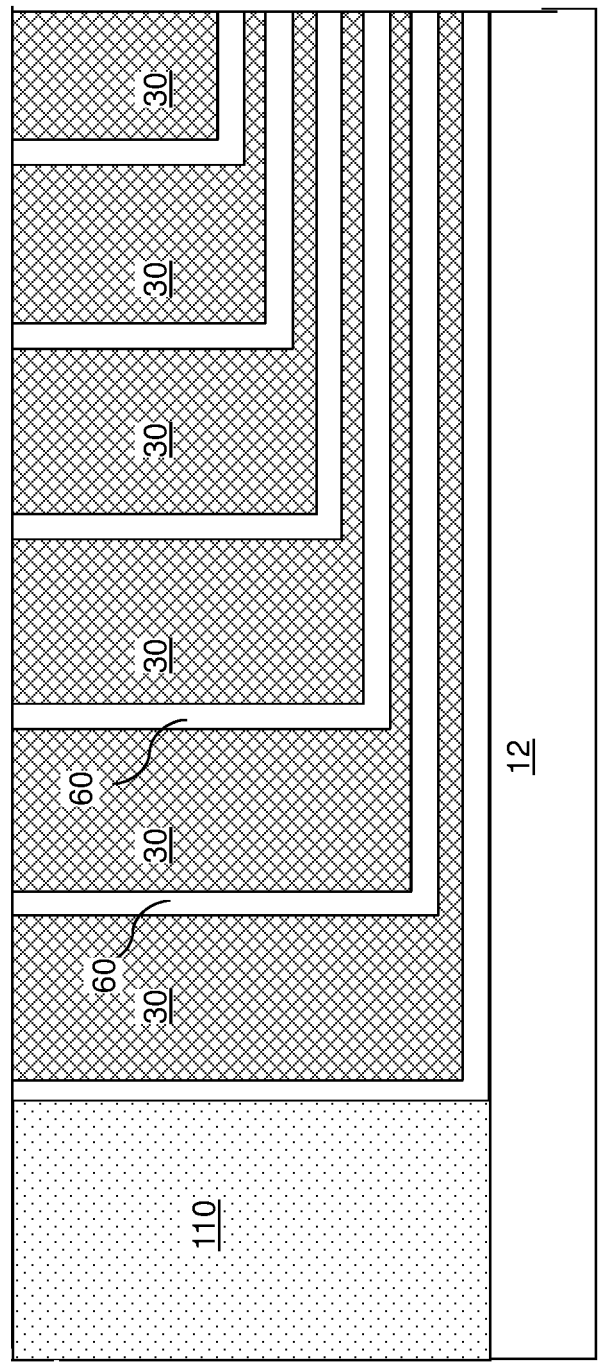
FIG. 6C is a vertical cross-sectional view of the exemplary structure of FIG. 6A along the vertical plane C-C'.

Referring to FIGS. 6A-6C, the self-planarizing mask layer 67 can be removed selective to the remaining portions of the alternating stack (60, 30), for example, by ashing. The horizontal surface of the topmost insulating layer 60 (or an insulating cap layer) can be physically exposed at the interior of each primary region P. Alternating top surfaces of the insulating layers 60 and the electrically conductive layers 30 can be physically exposed within each generally wedge-shaped region W and at the peripheral portion of each primary region P. Each physically exposed surface of the insulating layers 60 at the peripheral portions of the primary regions P can have a uniform width that is the same as the first thickness t1. Each physically exposed surface of the electrically conductive layers 30 at the peripheral portions of the primary region P can have a uniform width that is the same as the second thickness t2. Each physically exposed surface of the insulating layers 60 within a generally wedge-shaped region W can have a pair of staircase patterns that are adjoined around a tip portion TP that is embedded immediately within (i.e., surrounded by) the respective insulating layer 60 as illustrated in FIG. 5D. Each physically exposed surface of the electrically conductive layers 30 within a generally wedge-shaped region W can have a pair of staircase patterns that are adjoined to form a respective tip portion TP.

Figure 7A:
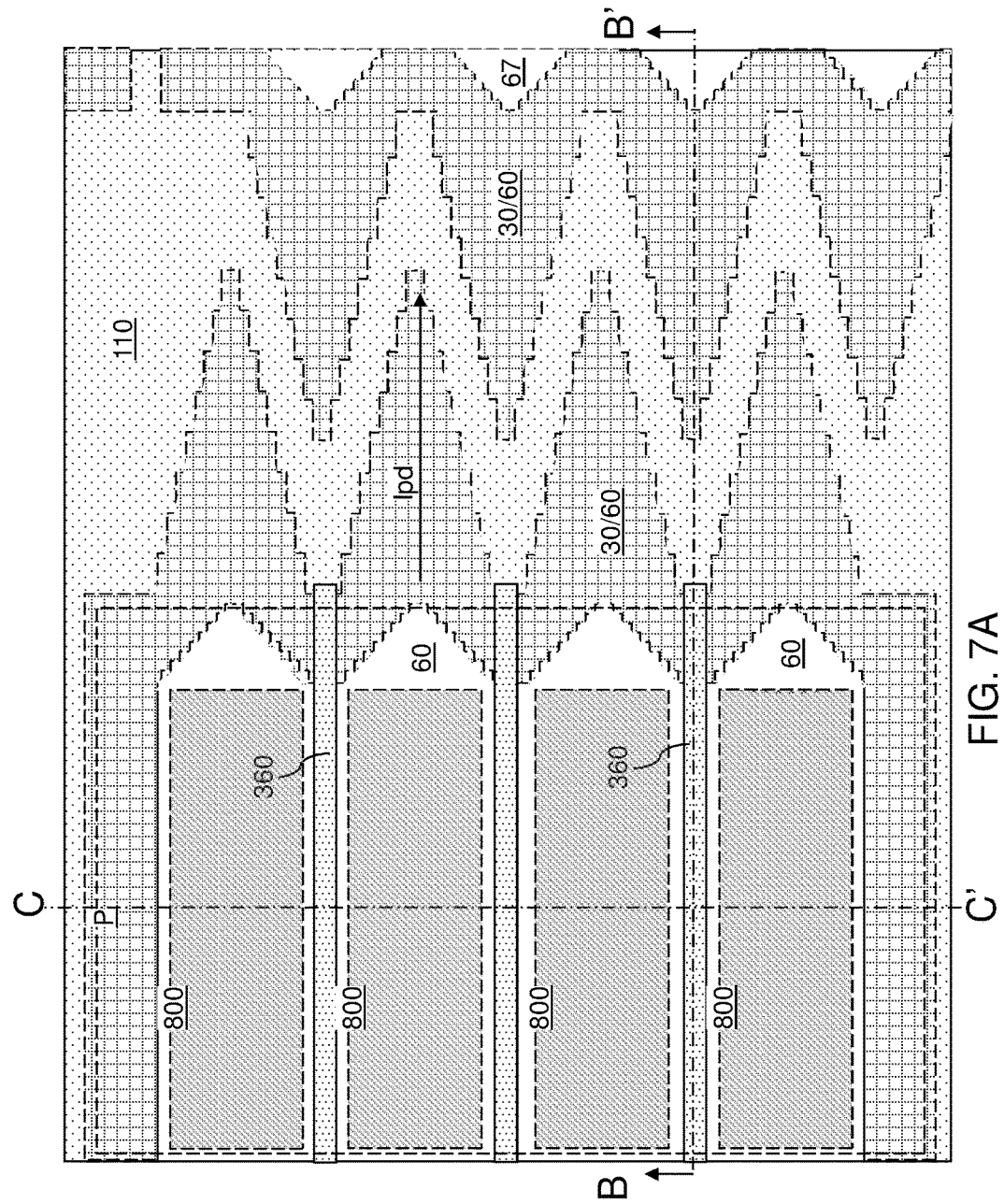
FIG. 7A is a top-down view of the exemplary structure after formation of memory elements according to an embodiment of the present disclosure.
Figure 7B:
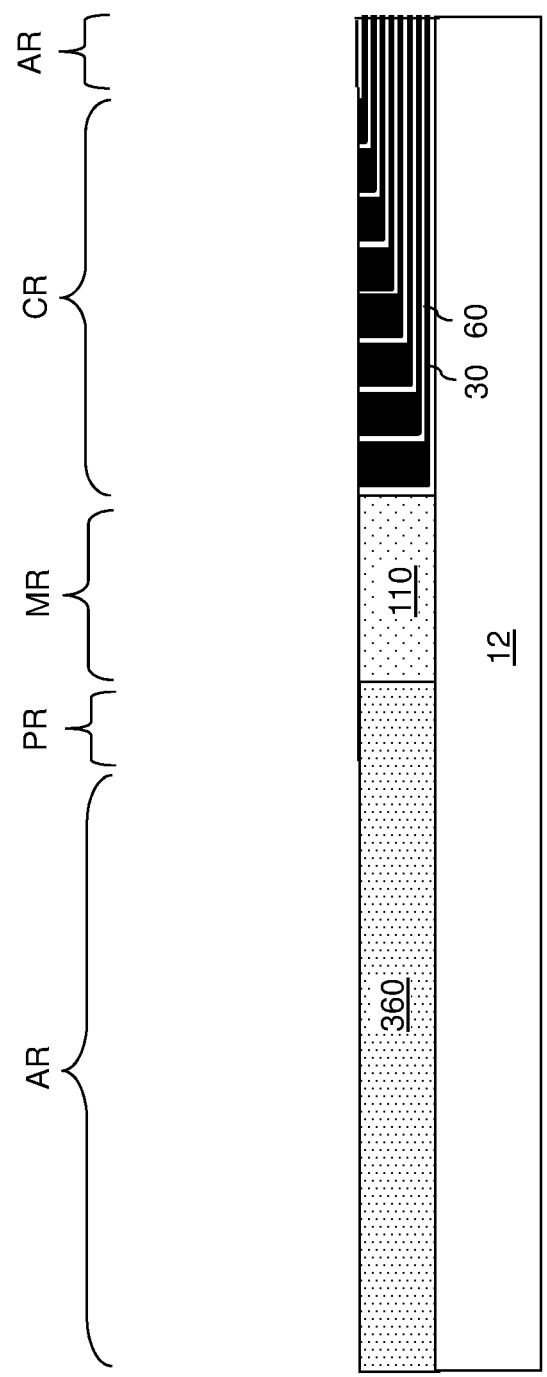
FIG. 7B is a vertical cross-sectional view of the exemplary structure of FIG. 7A along the vertical plane B-B'.
Figure 7C:
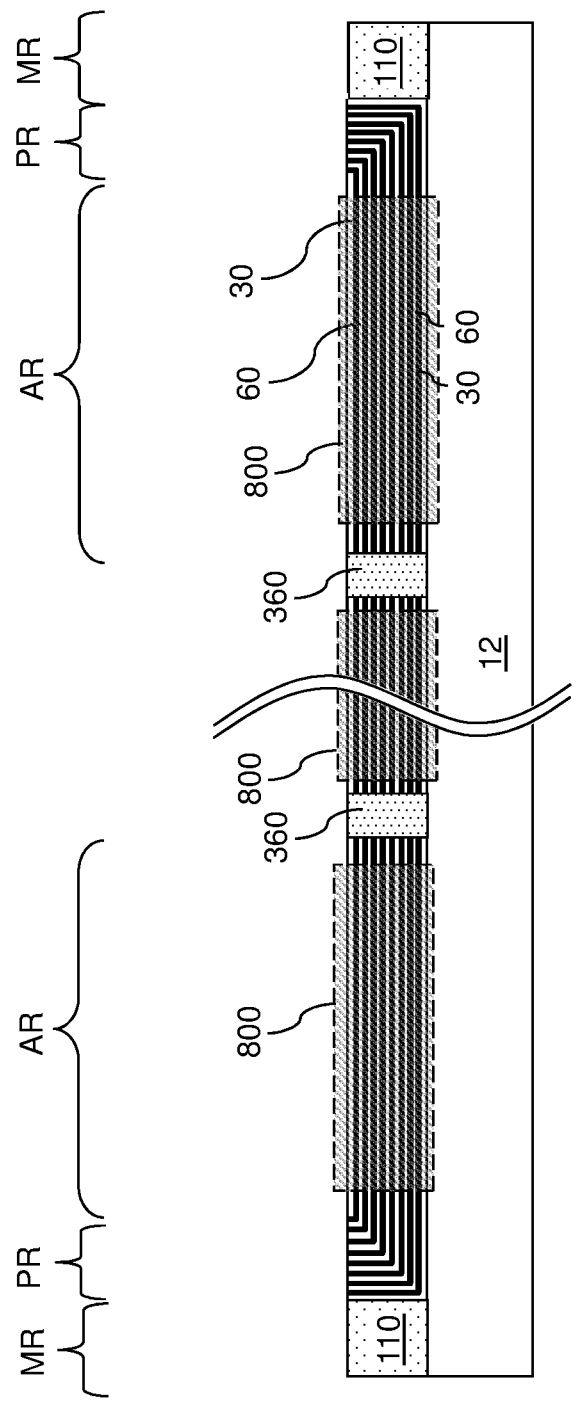
FIG. 7C is a vertical cross-sectional view of the exemplary structure of FIG. 7A along the vertical plane C-C'.
Figure 8A:
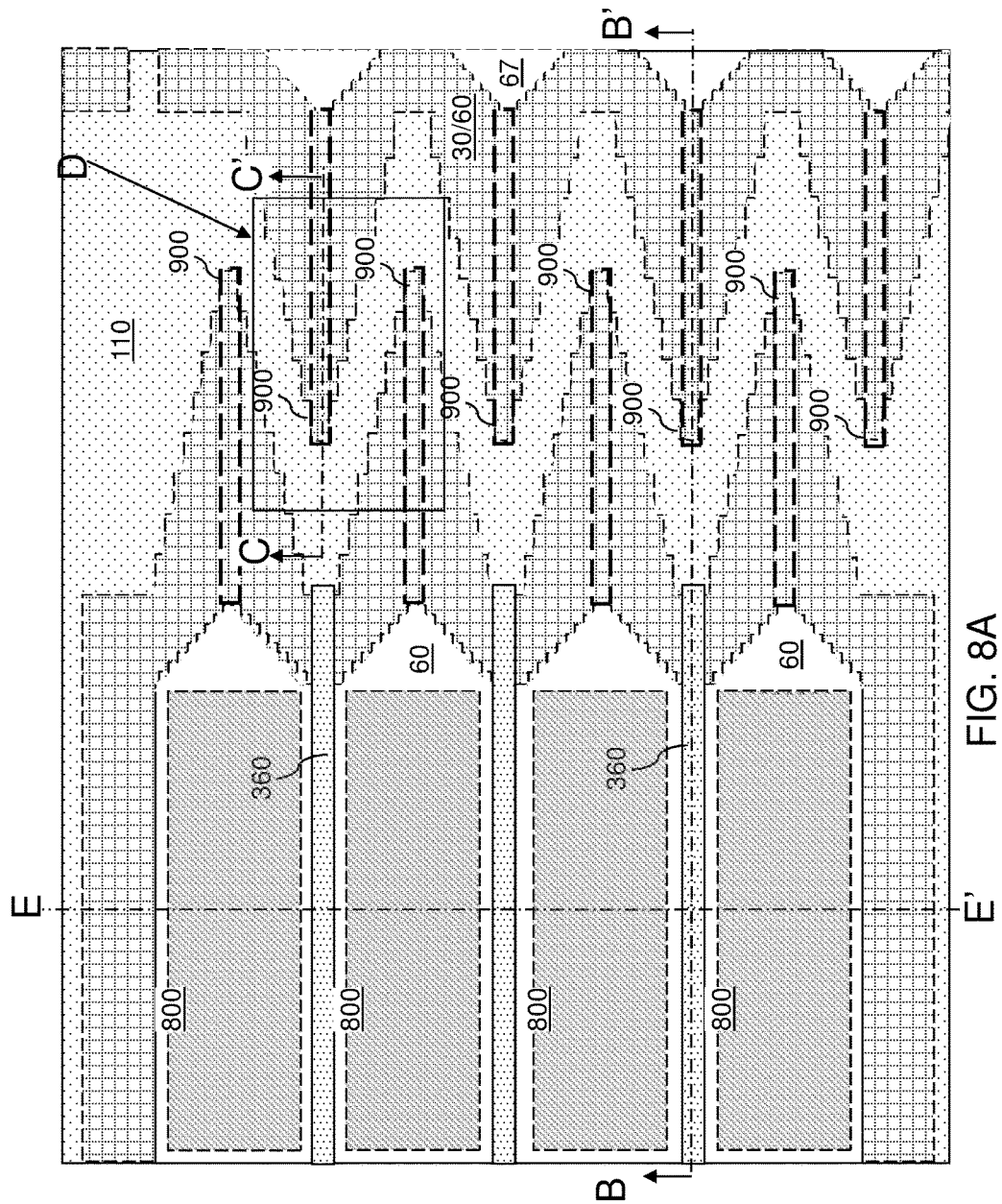
FIG. 8A is a top-down view of the exemplary structure after formation of a contact level dielectric layer and various contact via structures according to an embodiment of the present disclosure.
Figure 8B:
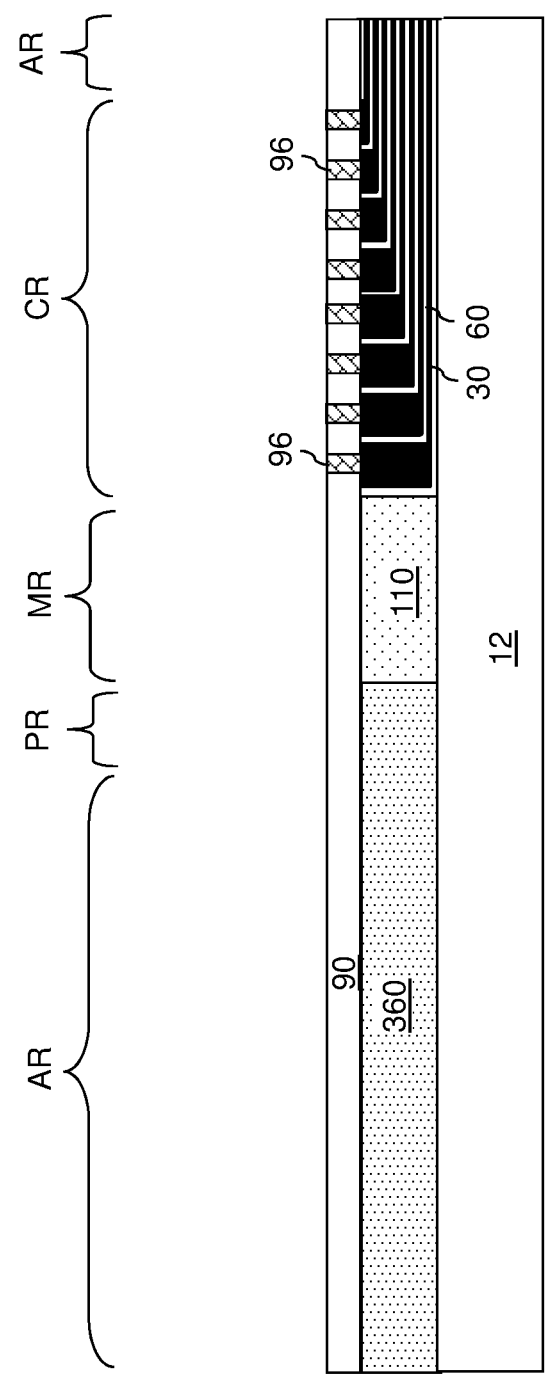
FIG. 8B is a vertical cross-sectional view of the exemplary structure of FIG. 8A along the vertical plane B-B'.
Figure 8C:
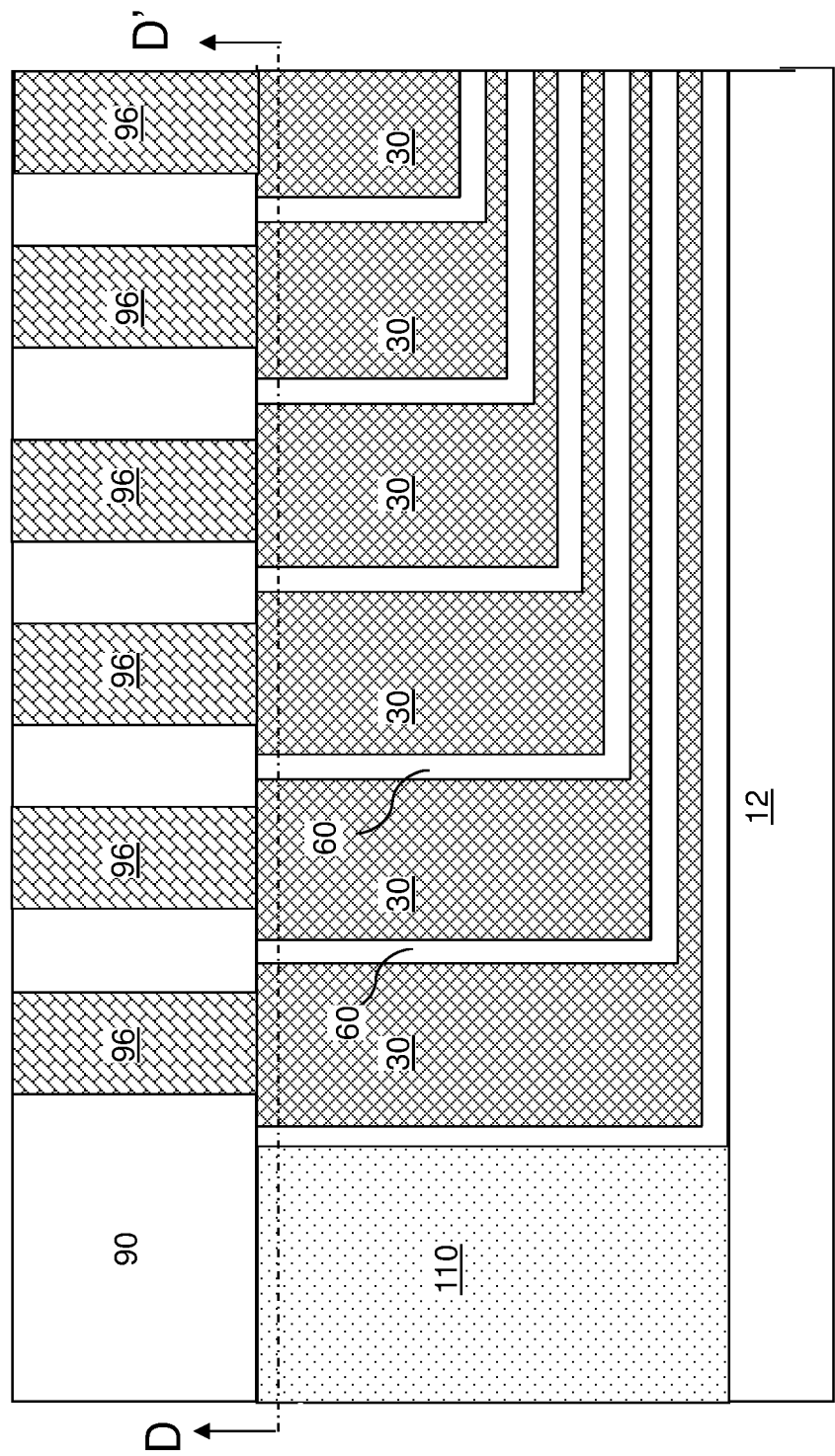
FIG. 8C is a vertical cross-sectional view of the exemplary structure of FIG. 8A along the vertical plane C-C'.
Figure 8D:
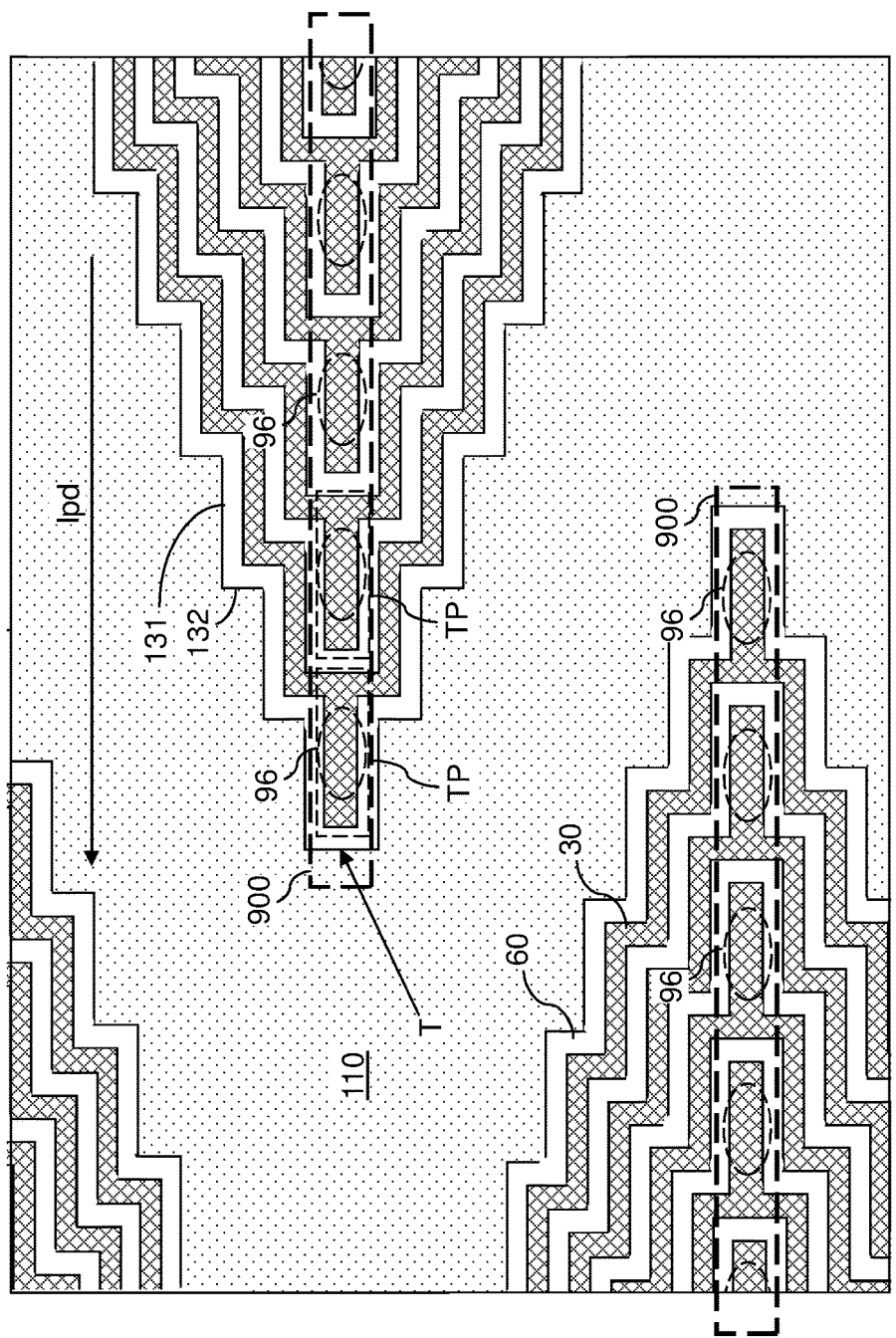
FIG. 8D is a top-down view of region D of the exemplary structure shown in FIG. 8A along the horizontal plane D-D' shown in FIG. 8C.
Figure 8E:
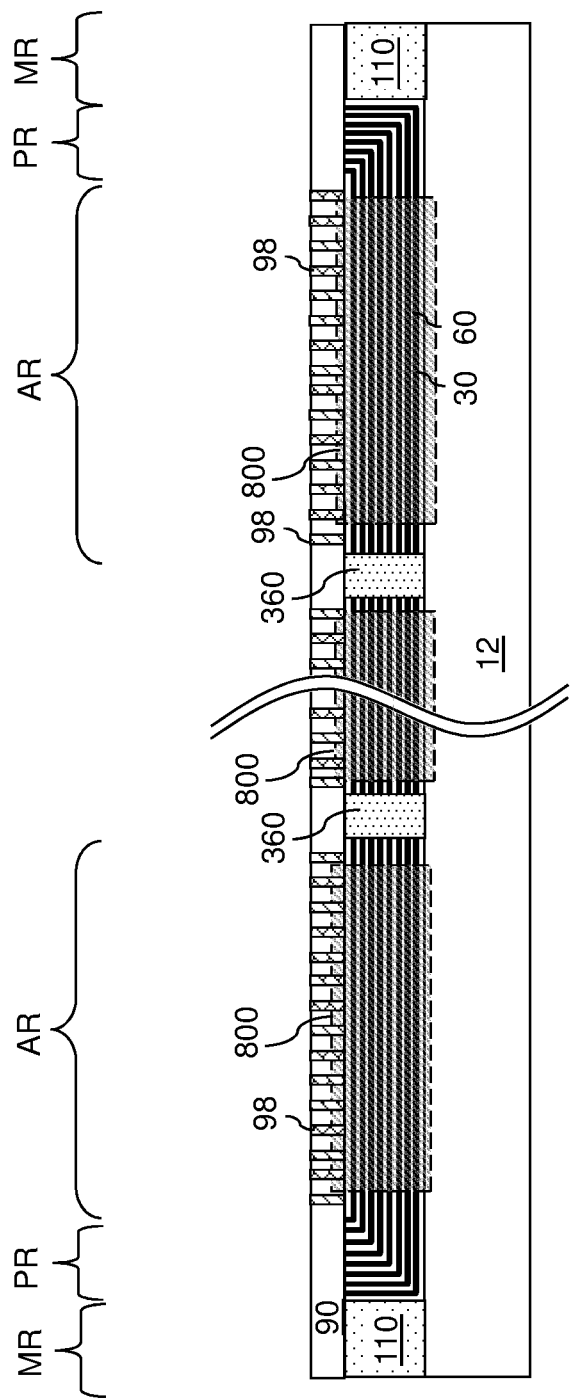
FIG. 8E is a vertical cross-sectional view of the exemplary structure of FIG. 8A along the vertical plane E-E'.

Referring to FIGS. 7A-7C, at least one array 800 of memory elements can be formed within each portion (e.g., array regions, AR) of the alternating stack (60, 30) that includes horizontal portions of the insulating layers 60 and the electrically conductive layers 30 and does not include vertical portions of the insulating layers 60 and the electrically conductive layers 30. The structure of the memory elements can be selected depending on the nature of a three-dimensional memory device to be formed. In one embodiment, the at least one array 800 of memory elements can form a three-dimensional NAND memory device. In another embodiment, the at least one array 800 of memory elements can form a three-dimensional ReRAM device.

In some embodiments, an array of memory openings vertically extending through the array regions AR (e.g., a center portion) of the primary region P of the alternating stack (60, 30) can be formed. Memory elements can be formed at each level of the electrically conductive layers 30 within each of the memory openings within the array of memory openings to form each array 800 of memory elements.

Optionally, dielectric separator structures 360 including a dielectric material can be formed to laterally divide the alternating stack (60, 30) into a plurality of strips (e.g., memory blocks) of alternating stacks (60, 30) that extend generally along the lateral protrusion direction lpd or along the direction of the first sidewalls 131 (see FIG. 2B). In this case, portions of the electrically conductive layers 360 within each strip of the alternating stacks (60, 30) can constitute word lines for accessing the memory elements within the respective array 800 of memory elements. The dielectric separator structures 360 can be formed, for example, by laterally extending trenches through the alternating stack (60, 30) within the respective primary region P and filling the laterally extending trenches with a dielectric material such as silicon oxide, silicon nitride, and/or a dielectric metal oxide. Excess portions of the dielectric material can be removed from above the alternating stack (60, 30) and the dielectric matrix layer 110 by a planarization process such as chemical mechanical planarization (CMP) and/or a recess etch.

Referring to FIGS. 8A-8E, a contact level dielectric layer 90 can be deposited over the alternating stack (60, 30) and the dielectric matrix layer 110. The contact level dielectric layer 90 includes a dielectric material such as silicon oxide, silicon nitride, or organosilicate glass. The contact level dielectric layer 90 can have a thickness in a range from 50 nm to 1,000 nm, although lesser and greater thicknesses can also be employed.

Various contact via structures (96, 98) can be formed through the contact level dielectric layer 90. The various contact level via structures (96, 98) includes word line contact via structures 96 that are formed in the contact regions CR, i.e., within the area of the generally wedge-shaped region W, and array contact via structures 98 (e.g., bit line contacts) that are formed in the array regions, i.e., in array region AR within the primary regions P.

Each of the word line contact via structures 96 contacts a tip portion TP of a respective electrically conductive layer 30. Thus, each word line contact via structure 96 is formed directly on a top surface of a tip portion TP of a respective one of the electrically conductive layers 30. In one embodiment, the word line contact via structures 96 can be elongated along the direction of the first sidewalls 131. In one embodiment, the lateral dimension of each word line contact via structure 96 along the direction of the first sidewalls 131 can be less than the sum of twice the first thickness t1 (i.e., twice the thickness of each insulating layer 60) and the lateral dimension of the respective tip portion TP in contact with the word line contact via structure 96 along the direction of the first sidewalls 131. The maximum lateral dimension of each word line contact via structure 96 along the direction of the first sidewalls 131 can be reduced from the sum of twice the first thickness t1 (i.e., twice the thickness of each insulating layer 60) and the lateral dimension of the respective tip portion TP in contact with the word line contact via structure 96 along the direction of the first sidewalls 131 by the overlay variations along the direction of the first sidewalls 131 along a lithographic alignment process, by the image size variations during lithographic exposure and development, and by etch bias variations during formation of openings through the contact level dielectric layer 90.

In one embodiment, the lateral dimension of each word line contact via structure 96 along the direction of the second sidewalls 132 can be less than the sum of twice the first thickness t1 (i.e., twice the thickness of each insulating layer 60) and the lateral dimension of the respective tip portion TP in contact with the word line contact via structure 96 along the direction of the second sidewalls 132. The maximum lateral dimension of each word line contact via structure 96 along the direction of the second sidewalls 132 can be reduced from the sum of twice the first thickness t1 (i.e., twice the thickness of each insulating layer 60) and the lateral dimension of the respective tip portion TP in contact with the word line contact via structure 96 along the direction of the first sidewalls 131 by the overlay variations along the direction of the second sidewalls 132 along a lithographic alignment process, by the image size variations during lithographic exposure and development, and by etch bias variations during formation of openings through the contact level dielectric layer 90.

In one embodiment, the horizontal cross-sectional shapes of the word line contact via structures 96 can be generally elliptical with eccentricity in a range from 0.3 to 0.9, although lesser and greater eccentricities can also be employed. The generally elliptical horizontal cross-sectional shape of the word line contact via structures 96 can at least partially conform to the rectangular shapes of the tip portions TP of the electrically conductive layers 30 to provide increased contact areas. As discussed above, the dimension of each tip portion TP of the electrically conductive layers 30 along the direction of the first sidewalls 131 can be the step length sl, and the dimension of each tip portion TP of the electrically conductive layers 30 along the direction of the second sidewalls 132 can be between $\beta$ times the second thickness t2 and twice the second thickness t2. While $\beta$ can be in a range from 0.1 to 2.0, a greater value for $\beta$ is preferred as long as process control for the thicknesses of the insulating layers 60 and the electrically conductive layers 30 permits. In an exemplary embodiment, $\beta$ can be in a range from 0.5 to 1.9. In another embodiment, exemplary embodiment, $\beta$ can be in a range from 1.0 to 1.9. In yet another exemplary embodiment, $\beta$ can be in a range from 1.2 to 1.9.

The word line contact via structures 96 can be arranged as a one-dimensional array of word line contact via structures 96 that are arranged along the lateral protrusion direction lpd. The region of each one-dimensional array of word line contact via structures 96 is herein referred to as a word line contact via region 900.

In one embodiment, three-dimensional arrays 800 of memory elements can be embedded in array regions AR within the primary region P of the alternating stack (60, 30). Within the three-dimensional arrays 800 of memory elements, each of the electrically conductive layers 30 can be a word line configured to access a subset of the memory elements located at a respective level. Array contact via structures 98 can be formed within the array region AR through the contact level dielectric layer 90 and directly on various electrical nodes of the three-dimensional arrays 800 of memory elements. The nodes that the array contact via structures 98 contact can include vertical semiconductor channel of field effect transistors, active regions (such as source regions and drain regions) of field effect transistors, vertical gate lines that operate transistors, and/or any other active node of semiconductor devices that operate the memory elements during reading, writing, and/or erasing operations. The array contact via structures 98 and the word line contact via structures 96 can be formed at the same processing steps or may be formed at different processing steps. The array contact via structures 98 and the word line contact via structures 96 can have the same composition, or may have different compositions.

Figure 9A:
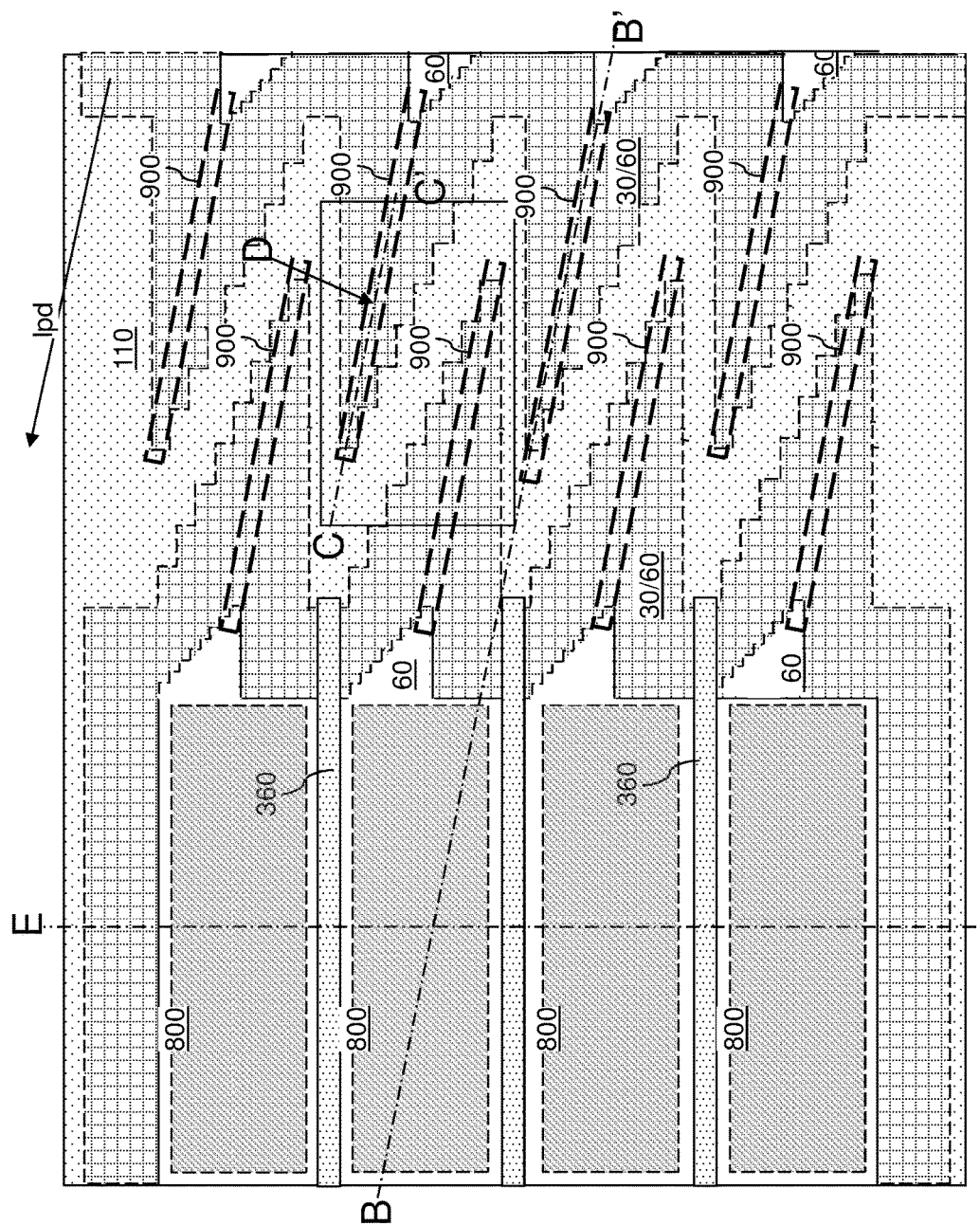
FIG. 9A is a top-down view of a first alternate embodiment of the exemplary structure after formation of a contact level dielectric layer and various contact via structures according to an embodiment of the present disclosure.
Figure 9B:
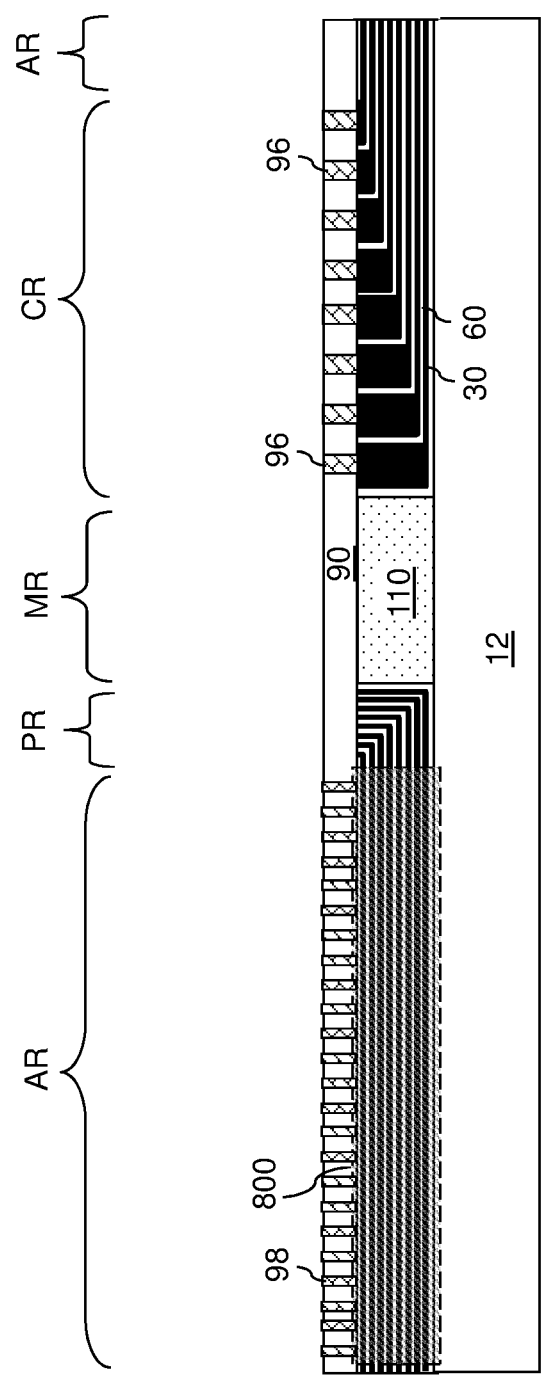
FIG. 9B is a vertical cross-sectional view of the first alternate embodiment of the exemplary structure of FIG. 9A along the vertical plane B-B'.
Figure 9D:
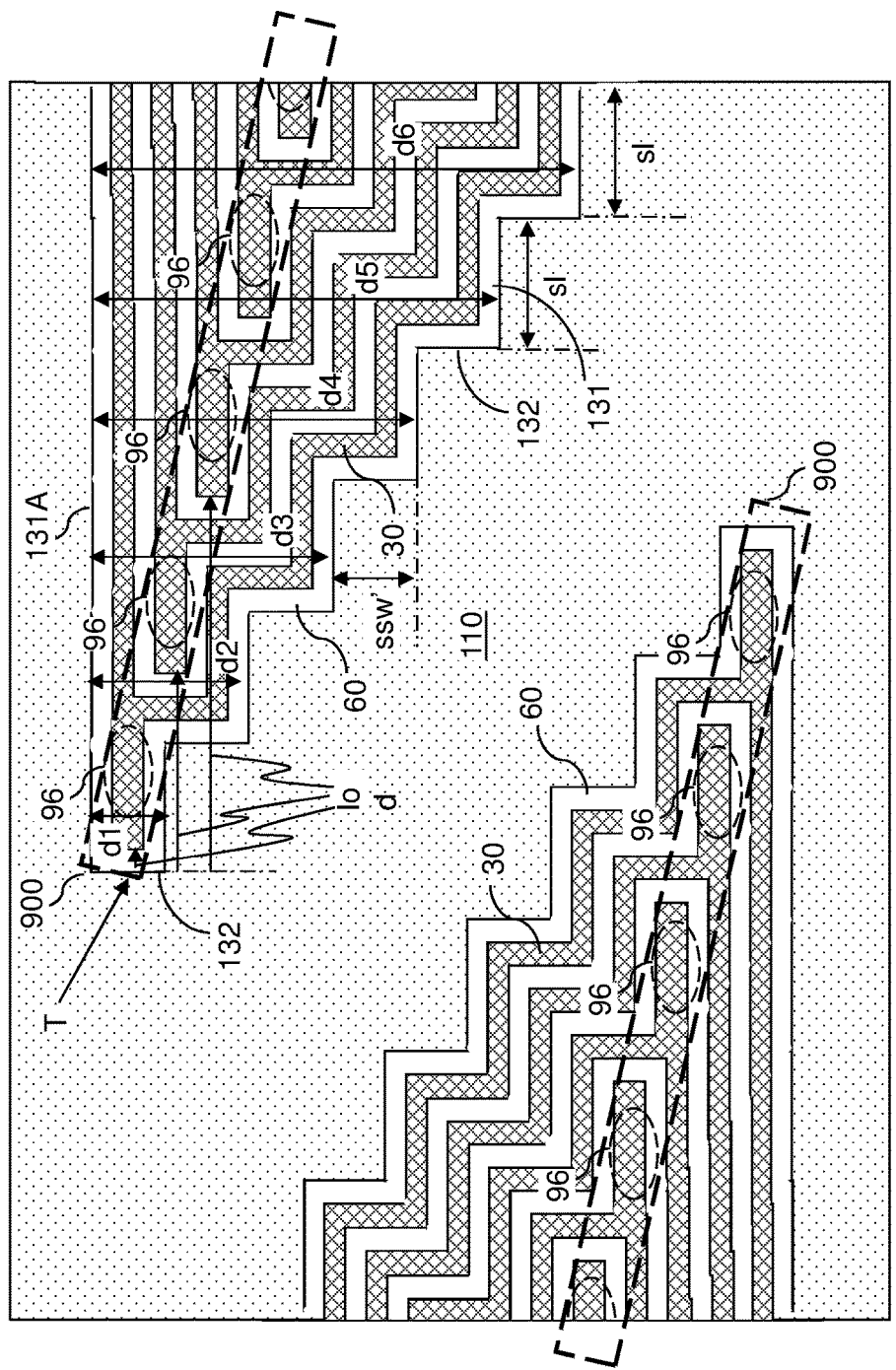
FIG. 9D is a top-down view of region D of the first alternate embodiment of the exemplary structure shown in FIG. 9A along the horizontal plane D-D' shown in FIG. 9C.
Figure 9E:
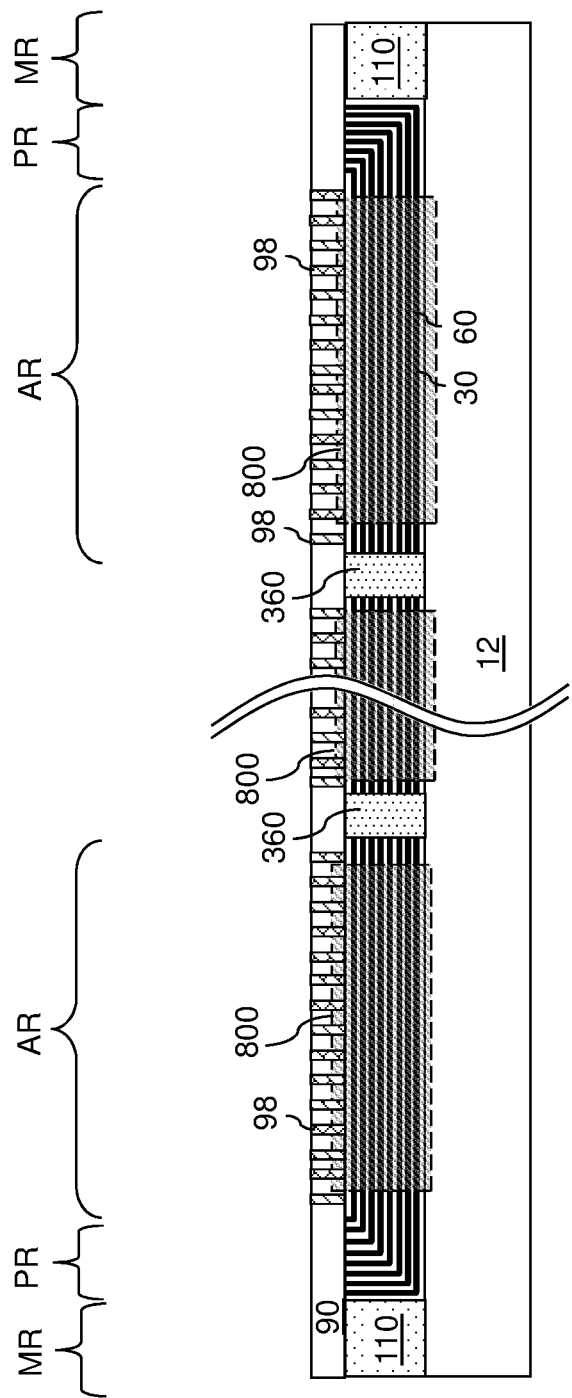
FIG. 9E is a vertical cross-sectional view of the first alternate embodiment of the exemplary structure of FIG. 9A along the vertical plane E-E'.

Referring to FIGS. 9A-9E, a first alternate embodiment of the exemplary structure is illustrated after formation of a contact level dielectric layer 90 and various contact via structures (96, 98). In the first alternate embodiment, at least one of the generally wedge-shaped region W can have one straight sidewall 131A on one side, and stepped sidewalls 131 on the opposite side, as shown in FIG. 9D. Thus, at least one of the generally wedge-shaped region W can be defined by a set of shorter first sidewalls 131 laterally extending along a first horizontal direction, a set of second sidewalls 132 laterally extending along a second horizontal direction and not including the tip T of the respective generally wedge-shaped region W, a second sidewall 132 that includes the tip T of the respective generally wedge-shaped region W, and a longer, straight sidewall 131A that is adjoined to the second sidewall 132 containing the tip T of the respective generally wedge-shaped region and extending along a direction parallel to the first sidewalls 131. The longer straight sidewall 131A can have a length that is the same as the sum of all lengths of the first sidewalls 131 of the generally wedge-shaped region W. Each of the second sidewalls 132 is adjoined to a vertical edge of at least one of the first sidewalls 131. Each second sidewall 132 that does not contain the tip T is adjoined to vertical edges of a respective pair of first sidewalls 131.

Each of the first sidewalls 131 can have the same length as the first sidewalls 131 illustrated in FIG. 2B. In other words, each of the first sidewalls 131 can have a step length sl. The second sidewall 132 that includes the tip T of the generally wedge-shaped region W can have the same width as the second sidewall 132 including the tip T as shown in FIG. 2B. Each second sidewall 132 that does not include a tip T as illustrated in FIG. 9D has twice the length of the second sidewalls 132 that do not include a tip T as shown in FIG. 2B. Thus, the various lateral separation distances di can be the same as the lateral separation distances d1 shown in FIG. 2B. The range of the length ssw' of each second sidewall 132 other than the second sidewall 132 containing the tip T is given by:

$$2(t1+t2) + \left\{ \frac{(\alpha-\beta)t2}{(N-1)} \right\} \leq ssw' \leq 2(t1+t2) + \left\{ \frac{(2-\alpha)t2}{(N-1)} \right\}.$$

Thus, the length ssw' of each second sidewall 132 other than the second sidewall 132 including the tip T can be substantially the same as twice the sum of the first thickness t1 and the second thickness t2.

In the configuration shown in FIGS. 9A-9E, the lateral protrusion direction lpd is different from the lengthwise direction of the first sidewalls 131. The angle between the lateral protrusion direction lpd and the direction of the first sidewalls 132 is given by the arctangent of the ratio of the length of a second sidewall 132 not including a tip T to the length of a first sidewall, i.e., $\tan^{-1}(ssw'/sl)$. In one embodiment, the ratio of ssw' to sl can be less than 1, and can be in a range from 0.05 to 1, such as from 0.10 to 0.5, although lesser and greater ranges can also be employed.

Each of the first sidewalls 131 and the second sidewalls 132 vertically extends from the top surface of the dielectric matrix layer 110 to the bottom surface of the dielectric matrix layer 110. In one embodiment, the first sidewalls 131 can be at an angle in a range from 5 degrees to 45 degrees with respect to the lateral protrusion direction lpd. The second sidewalls 132 can be are perpendicular to the first sidewalls 131.

Figure 10:
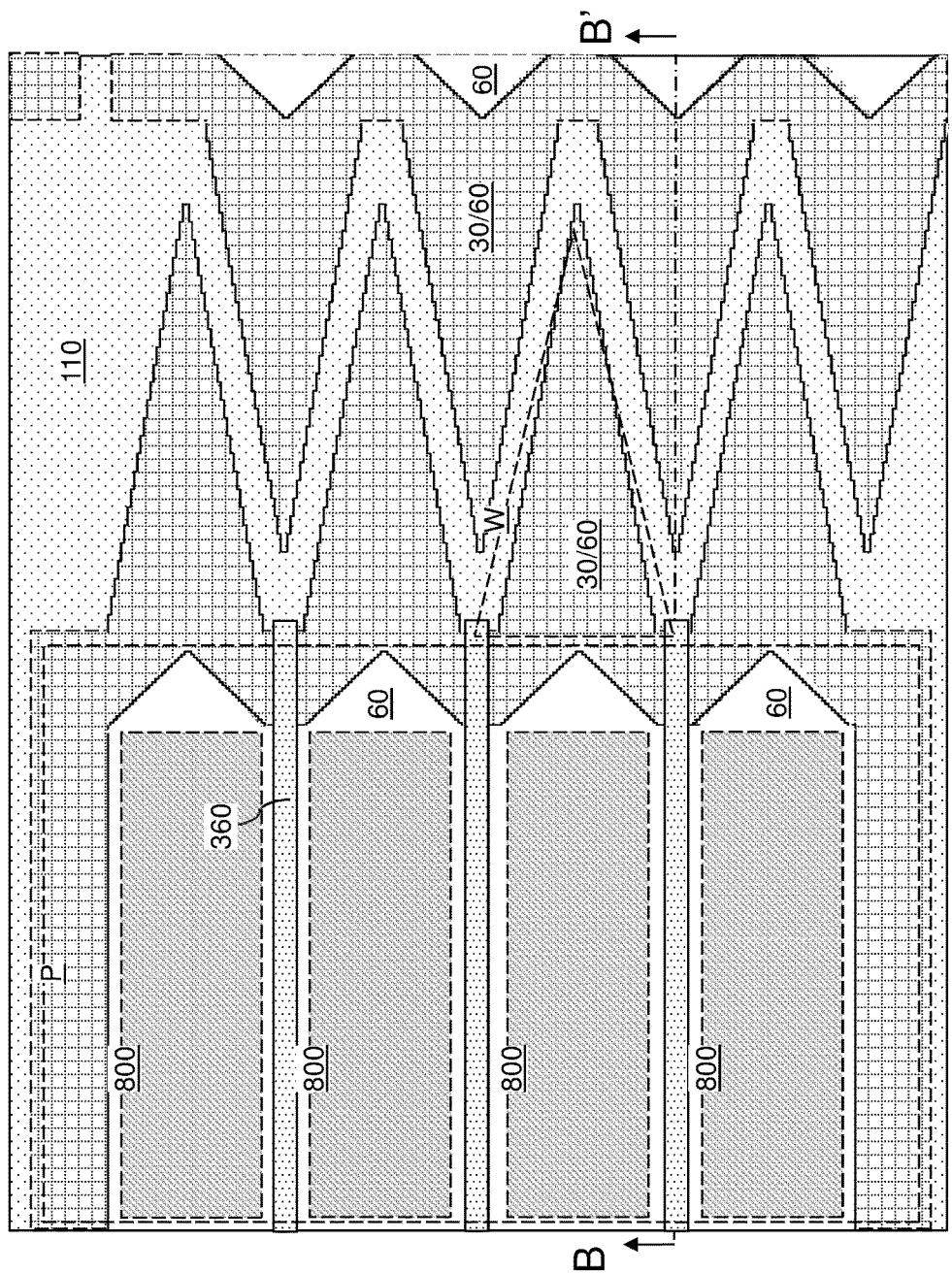
FIG. 10 is a top-down view of a second alternate embodiment of the exemplary structure after formation of a contact level dielectric layer and various contact via structures according to an embodiment of the present disclosure.
Figure 11A:
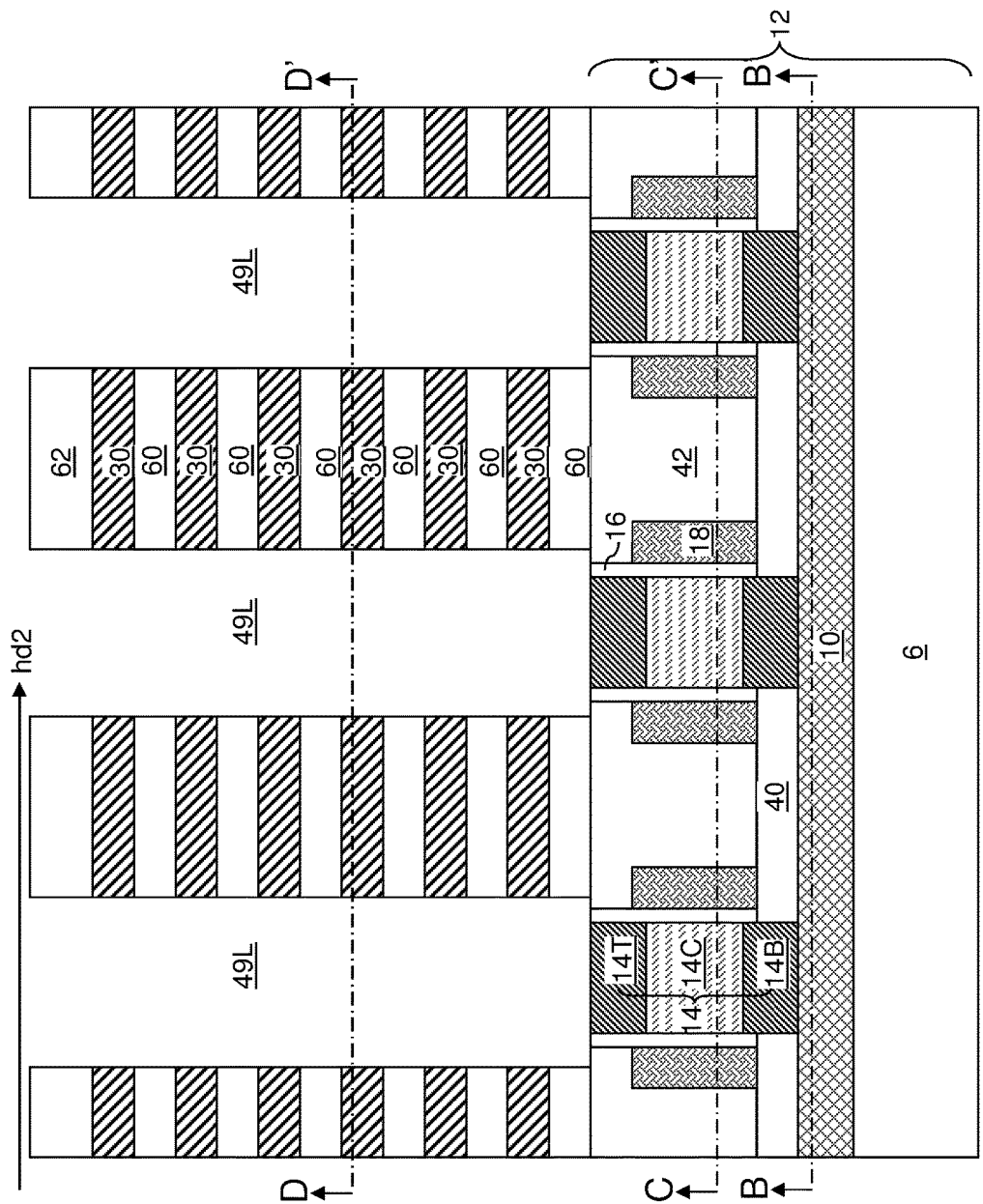
FIG. 11A is a vertical cross-sectional view of a primary region of the exemplary structure in a first configuration for forming a resistive random access memory (ReRAM) device upon forming line trenches through the alternating stack of insulating layers and electrically conductive layers after the processing steps of FIGS. 6A-6C.
Figure 11B:
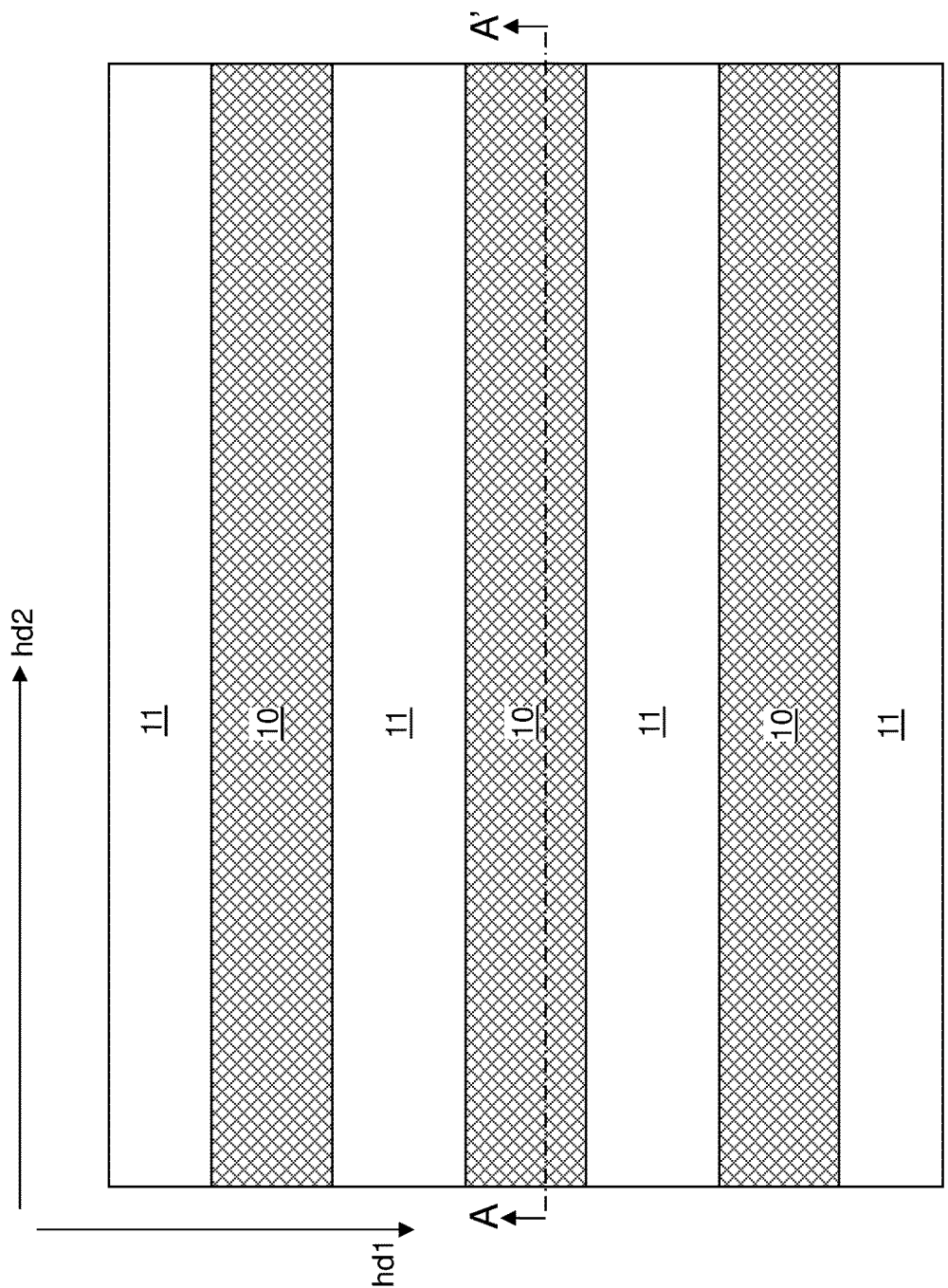
FIG. 11B is a horizontal cross-sectional view of the primary region of the exemplary structure of FIG. 11A along the horizontal plane B-B' of FIG. 11A.
Figure 11D:
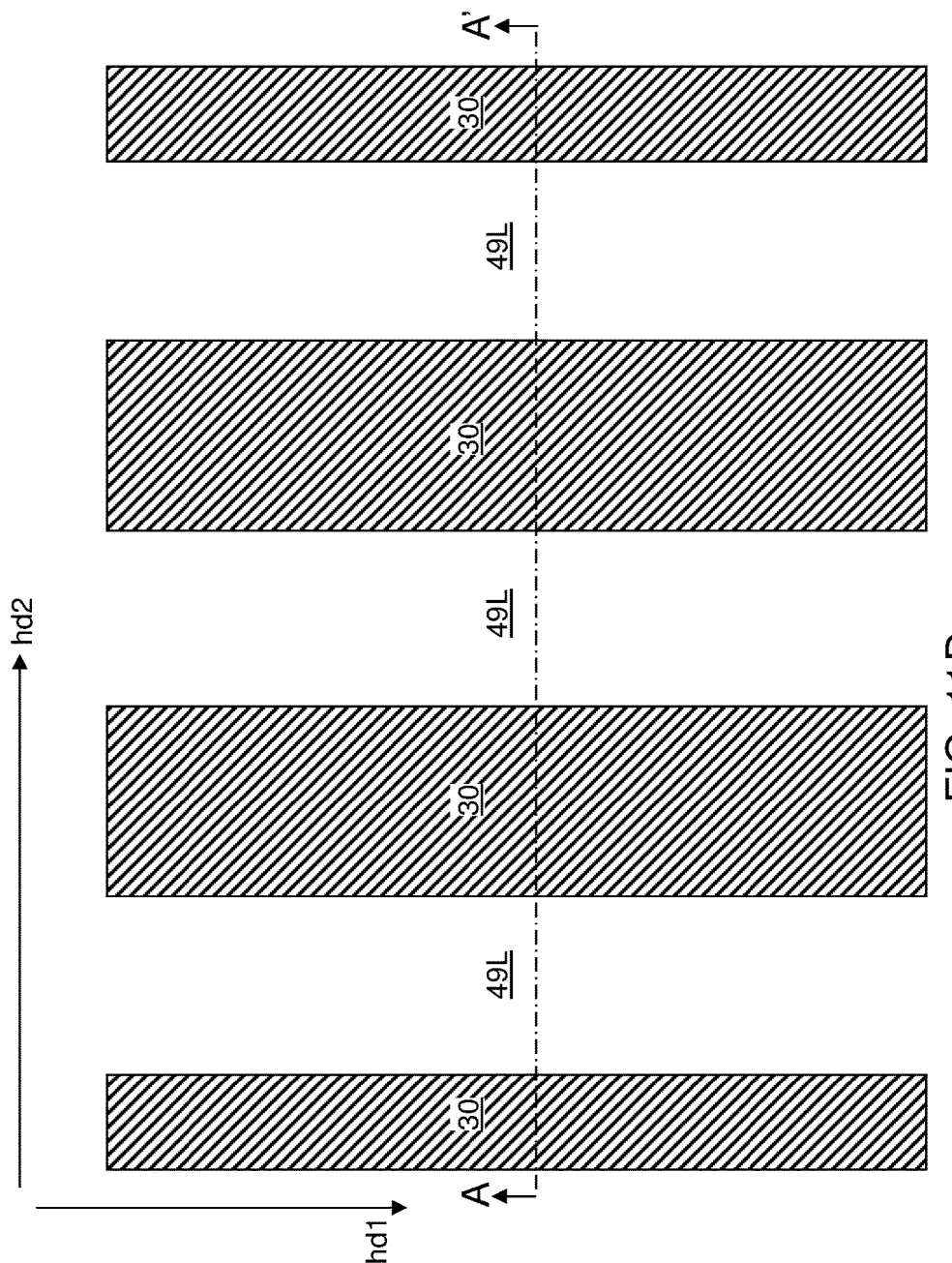
FIG. 11D is a horizontal cross-sectional view of the primary region of the exemplary structure of FIG. 11A along the horizontal plane D-D' of FIG. 11A.

While an alternating stack (60, 30) including 9 insulating layers 60 and 8 electrically conductive layers 30 is employed in illustrations for the above described embodiments, it is understood that the number of repetitions within the alternating stack (60, 30) can be altered, for example, between 2 and 128. Referring to FIG. 10, a second alternate embodiment of the exemplary structure is illustrated after formation of a contact level dielectric layer 90 and various contact via structures (96, 98). The second alternate embodiment illustrates a case in which the alternating stack (60, 30) includes 16 repetitions of a pair of layers including an insulating layer 60 and an electrically conductive layer 30. The geometry for the cavities 111 can be optimized accordingly.

The exemplary structures of the present disclosure includes a device structure, which includes a dielectric matrix layer 110 located over a supporting structure 12 and having a cavity 111 therein. The cavity 111 has a primary region P which can include a geometrical center GC of the cavity 111 and a generally wedge-shaped region W that laterally protrudes from the primary region P along a lateral protrusion direction lpd. The stepped sidewalls (131, 132) of the generally wedge-shaped region W provide a greater width (such as the N-th lateral separation distance dN) near the primary region than at a tip T of the generally wedge-shaped region W (which has the first lateral separation distance d1).

The device structure further includes an alternating stack (60, 30) of insulating layers 60 and electrically conductive layers 30 located in the cavity 111. The device structure includes contact via structures 96 contacting a top surface of a tip portion TP of a respective one of the electrically conductive layers 30. A tip portion TP of each electrically conductive layer 30 within the alternating stack (60, 30) is laterally offset from the tip T of the generally wedge-shaped region W by a respective lateral offset distance lod that differ among one another.

The stepped sidewalls (131, 132) of the generally wedge-shaped region W comprise: first sidewalls 131 laterally extending along a first horizontal direction; and second sidewalls 132 laterally extending along a second horizontal direction. Each of the second sidewalls 132 is adjoined to a vertical edge of at least one of the first sidewalls 131. In one embodiment, each of the first sidewalls 131 and the second sidewalls 132 vertically extends from a top surface of the dielectric matrix layer 110 to a bottom surface of the dielectric matrix layer 110.

In one embodiment, the first sidewalls 131 are parallel to the lateral protrusion direction lpd, and the second sidewalls 132 are perpendicular to the lateral protrusion direction. Alternatively, the first sidewalls 131 are at an angle in a range from 5 degrees to 45 degrees with respect to the lateral protrusion direction lpd, and the second sidewalls 132 are perpendicular to the first sidewalls 132.

In one embodiment, the tip portion TP of each electrically conductive layer 30 within the alternating stack (60, 30) has a width wi that is greater than a thickness (i.e., the second thickness t2) of a horizontal portion of the electrically conductive layer 30 within the primary region P as measured along a vertical direction, and is less than twice the thickness of the horizontal portion of the electrically conductive layer 30 within the primary region P as measured along the vertical direction.

In one embodiment, each layer within the alternating stack (60, 30) has a topmost surface within a horizontal plane including a top surface of the dielectric matrix layer 110. In one embodiment, vertically extending portions of each electrically conductive layer 30 (such as the vertical portions of the electrically conductive layer 30 in a peripheral region PR) has a width that is the same as the thickness (i.e., the second thickness t2) of the horizontal portion of the electrically conductive layer 30 (located, for example, within the array region AR) within the primary region P outside of the tip portion TP (which is located within the generally wedge-shaped region W).

A three-dimensional array 800 of memory elements can be embedded within the primary region P of the alternating stack (60, 30). Each of the electrically conductive layers 30 can be a word line configured to access a subset of the memory elements located at a respective level.

Referring to FIGS. 11A-11D, a first exemplary device structure that can be incorporated into the structures of the present disclosure (such as the exemplary structures of FIGS. 8A-8E, 9A-9E, and 10) is illustrated. The first exemplary device structure can be employed for forming a resistive random access memory device. The first exemplary device structure illustrated in FIGS. 11A-11D is an in-process ReRAM device. As used herein, a "prototype" structure or an "in-process" structure refers to a transient structure that is subsequently modified in the shape or composition of at least one component therein.

The first exemplary device structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, an electrically conductive layer, or an insulating material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 6. The global bit lines 10 are parallel electrically conductive lines that are laterally spaced apart in a first horizontal direction hd1, and extending in a second horizontal direction hd2. The global bit lines 10 can be formed, for example, by depositing at least one electrically conductive layer, and patterning the at least one electrically conductive layer employing a combination of lithographic methods and an anisotropic etch. The at least one electrically conductive layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one electrically conductive layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 11. Each global bit lines 10 and each separator dielectric material portions 11 can extend along the second horizontal direction hd2. A one-dimensional array of the global bit lines 10 and the separator dielectric material portions 11 can extend along the first horizontal direction hd2 with a periodicity that is equal to the sum of the width of a global bit line 10 and the width of a separator dielectric material portion 11. Alternatively, the one-dimensional array of the global bit lines 10 and the separator dielectric material portions 11 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to as access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first doped semiconductor layer. The semiconductor layer stack 14 is patterned employing a combination of lithographic methods and an anisotropic etch such that each patterned portion of the semiconductor layer stack 14 overlies an area of a respective global bit line 10 and is laterally spaced from one another by trenches extending along the second horizontal direction hd2. Subsequently, a dielectric material (such as silicon nitride and/or silicon oxide) is deposited in the trenches and planarized to remove the dielectric material from above rails of the semiconductor layer stack 14 that extend along the second horizontal direction hd2. The remaining portions of the semiconductor layer stack 14 and the planarized dielectric material portions constitute alternating rail structures in which rails of semiconductor layer stack 14 and rails of the planarized dielectric material extend along the second horizontal direction hd2 and alternate along the first horizontal direction hd1.

The remaining portions of the semiconductor layer stack 14 and the planarized dielectric material portions are patterned to form trenches that extend along the first horizontal direction hd1. Each patterned portion of the semiconductor layer stack 14 includes a vertical stack of a bottom active region 14B, a semiconductor channel 14C, and a top active region 14T. Each patterned portion of the dielectric material constitutes a dielectric pillar structure 27, which can be located between a pair of vertical stacks of a bottom active region 14B, a semiconductor channel 14C, and a top active region 14T that are spaced from each other along the first horizontal direction hd1. Each alternating sequence of dielectric pillar structures 27 and vertical stacks of a bottom active region 14B, a semiconductor channel 14C, and a top active region 14T that extend along the first horizontal direction hd1 forms a composite rail structure (14B, 14C, 14T, 27). The composite rail structures (14B, 14C, 14T, 27) are laterally spaced from one another along the second horizontal direction hd2. Top surfaces of the global bit lines 10 and the separator dielectric portions 11 can be physically exposed at the bottom of each trench that laterally extends along the first horizontal direction hd1.

A spacer dielectric layer 40 can be formed at the bottom the trenches by depositing a self-planarizing dielectric material (such as spin-on glass) or by filling the trenches with a dielectric material (such as organosilicate glass), planarizing the deposited dielectric material, and recessing the dielectric material selective to the dielectric pillar structures 27 and the vertical stacks of the bottom active regions 14B, the semiconductor channels 14C, and the top active regions 14T. Each spacer dielectric layer 40 can be formed over of the global bit lines 10 and the separator dielectric material portions 11 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer.

The gate dielectrics 16 and the gate electrodes 18 of the access transistors can be subsequently formed, for example, by depositing a conformal gate dielectric layer (e.g., silicon oxide) and a conformal electrically conductive layer (e.g., heavily or degenerately doped polysilicon) in the trenches that separate the one-dimensional array of rail structures, and by anisotropically etching the conformal electrically conductive layer. The remaining vertical portions of the conformal electrically conductive layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the trenches are filled with at least one dielectric material. Excess portions of the at least one dielectric material can be removed from above the horizontal plane including the top surfaces of the rail structures (which include contiguous portions of the semiconductor layer stack 14 and the dielectric pillar structures 27 that are present between a pair of trenches) by a planarization process, which can employ, for example, chemical mechanical planarization. Each remaining portion of the deposited dielectric material in the trenches constitutes a dielectric rail structure 42.

Each dielectric rail structure 42 extends along the first horizontal direction hd1 parallel to the composite rail structures (14B, 14C, 14T, 27). Each composite rail structure (14B, 14C, 14T, 27) includes remaining portions of the semiconductor layer stack 14 and the dielectric pillar structures 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the substrate 6. In one embodiment, each dielectric rail structure 42 can include at least one dielectric material such as silicon nitride and/or silicon oxide. The dielectric rail structures 42 and the composite rail structures (14T, 14C, 14B, 27) alternate along the second horizontal direction hd2.

The set of all structures between the bottom surface of the substrate 6 and the top surfaces of the dielectric rail structures 42 and the composite rail structures (14T, 14C, 14B, 27) collectively constitutes a supporting structure 12, which can be the supporting structure 12 shown in FIG. 1.

The dielectric matrix layer 110 is formed and patterned over the supporting structure 12 as described above. Subsequently, the processing steps of FIGS. 3A-3D are performed. Specifically, an alternating stack of electrically conductive layers 30 and insulating layers 60 can be formed over the one dimensional array of the dielectric rail structures 42 and the composite rail structures (14B, 14C, 14T, 27). FIGS. 11A-11D illustrate a portion of the array region AR, and thus, the dielectric matrix layer 110 is not shown in FIGS. 11A-11D. An insulating cap layer 62 can be formed over the alternating stack. In one embodiment, the insulating cap layer 62 can include a dielectric material that is different from the dielectric material of the insulating layers 60. For example, the insulating layers 60 can include undoped silicate glass (e.g., silicon oxide) or doped silicate glass, and the insulating cap layer 62 can include silicon nitride or a dielectric metal oxide.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the processing steps of 4A-4B, 5A-5D, and 6A-6C can be performed. At the processing steps of FIGS. 7A-7C, the insulating cap layer 62 and the alternating stack of the electrically conductive layers 30 and the insulating layers 60 can be patterned to form line trenches 49L that extend along the first horizontal direction hd1. Each line trench 49L can overlie the area of a respective composite rail structure (14B, 14C, 14T, 27). Each continuous set of remaining portions of the electrically conductive layers 30 and the insulating layers 60 between a pair of line trenches 49L constitutes an alternating stack (30, 60) that is a rail structure. Each alternating stack (30, 60) overlies a respective dielectric rail structure 42, extends along the first horizontal direction hd1, and is laterally spaced apart from other alternating stacks (30, 60) along the second horizontal direction hd2. Each patterned electrically conductive layer 30 can constitute a word line of a resistive random access memory device. In one embodiment, each alternating stack (30, 60) can have a lesser width along the second horizontal direction hd2 than the underlying dielectric rail structure 42, and can be entirety within the area of the underlying dielectric rail structure 42.

In one embodiment, the electrically conductive layers 30 comprise a first electrically conductive material. In one embodiment, the first electrically conductive material can include an elemental metal, an intermetallic alloy, and/or a conductive metal nitride.

The thickness of the electrically conductive layers 30 and the insulating layers 60 can be the same as described above, although lesser and greater thicknesses can also be employed. The thickness of the insulating cap layer 62 can be in a range from 5 nm to 300 nm, although lesser and greater thicknesses can also be employed.

A pair of a electrically conductive layer 30 and an insulating layer 60 can constitute a unit of repetition in the alternating stack (30, 60) of the electrically conductive layers 30 and the insulating layers 60. The total number of repetitions can be in a range from 8 to 1,024, although lesser and greater number of repetitions can also be employed. Thus, a plurality of alternating stacks (30, 60) of insulating layers 60 and electrically conductive layers 30 is formed over a substrate 6. Each of the insulating layers 60 and the electrically conductive layers 30 extends along the first horizontal direction (i.e., the word line direction) hd1. The alternating stacks (30, 60) are laterally spaced from one another along the second horizontal direction hd2 (i.e., the global bit line direction).

Figure 12A:
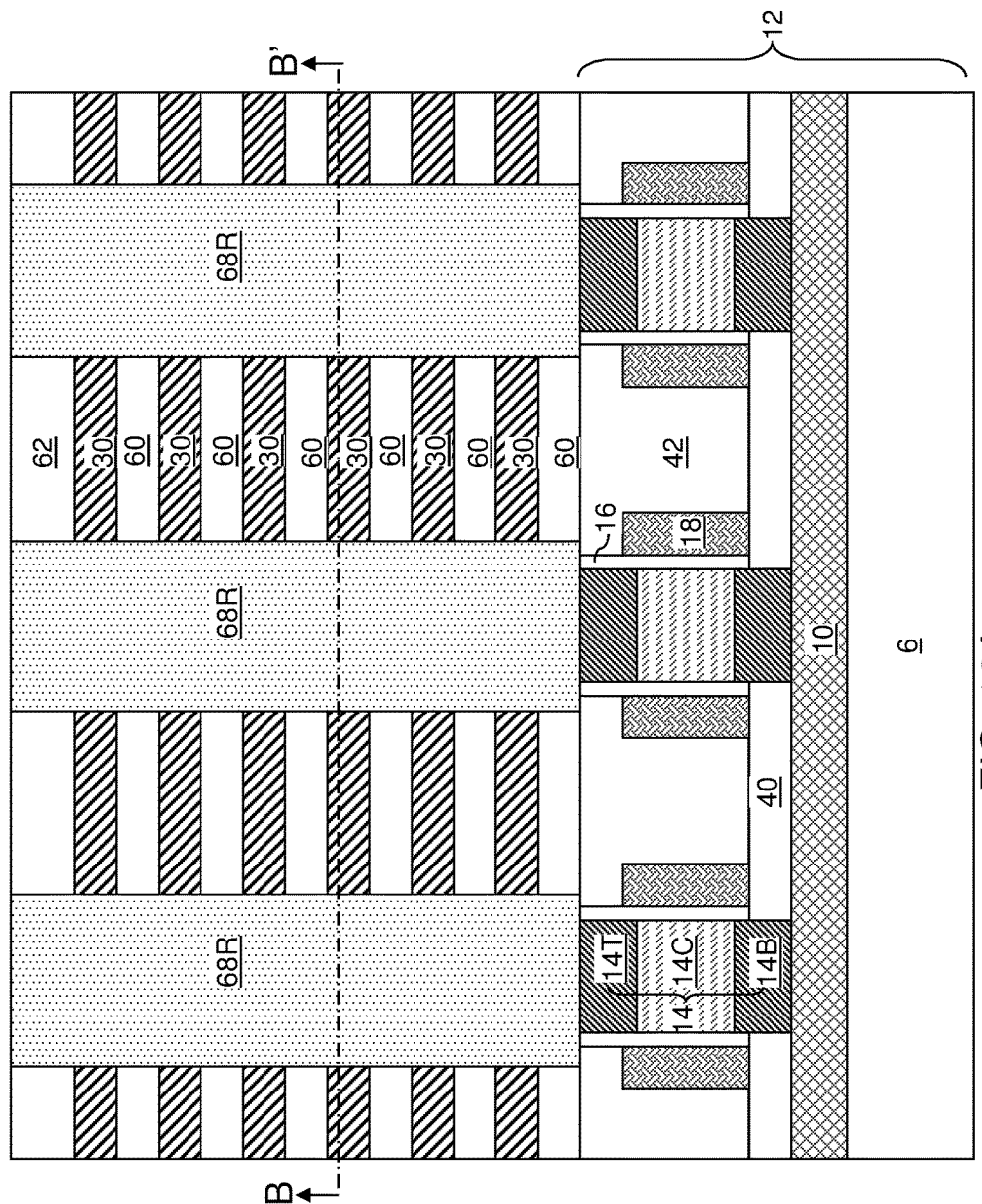
FIG. 12A is a vertical cross-sectional view of the primary region of the exemplary structure in the first configuration after formation of separator rail structures.

Referring to FIGS. 12A and 12B, a dielectric material is deposited to fill the line trenches 49L. The dielectric material can be removed from above a horizontal plane including the top surfaces of the insulating cap layers 62. Each remaining portion of the dielectric material filling a line trench 49L constitutes a dielectric rail structure, which is herein referred to as separator rail structures 68R. Each separator rail structure 68R extends along the first horizontal direction hd1. The alternating stacks (30, 60) and the separator rail structures 68R can form a one-dimensional array that extends along the second horizontal direction hd2. In one embodiment, the alternating stacks (30, 60) and the separator rail structures 68R can have a periodicity that is equal to the sum of the width of an alternating stack (30, 60) and the width of a separator rail structure 68R. The separator rail structures 68R includes a dielectric material such as doped silicate glass, undoped silicate glass (e.g., silicon oxide), silicon nitride, organosilicate glass, or porous derivatives thereof. In an illustrative example, the insulating layers 60 can include undoped silicate glass or doped silicate glass, the insulating cap layer 62 can include silicon nitride or a dielectric metal oxide, and the separator rail structures 68R can include doped silicate glass, undoped silicate glass, or organosilicate glass.

Figure 13A:
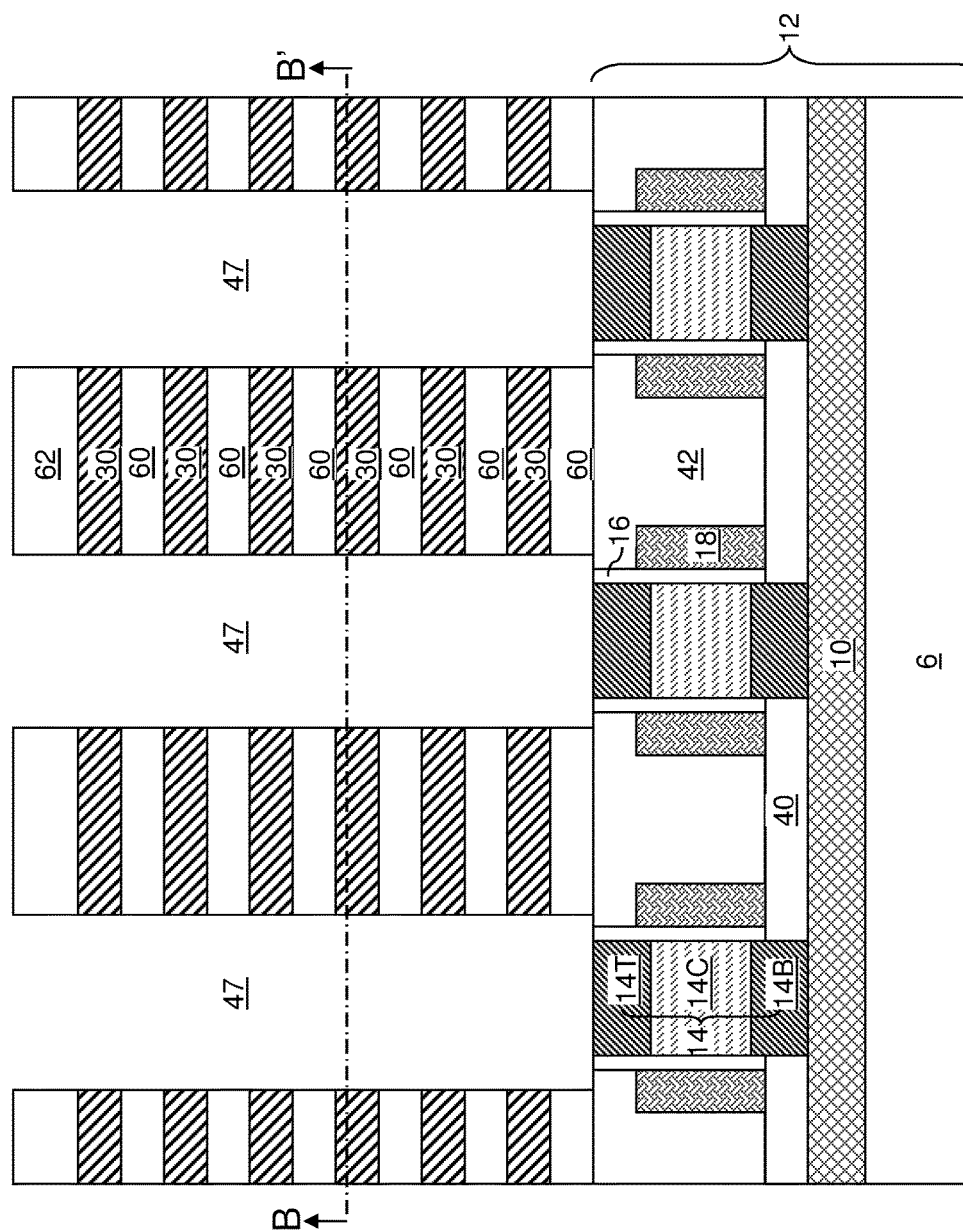
FIG. 13A is a vertical cross-sectional view of the primary region of the exemplary structure in the first configuration after formation of bit line cavities.
Figure 13B:
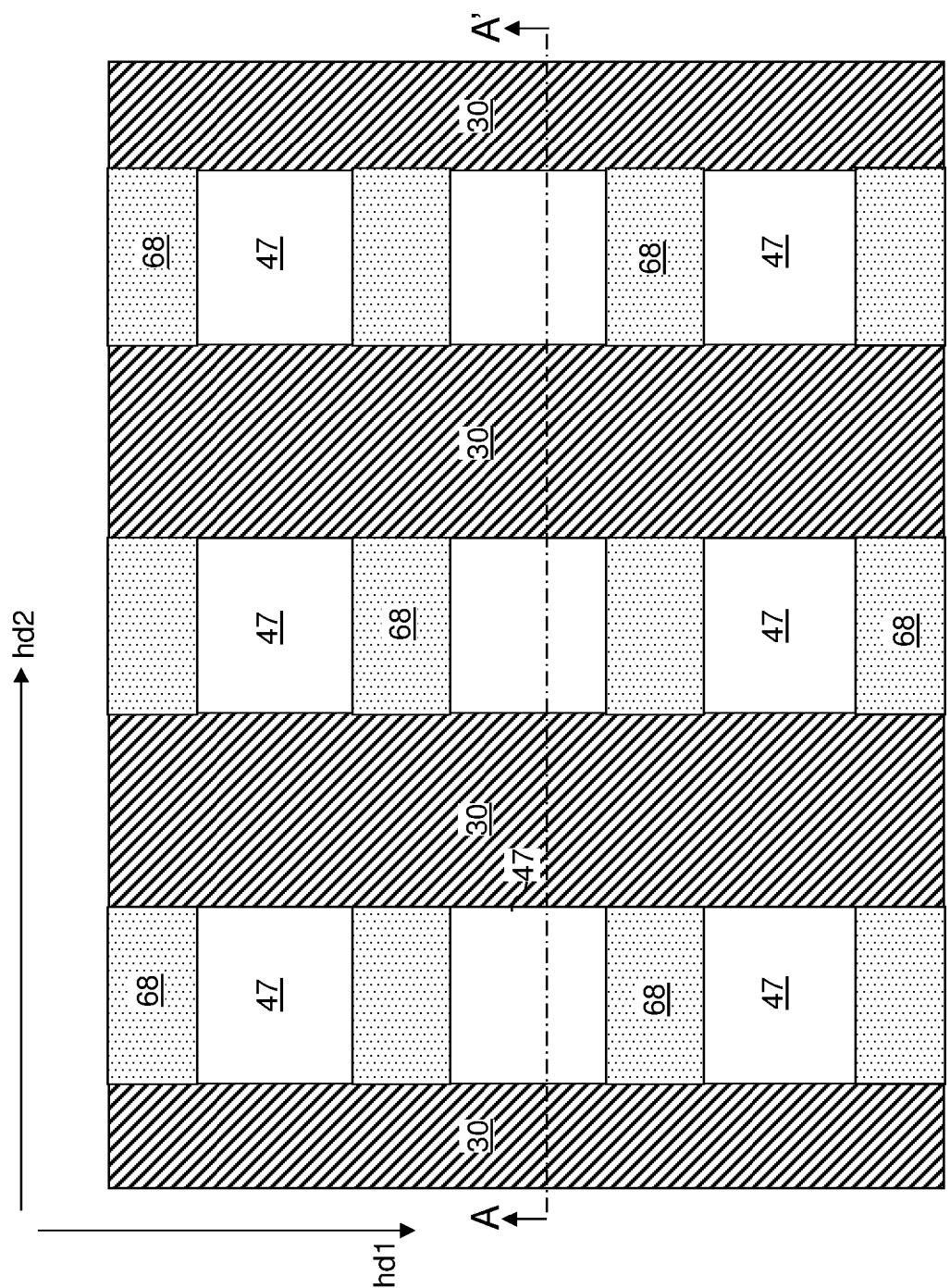
FIG. 13B is a horizontal cross-sectional view of the primary region of the exemplary structure of FIG. 13A along the horizontal plane B-B' of FIG. 13A.

Referring to FIGS. 13A and 13B, bit line cavities 47 can be formed by patterning the separator ail structures 68R into separator pillar structures 68. Specifically, a photoresist layer (not shown) can be applied over the insulating cap layer 62 and the separator rail structures 68R, and can be lithographically patterned to form linear portions that overlie areas of the separator dielectric material portions 12. Line trenches extending along the second horizontal direction hd2 and overlying areas of the global bit lines 10 are formed between remaining portions of the photoresist layer.

An anisotropic etch that removes the dielectric material of the separator rail structures 68R selective to the dielectric material of the insulating cap layer 62 can be performed to remove portions of the separator rail structures 68R that are not covered by a combination of the photoresist layer portions and insulating cap layer 62. Bit line cavities 47 having rectangular horizontal cross-sectional areas and extending through the alternating stacks (30, 60) to top surfaces of the top active regions 14T can be formed, thereby separating the separator rail structures 68R into separator pillar structures 68. The bit line cavities 47 can form a two-dimensional rectangular array. The separator pillar structures 68 can form another two-dimensional rectangular array having the same periodicity as the two-dimensional rectangular array of the bit line cavities 47.

While an embodiment in which the area of each bit line cavity 47 is greater than the area of an underlying top active region 14T, embodiments are expressly contemplated herein in which the area of each bit line cavity 47 is substantially the same as, or is less than, the area of an underlying top active region 14T. Further, the geometrical center of each bit line cavity 47 may be located on a vertical line passing through the geometrical center of an underlying vertical stack of a bottom active region 14B, a semiconductor channel 14C, and a top active region 14T, or may be laterally offset from the vertical line due to an overlay variation during the patterning processes employed to form pattern the alternating stacks (30, 60) and the separator pillar structures 68.

Figure 14A:
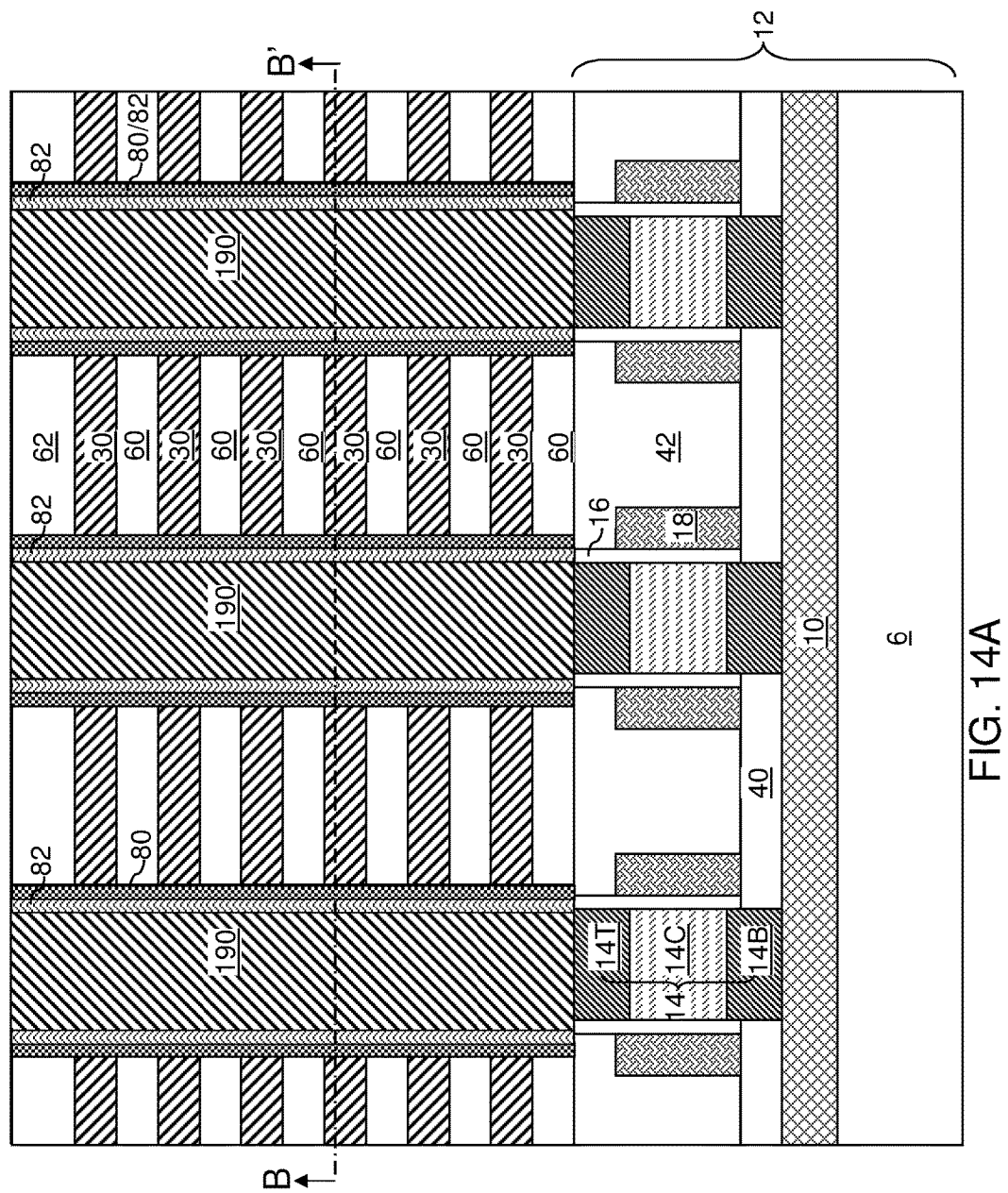
FIG. 14A is a vertical cross-sectional view of the primary region of the exemplary structure in the first configuration after formation of memory elements and vertical bit lines.
Figure 14B:
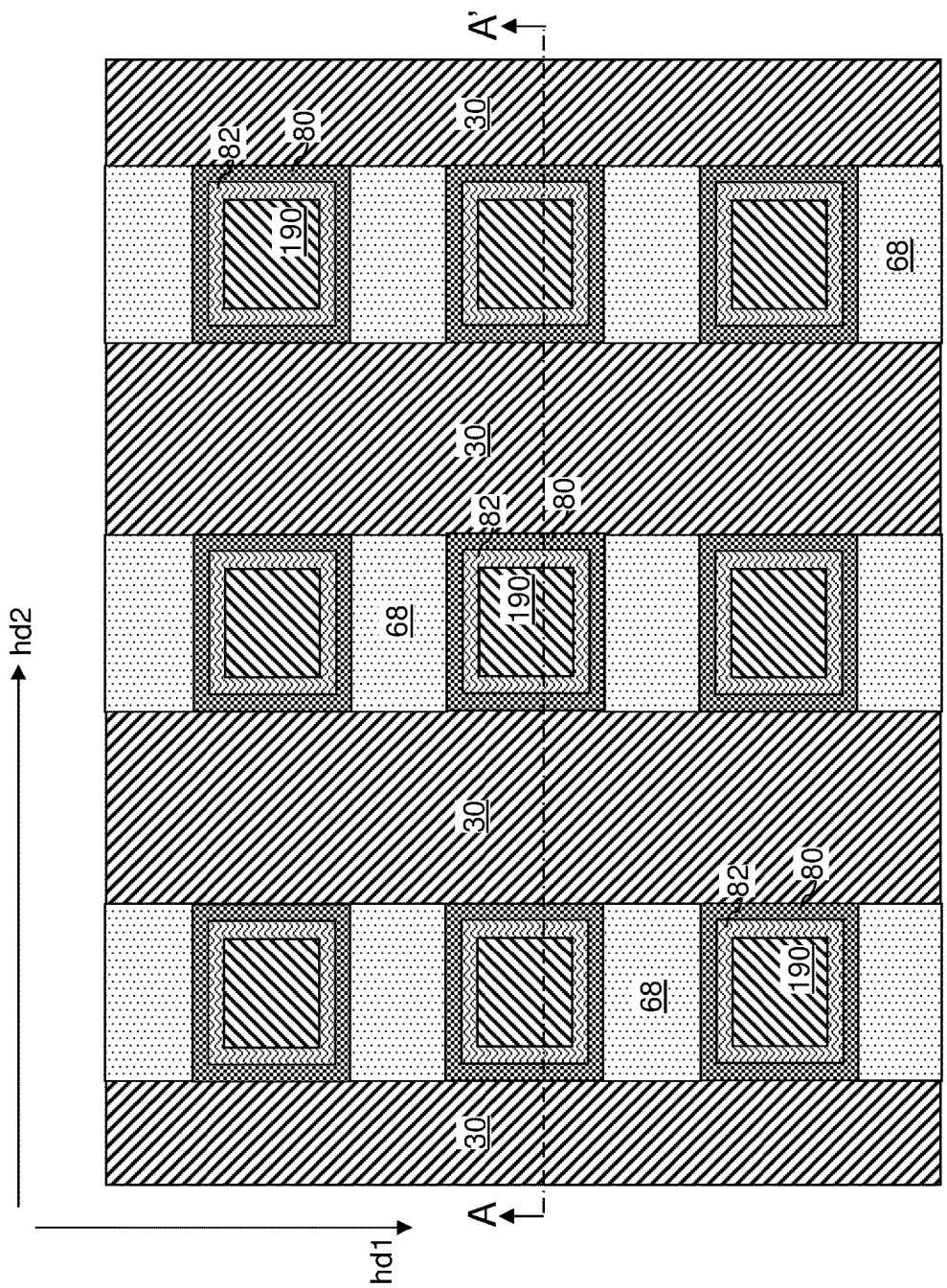
FIG. 14B is a horizontal cross-sectional view of the primary region of the exemplary structure of FIG. 14A along the horizontal plane B-B' of FIG. 14A.

Referring to FIGS. 14A and 14B, a resistive memory material layer 80 and a steering element layer 82 can be formed on each sidewall of the bit line cavities 47. For example, a continuous resistive memory material layer and a continuous steering element layer can be deposited as continuous layers, and can be anisotropically etched to remove horizontal portions thereof. Each remaining vertical portion of the continuous resistive memory material layer constitutes a resistive memory material layer 80, and each remaining vertical portion of the continuous steering element layer constitutes a steering element layer 82. Each resistive memory material layer 80 can be topologically homeomorphic to a torus, and each steering element layer 82 can be topologically homeomorphic to a torus. As used herein, an element is "topologically homeomorphic to a torus" if the element has a geometrical shape that can be continuously stretched to match a torus without creating or destroying a new hole.

Each resistive memory material layer 80 includes a layer or a layer stack that can provide regions of resistive memory elements. Each resistive memory element includes a resistive memory material. As used herein, a "resistive memory material" or a "reversibly resistance-switching material" is a material whose resistivity can be altered by application of an electrical bias voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance. The resistive memory material layer 80 may optionally include a charge carrier barrier layer or tunneling dielectric. As used herein, a "tunneling dielectric" refers to a dielectric material portion in which the predominant mode of electrical current conduction therethrough is charge carrier tunneling such as electron tunneling or hole tunneling. As used herein, a tunneling dielectric layer refers to a layer including at least one tunneling dielectric.

As used herein, a "steering element" refers to an element, such as a diode, that provides a non-linear current-voltage characteristic for electrical current passing therethrough. In one embodiment, the steering element may have an asymmetric current-voltage characteristic (e.g., a diode which conducts current primarily in one direction (asymmetric conductance) and which has a lower resistance to the flow of current in one direction, and a higher resistance in the other direction). As used herein, a "steering element layer" refers to a layer including at least one steering element.

The materials that can be employed for the resistive memory material layers 80 depend on the nature of the resist memory elements therein. Specific configurations of the resistive memory elements of the present disclosure are described in separate sections below.

A charge carrier barrier layer, if employed, may comprise a semiconductor material layer, such as an amorphous silicon or polysilicon layer. A tunneling dielectric layer, if employed as a sub-element within a resistive memory material layer 80, can include a dielectric material through which electron tunneling or hole tunneling can occur. In one embodiment, the tunneling dielectric layer includes a dielectric material having a dielectric constant of at least 7.0. For example, the tunneling dielectric layer can include a dielectric material selected from silicon nitride and aluminum oxide. In one embodiment, the thickness of the tunneling dielectric layer can be in a range from 0.6 nm to 4 nm (such as from 1.0 nm to 3 nm), although lesser and greater thicknesses can also be employed.

The steering element layer 82 is optional. Thus, depending on the configuration of specific resistive random access memory, the steering element layer 82 may, or may not, be present. Generally speaking, steering elements known in the art can be optionally employed in conjunction with the resistive memory material layers 80 of the present disclosure.

The steering element layers 82, if employed, can include at least one semiconductor element that provides a non-linear current-voltage characteristic. For example, the steering element layer can include at least one diode therein. In one embodiment, each diode can include a heavily doped n-doped semiconductor region (i.e., n+ region) having n-type dopants at an atomic concentration greater than $5.0 \times 10^{19}/cm^3$, and a lightly or lighter doped p-doped semiconductor region (i.e., p− or p region) including p-type dopants at an atomic concentration less than $5.0 \times 10^{19}/cm^3$. Alternatively, a heavily doped p-doped semiconductor region may be used instead. In one embodiment, the n-doped semiconductor regions can be embodied as discrete n-doped semiconductor material portions. In another embodiment, the n-doped semiconductor regions can be embodied as portions of a continuous n-doped semiconductor material layer. In one embodiment, each n-doped semiconductor region can be incorporated as a portion of a local bit line or electrode. In an alternative embodiment, a p-i-n diode, a Schottky diode or a metal-insulator-metal (MIM) non-linear device is used instead of a p-n diode.

While the present disclosure is described employing an embodiment in which the materials of the resistive memory material layers 80 are deposited first, and the materials of the steering element layers 82 are subsequently deposited, embodiments are expressly contemplated herein in which the order of deposition of the materials is reversed. In this case, outer sidewalls of the steering element layers 82 can contact sidewalls of the alternating stacks (30, 60) and sidewalls of the separator pillar structures 68, and inner sidewalls of the steering element layers 82 can contact outer sidewalls of the resistive memory material layers 80.

At least one conductive material is deposited in each remaining volume of the bit line cavities 47 to form vertical bit lines 190 (e.g., local bit lines). The at least one conductive material can include an elemental metal (e.g., tungsten, titanium, etc.), an intermetallic alloy, a conductive doped semiconductor material, and/or a conductive compound including at least one metal and at least one non-metal element such as a conductive metal nitride (e.g., TiN). Excess portions of the at least one conductive material can be removed from above the top surface of the insulating cap layer 62, for example, by a planarization process (such as chemical mechanical planarization and/or a recess etch).

The electrically conductive layers 30 and the global bit lines 10, and optionally, the vertical bit lines 190 can be suitably electrically wired for operation as a resistive random access memory device.

Subsequently, the processing steps of FIGS. 8A-8E can be performed to form a contact level dielectric layer 90 and various contact via structures (96, 98). In this case, the array contact via structures 96 can be formed directly on the top surfaces of the vertical bit lines 190. Specifically, each vertical bit line 190 can be contacted by a respective array contact via structure 98.

Figure 15:
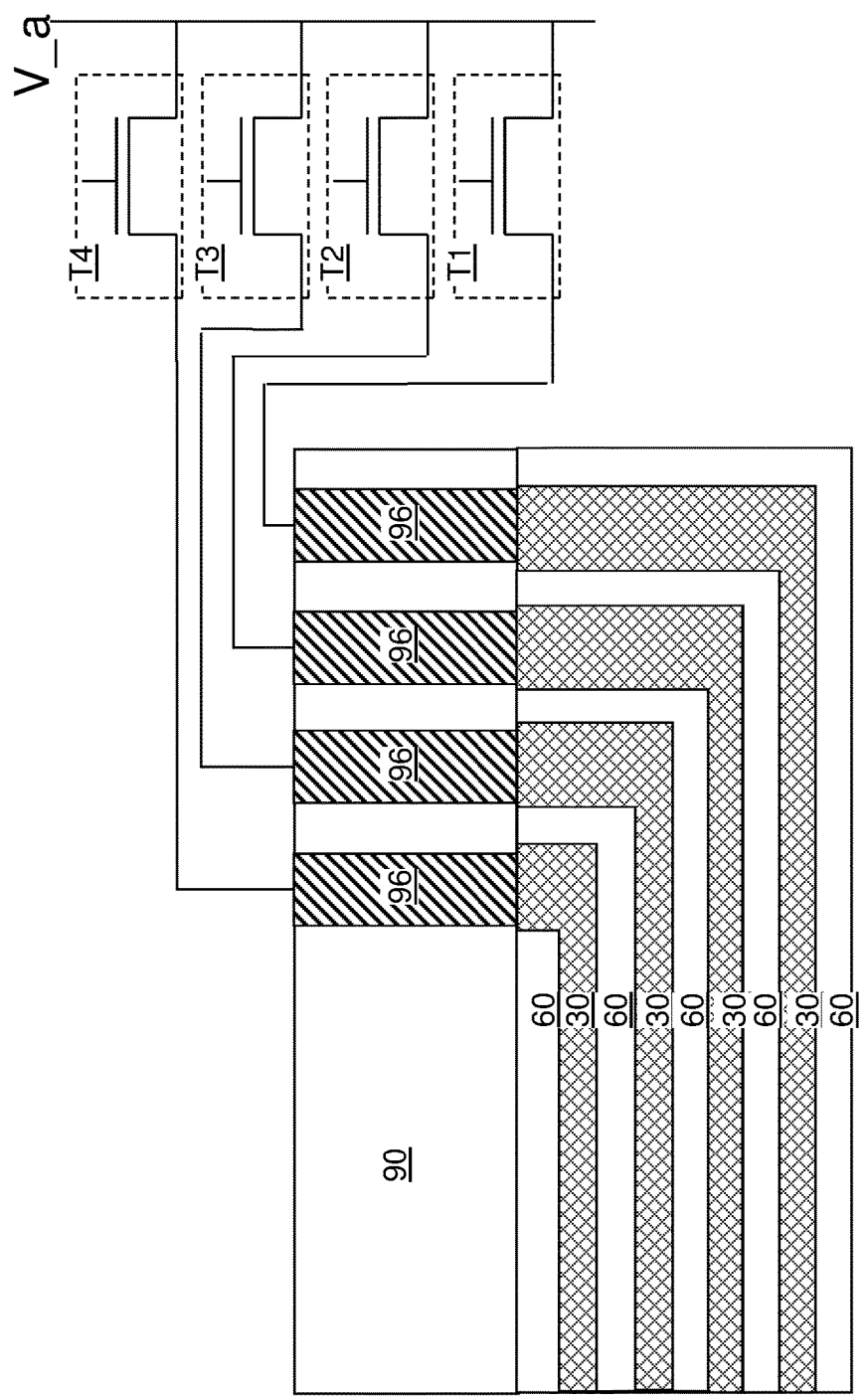
FIG. 15 illustrates electrical connection of the electrically conductive layers in the exemplary structure after formation of word line contact via structures.

FIG. 15 schematically illustrates the function of the word line contact via structures 96. The word line contact via structures 96 are portions of metal interconnect structures that provide electrical contact between each of the electrically conductive layers 30 as word lines to respective field effect transistors (T1, T2, T3, T4) that control application of at least one electrical bias voltage V_a to each of the electrically conductive layers 30.

Incorporation of the first exemplary device structure into any of the exemplary structures of FIGS. 8A-8E, 9A-9E, and 10 provides a three-dimensional resistive memory device. In this example, the local bit lines 190 vertically extend through the primary region P of the alternating stack (60, 30), and resistive memory elements are formed at each overlap region between the electrically conductive layers 30 and the local bit lines 190. The resistive memory elements can comprise a resistive memory material selected from a filament-forming dielectric material providing a reduced resistivity upon formation of conductive filaments therein and an electrically conductive metal oxide (e.g., titanium oxide) that exhibits bulk electrical conduction (i.e., conductivity) by an oxygen vacancy mechanism (e.g., barrier modulated cell (BMC) type memory elements).

Figure 16:
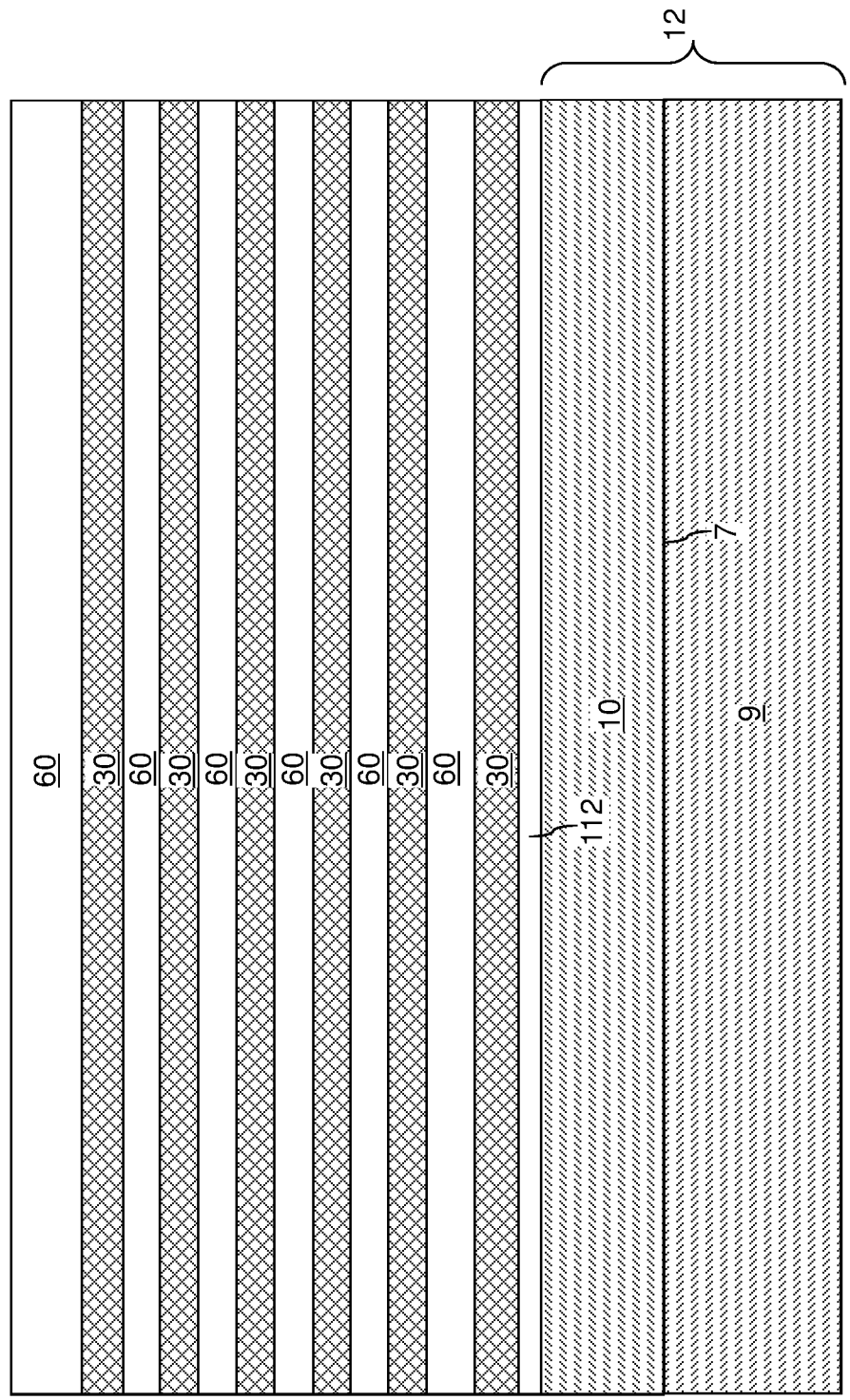
FIG. 16 is a vertical cross-sectional view of a primary region of the exemplary structure in a second configuration for forming a three dimensional NAND memory device after completion of the processing steps of FIGS. 6A-6C and before the processing steps of FIGS. 8A-8E.

Referring to FIG. 16, a second exemplary device structure that can be incorporated into the structures of the present disclosure (such as the exemplary structures of FIGS. 8A-8E, 9A-9E, and 10) is illustrated. The second exemplary device structure can be employed for forming a NAND memory device. The second exemplary device structure illustrated in FIG. 16 is an in-process NAND memory device.

The second exemplary device structure includes a substrate (9, 10), which constitutes the supporting structure 12 illustrated in FIG. 1. The substrate (9, 10) can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface. An optional semiconductor material layer 10 (e.g., a doped semiconductor well or epitaxial layer) can be formed on the substrate semiconductor layer 9.

The dielectric matrix layer 110 is formed and patterned over the supporting structure 12 as described above. Subsequently, the processing steps of FIGS. 3A-3D are performed. Specifically, an alternating stack of electrically conductive layers 30 and insulating layers 60 can be formed over the supporting structure 12 and the dielectric matrix layer 110. Alternatively, layers 30 can be sacrificial material layers (e.g., silicon nitride layers) which are replaced with electrically conductive layers at a later step. FIG. 16 illustrates a portion of the array region AR, and thus, the dielectric matrix layer 110 is not shown in FIG. 16. A gate dielectric layer 112 can be optionally formed in lieu of the bottommost insulating layer 60 illustrated in FIGS. 3A-3D. Subsequently, the processing steps of 4A-4B, 5A-5D, and 6A-6C can be performed. Alternatively, if layers 30 are sacrificial material layers, then the processing steps of 4A-4B, 5A-5D, and 6A-6C can be performed at a later time, as will be described below.

Referring to FIG. 17, memory openings 49 can be formed through the alternating stack (60, 30) in the array region AR at the processing steps of FIGS. 7A-7C. In case a gate dielectric layer 112 replaces a bottommost insulating layer 60, the memory openings 49 can extend through the gate dielectric layer 112, which is another insulating layer. For example, a lithographic material stack (not shown) including at least a photoresist layer can be formed over the exemplary structure, and can be lithographically patterned to form openings therein within the array region AR. The pattern in the lithographic material stack can be transferred through the alternating stack (60, 30) by at least one anisotropic etch that employs the patterned lithographic material stack as an etch mask to form the memory openings 49. The memory openings 49 can have circular or elliptical horizontal cross-sectional shapes. The maximum lateral dimension of each memory opening 49 can be in a range from 20 nm to 200 nm, although lesser and greater dimensions can also be employed.

Figure 18A:
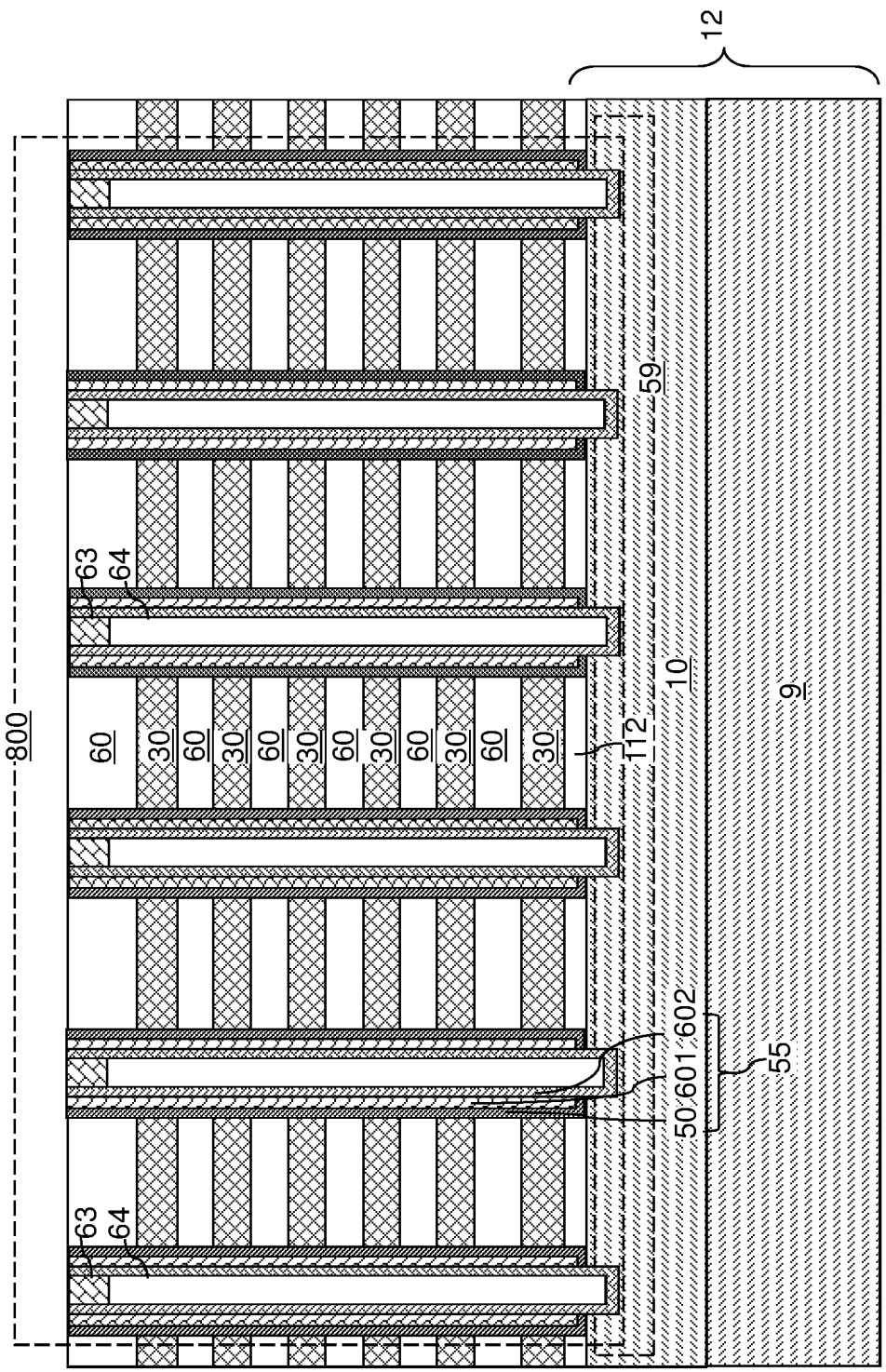
FIG. 18A is a vertical cross-sectional view of the primary region of the exemplary structure in the second configuration after formation of memory stack structures, dielectric cores, and drain regions.
Figure 18B:
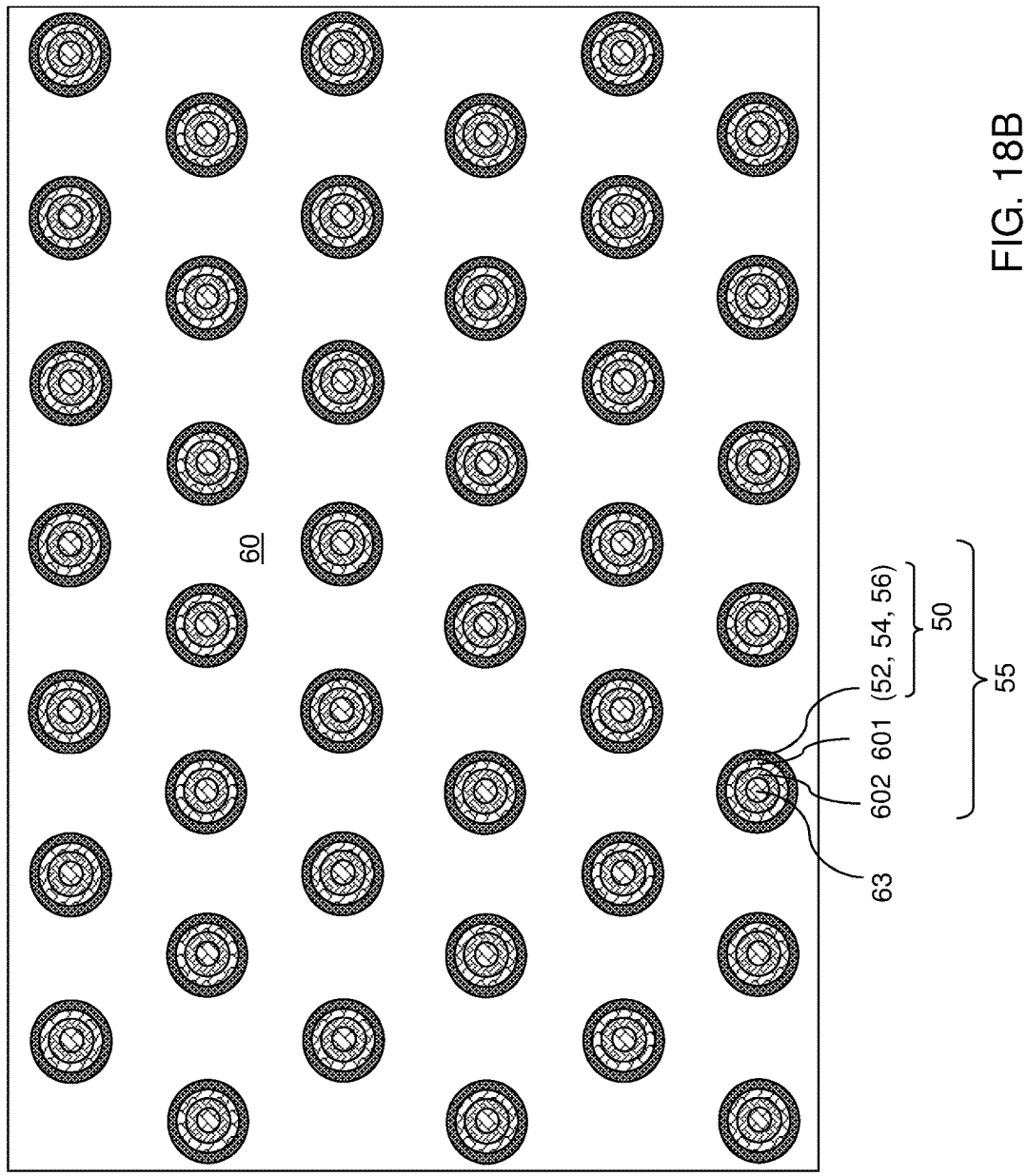
FIG. 18B is a top-down view of the primary region of the exemplary structure of FIG. 18A.

Referring to FIGS. 18A and 18B, a memory stack structure 55, an optional dielectric core 62, and a drain region 63 can be formed within each memory opening 49. For example, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into electrically conductive layers 30. In one embodiment, the charge storage layer 54 includes a silicon nitride layer. In one embodiment, the electrically conductive layers 30 and the insulating layers 60 can have vertically coincident sidewalls, and the charge storage layer 54 can be formed as a single continuous layer.

In another embodiment, the electrically conductive layers 30 can be laterally recessed with respect to the sidewalls of the insulating layers 60, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity is formed in the volume of each memory opening 49 that is not filled with the deposited material layers (52, 54, 56, 601).

The optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the topmost insulating layer 60 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity can be removed to form openings in remaining portions thereof. Each of the first semiconductor channel layer 601, the tunneling dielectric layer 56, the charge storage layer 54, and the blocking dielectric layer 52 can be etched by anisotropic etch process.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the electrically conductive layers 30 constitutes a charge storage region.

A surface of the semiconductor substrate layer 10 can be physically exposed underneath the opening through the first semiconductor channel layer 601, the tunneling dielectric layer 56, the charge storage layer 54, and the blocking dielectric layer 52. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

A second semiconductor channel layer 602 can be deposited directly on the semiconductor surface of an epitaxial channel portion or the semiconductor substrate layer 10 if the epitaxial channel portion is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

In case the cavity in each memory opening is not completely filled by the second semiconductor channel layer 602, a dielectric core layer can be deposited in the cavity to fill any remaining portion of the cavity within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch from above the top surface of the topmost insulating layer 60. Each remaining portion of the dielectric core layer constitutes a dielectric core 64. Further, the horizontal portion of the second semiconductor channel layer 602 located above the top surface of the topmost insulating layer 60 can be removed by a planarization process, which can employ a recess etch or chemical mechanical planarization (CMP). Each remaining portion of the second semiconductor channel layer 602 can be located entirety within a memory opening 49.

Each adjoining pair of a first semiconductor channel layer 601 and a second semiconductor channel layer 602 can collectively form a vertical semiconductor channel (601, 602) through which electrical current can flow when a vertical NAND device including the vertical semiconductor channel (601, 602) is turned on. A tunneling dielectric layer 56 is surrounded by a charge storage layer 54, and laterally surrounds a portion of the vertical semiconductor channel (601, 602). Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

The top surface of each dielectric core 64 can be further recessed within each memory opening, for example, by a recess etch to a depth that is located between the top surface of the topmost insulating layer 60 and the bottom surface of the topmost insulating layer 60. Drain regions 63 can be formed by depositing a doped semiconductor material within each recessed region above the dielectric cores 64. The doped semiconductor material can be, for example, doped polysilicon. Excess portions of the deposited semiconductor material can be removed from above the top surface of the topmost insulating layer 60, for example, by chemical mechanical planarization (CMP) or a recess etch to form the drain regions 63.

Each combination of a memory film 50 and a vertical semiconductor channel (601, 602) (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52.

Each exemplary memory stack structure 55 includes a vertical semiconductor channel (601, 602), which may comprise multiple semiconductor channel layers (601, 602), and a memory film 50. The memory film 50 may comprise a tunneling dielectric layer 56 laterally surrounding the vertical semiconductor channel (601, 602) and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel (601, 602).

Source regions (not shown) can be formed, for example, by forming backside trenches vertically extending through the alternating stack (60, 30), and implanting electrical dopants into surface portions of the semiconductor material layer 10 that underlies the backside trenches. Each continuous surface portion of the semiconductor material layer 10 that extends between a source region and the bottom surfaces of the vertical semiconductor channels (601, 602) constitutes a horizontal semiconductor channel 59. The combination of a vertical semiconductor channel (601, 602) and an adjoining horizontal semiconductor channel 59 constitutes a channel (59, 601, 602) of a field effect transistor.

If layers 30 comprise sacrificial material layers, then the sacrificial material layers are selectively removed by selective etching through the backside trenches to leave backside recesses. The electrically conductive layers 30 are then deposited in the backside recesses through the backside trenches, as described in U.S. Pat. No. 9,397,046, which is incorporated herein by reference in its entirety. The processing steps of 4A-4B, 5A-5D, and 6A-6C can then be performed at this time.

A source contact via structure (not shown) and an insulating spacer (not shown) can be formed within the trench overlying the source region.

Figure 19:
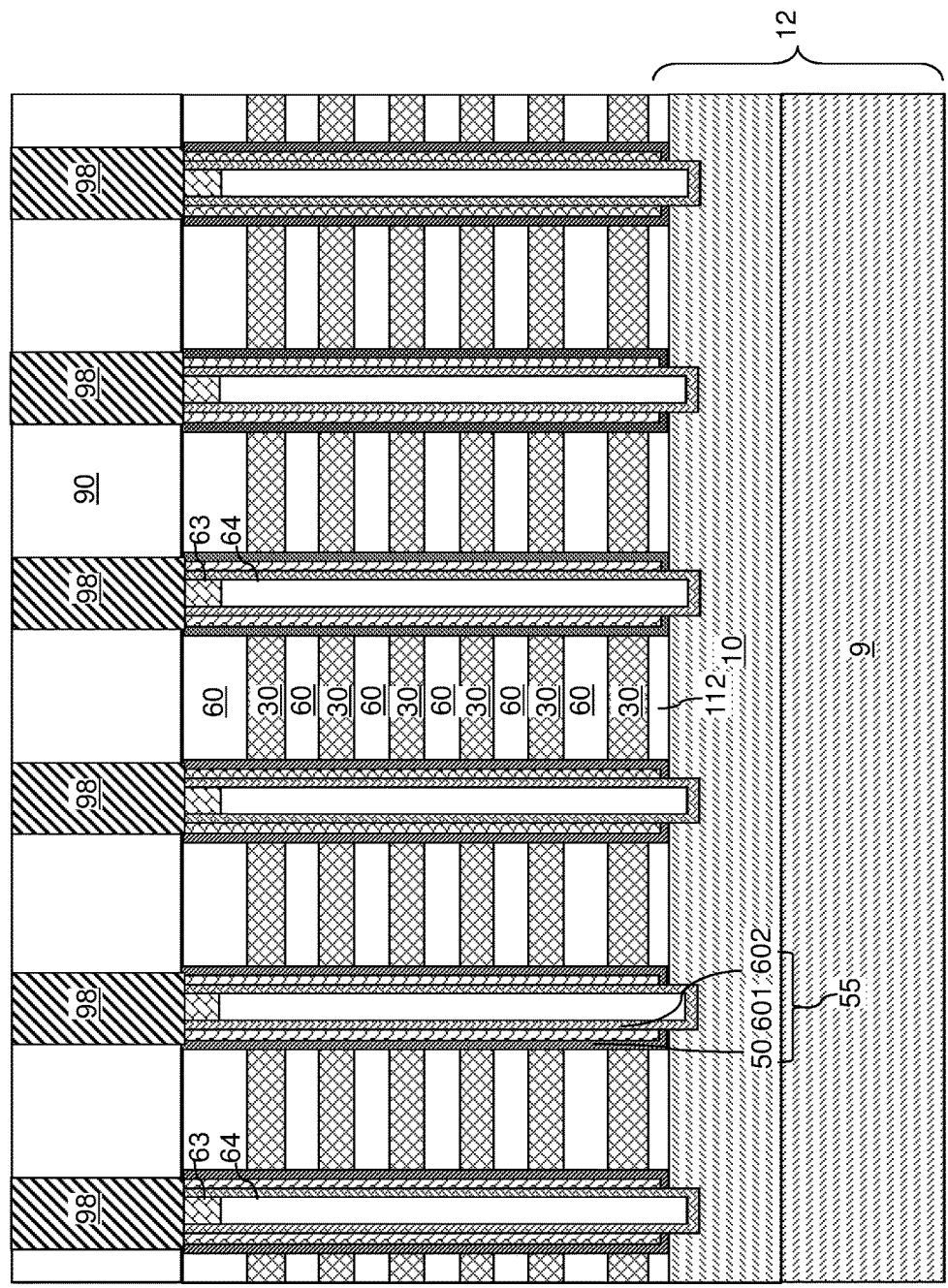
FIG. 19 is a vertical cross-sectional view of the primary region of the exemplary structure in the second configuration after formation of a contact level dielectric layer and array contact via structures.

Referring to FIG. 19, the processing steps of FIGS. 8A-8E can be performed to form a contact level dielectric layer 90 and various contact via structures (96, 98). In this case, the array contact via structures 98 can be formed directly on the top surfaces of the drain regions 63. Specifically, each drain region 63 can be contacted by a respective array contact via structure 98. The word line contact via structures 96 are formed in the contact region CR, and physically contacts top portions TP of vertically extending portions of the electrically conductive layers 30 as described above.

Incorporation of the second exemplary device structure into any of the exemplary structures of FIGS. 8A-8E, 9A-9E, and 10 provides a three-dimensional resistive memory device. In this example, the exemplary structures can include a three-dimensional memory device. In one embodiment, the three-dimensional memory device comprises a vertical NAND memory device. The electrically conductive layers 30 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 30) in a first device level of the array of monolithic three-dimensional NAND strings can be located over another memory cell (as embodied as another portion of the charge storage layer 54 at a level of another electrically conductive layer 30) in a second device level of the array of monolithic three-dimensional NAND strings. The silicon substrate can contain an integrated circuit comprising a driver circuit for the memory device located thereon. The electrically conductive layers 30 can comprise a plurality of control gate electrodes having a strip shape extending substantially parallel to the top surface of the substrate (9, 10), e.g., between a pair of backside trenches. The plurality of control gate electrodes comprises at least a first control gate electrode located in a first device level and a second control gate electrode located in a second device level. The array of monolithic three-dimensional NAND strings can comprise: a plurality of semiconductor channels (59, 601, 602), wherein at least one end portion 60 of each of the plurality of semiconductor channels (59, 601, 602) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A device structure comprising:
    a dielectric matrix layer located over a support structure and having a cavity therein, wherein the cavity has a primary region and a wedge-shaped region that laterally protrudes from the primary region along a lateral protrusion direction, wherein stepped sidewalls of the wedge-shaped region provide a greater width near the primary region than at a tip of the wedge-shaped region, wherein the cavity has a uniform depth throughout along a vertical direction that is perpendicular to an interface between the support structure and the dielectric matrix layer, and wherein each sidewall of the cavity including the stepped sidewalls of the wedge-shaped region has a uniform height that is the same as the uniform depth of the cavity;
    an alternating stack of insulating layers and electrically conductive layers located in the cavity, wherein a tip portion of each electrically conductive layer within the alternating stack is laterally offset from the tip of the wedge-shaped region by a respective lateral offset distance that differ among one another; and
    contact via structures contacting a top surface of a tip portion of a respective one of the electrically conductive layers.

2. The device structure of claim 1, wherein the stepped sidewalls of the wedge-shaped region comprise:
    first sidewalls laterally extending along a first horizontal direction; and
    second sidewalls laterally extending along a second horizontal direction, wherein each of the second sidewalls is adjoined to a vertical edge of at least one of the first sidewalls.

3. The device structure of claim 2, wherein each of the first sidewalls and the second sidewalls vertically extends from a top surface of the dielectric matrix layer to a bottom surface of the dielectric matrix layer.

4. The device structure of claim 2, wherein:
    the first sidewalls are parallel to the lateral protrusion direction; and
    the second sidewalls are perpendicular to the lateral protrusion direction.

5. The device structure of claim 2, wherein:
    the first sidewalls are at an angle in a range from 5 degrees to 45 degrees with respect to the lateral protrusion direction; and
    the second sidewalls are perpendicular to the first sidewalls.

6. The device structure of claim 1, wherein the tip portion of each electrically conductive layer within the alternating stack has a width that is greater than a thickness of a horizontal portion of the electrically conductive layer within the primary region as measured along a vertical direction.

7. The device structure of claim 6, wherein:
    each layer within the alternating stack has a topmost surface within a horizontal plane including a top surface of the dielectric matrix layer; and
    vertically extending portions of each electrically conductive layer has a width that is the same as the thickness of the horizontal portion of the electrically conductive layer within the primary region outside of the tip portion.

8. The device structure of claim 1, further comprising a three-dimensional array of memory elements embedded within a portion of the alternating stack located in the primary region of the cavity, wherein each of the electrically conductive layers is a word line configured to access a subset of the memory elements located at a respective level.

9. The device structure of claim 1, wherein the device structure comprises a monolithic three-dimensional NAND memory device comprising a plurality of semiconductor channels, wherein at least one end portion of each of the plurality of semiconductor channels extends substantially perpendicular to a top surface of the support structure, and a plurality of charge storage elements, each charge storage element located adjacent to a respective one of the plurality of semiconductor channels.

10. The device structure of claim 9, wherein:
    the electrically conductive layers comprise, or are electrically connected to, a respective word line of the monolithic three-dimensional NAND memory device;
    the support structure comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon;
    the electrically conductive layers comprise a plurality of control gate electrodes having a strip shape extending substantially parallel to the top surface of the silicon substrate, wherein the plurality of control gate electrodes comprise at least a first control gate electrode located in the first device level and a second control gate electrode located in the second device level.

11. The device structure of claim 1, wherein:
    the device structure comprises a three-dimensional resistive memory device;
    local bit lines vertically extend through the alternating stack along a vertical direction in the primary region; and
    resistive memory elements are located at each overlap region between the electrically conductive layers and the local bit lines.

12. The device structure of claim 11, wherein the resistive memory elements comprise a resistive memory material selected from a filament-forming dielectric material providing a reduced resistivity upon formation of conductive filaments therein and an electrically conductive metal oxide that exhibits bulk electrical conduction by an oxygen vacancy mechanism.

13. The device structure of claim 1, wherein the uniform depth is the same as a vertical distance between a first horizontal plane including a top surface of the dielectric matrix layer and a second horizontal plane including the interface between the support structure and the dielectric matrix layer.

14. The device structure of claim 13, wherein the tip of the wedge-shaped region is laterally spaced apart from the primary region by a greater lateral separation distance along the lateral protrusion direction than a portion of the wedge-shaped region having the greater width is laterally spaced apart from the primary region along the lateral protrusion direction.

15. The device structure of claim 1, wherein:
   a set of all sidewalls of the cavity defines a lateral extent of the cavity; and
   the cavity has the uniform depth within an entire area surrounded by the set of all sidewalls of the cavity.

* * * * *